(12) United States Patent
Sakata et al.

(10) Patent No.: US 6,668,344 B1
(45) Date of Patent: Dec. 23, 2003

(54) SEMICONDUCTOR INTEGRATED CIRCUIT WITH MEMORY REDUNDANCY CIRCUIT

(75) Inventors: Takeshi Sakata, Kodaira (JP); Tsugio Takahashi, Hamura (JP); Katsutaka Kimura, Akishima (JP); Tomonori Sekiguchi, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/349,761

(22) Filed: Jul. 9, 1999

(30) Foreign Application Priority Data

Aug. 4, 1998 (JP) .......................... 10-220096

(51) Int. Cl.⁷ .......................... G11C 29/00; G11C 7/00
(52) U.S. Cl. .................. 714/710; 714/723; 365/201
(58) Field of Search .................. 714/723, 710, 714/711, 42; 365/200, 201

(56) References Cited

U.S. PATENT DOCUMENTS

| | | | | |
|---|---|---|---|---|
| 4,310,901 A | * | 1/1982 | Harding et al. .............. 714/710 |
| 4,475,194 A | * | 10/1984 | LaVallee et al. ............. 714/710 |
| 4,876,685 A | * | 10/1989 | Rich ........................... 714/723 |
| 5,265,055 A | | 11/1993 | Horiguchi et al. ........... 365/200 |
| 5,430,679 A | | 7/1995 | Hiltebeitel et al. .......... 365/200 |
| 5,471,427 A | * | 11/1995 | Murakami et al. ........... 365/200 |
| 5,485,424 A | * | 1/1996 | Kawamura .................. 365/200 |
| 5,487,039 A | * | 1/1996 | Sukegawa .................... 365/200 |
| 5,621,691 A | | 4/1997 | Park ............................ 365/200 |
| 5,631,862 A | | 5/1997 | Cutter et al. .................. 365/96 |
| 5,640,353 A | * | 6/1997 | Ju ............................... 365/200 |
| 5,644,541 A | * | 7/1997 | Siu et al. ..................... 365/200 |
| 5,684,746 A | * | 11/1997 | Oowaki et al. .............. 365/200 |
| 5,699,306 A | * | 12/1997 | Lee et al. .................... 365/200 |
| 5,808,944 A | * | 9/1998 | Yoshitake et al. ........... 365/200 |
| 5,831,989 A | * | 11/1998 | Fujisaki ....................... 714/723 |
| 5,835,504 A | * | 11/1998 | Balkin et al. ................. 714/723 |
| 5,841,710 A | * | 11/1998 | Larsen ......................... 365/200 |
| 5,841,711 A | * | 11/1998 | Watanabe .................... 365/200 |
| 5,859,804 A | * | 1/1999 | Hedberg et al. ............. 365/201 |
| 5,909,404 A | * | 6/1999 | Schwarz ...................... 365/201 |
| 5,917,764 A | * | 6/1999 | Ohsawa et al. .............. 365/200 |
| 5,920,515 A | * | 7/1999 | Shaik et al. ................. 365/200 |
| 5,933,376 A | * | 8/1999 | Lee ............................. 365/200 |
| 5,983,374 A | * | 11/1999 | Todome et al. .............. 714/718 |
| 6,011,733 A | * | 1/2000 | Fischer et al. ............... 365/200 |
| 6,011,734 A | * | 1/2000 | Pappert ........................ 365/200 |
| 6,018,811 A | * | 1/2000 | Merritt ......................... 714/711 |
| 6,026,505 A | * | 2/2000 | Hedberg et al. ............. 714/711 |
| 6,052,798 A | * | 4/2000 | Jeddeloh ......................... 714/8 |
| 6,115,828 A | * | 9/2000 | Tsutsumi et al. ............... 714/7 |
| 6,119,251 A | * | 9/2000 | Cloud et al. ................. 714/718 |
| 6,249,850 B1 | * | 6/2001 | Kato ............................ 711/163 |

OTHER PUBLICATIONS

IEEE Journal of Solid–State Circuits, vol. 28, No. 11, Nov. 1993, "256–Mb DRAM Circuit Technologies for File Applications", G. Kitsukawa et al, pp. 1105–1113.

* cited by examiner

*Primary Examiner*—Phung M. Chung
*Assistant Examiner*—Joseph D. Torres
(74) *Attorney, Agent, or Firm*—Mattingly, Stanger & Malur, P.C.

(57) ABSTRACT

A semiconductor memory device comprising a redundancy circuit having a small area and high repair efficiency in which time required to store the address of a defect is short and which can reduce the manufacturing cost of the device is disclosed. Repairing addresses are sorted and stored in accordance with a specific order. In case of storing four addresses for eight addresses, a set SFG of fuses corresponding to eight decoded addresses DA0 to DA7 is provided and information indicative of the ordinal position of the fuse in the corresponding fuse-decision results which are logic 1 is used to associate the address with the repair-decision result.

12 Claims, 49 Drawing Sheets

X: DEFECT

|      | FMS7 | FMS6 | FMS5 | FMS4 | FMS3 | FMS2 | FMS1 | FMS0 | FMSA |
|------|------|------|------|------|------|------|------|------|------|
| RYC0 | 0    | 1    | 0    | 1    | 0    | 0    | 1    | 1    | 0    |
| RYC1 | 0    | 1    | 0    | 1    | 0    | 1    | 1    | 0    | 0    |
| RYC2 | 1    | 1    | 1    | 0    | 0    | 0    | 1    | 0    | 0    |
| RYC3 | 0    | 0    | 0    | 0    | 0    | 0    | 0    | 0    | 1    |

(b)

|      | RMS3 | RMS2 | RMS1 | RMS0 |
|------|------|------|------|------|
| RYC0 | MS6  | MS4  | MS1  | MS0  |
| RYC1 | MS6  | MS4  | MS2  | MS1  |
| RYC2 | MS7  | MS6  | MS5  | MS1  |
| RYC3 | 1    | 0    | 0    | 0    |

|  | FMS7 | FMS6 | FMS5 | FMS4 | FMS3 | FMS2 | FMS1 | FMS0 | FMSA |
|---|---|---|---|---|---|---|---|---|---|
| RYEC0 | 0 | 0 | 0 | 1 | 1 | 0 | 1 | 1 | 0 |
| RYEC1 | 0 | 0 | 0 | 1 | 0 | 1 | 1 | 1 | 0 |
| RYEC2 | 0 | 1 | 1 | 1 | 0 | 0 | 1 | 0 | 0 |
| RYEC3 | 0 | 0 | 0 | 0 | 0 | 0 | 0 | 0 | 1 |

(b)

|  | FME67 | FME56 | FME45 | FME34 | FME23 | FME12 | FME01 |
|---|---|---|---|---|---|---|---|
| RYEC0 | 1 | 1 | 1 | 0 | 0 | 1 | 0 |
| RYEC1 | 1 | 1 | 1 | 0 | 1 | 0 | 0 |
| RYEC2 | 0 | 0 | 0 | 0 | 0 | 0 | 0 |
| RYEC3 | 0 | 0 | 0 | 0 | 0 | 0 | 0 |

(c)

|  | RMS3 | RMS2 | RMS1 | RMS0 |
|---|---|---|---|---|
| RYEC0 | MS7+MS6+MS5+MS4 | MS3 | MS2+MS1 | MS0 |
| RYEC1 | MS7+MS6+MS5+MS4 | MS3+MS2 | MS1 | MS0 |
| RYEC2 | MS6 | MS5 | MS4 | MS1 |
| RYEC3 | 1 | 0 | 0 | 0 |

| FMSP0 | 1 |
|---|---|
| FMSP1 | 0 |
| FMSP2 | 1 |
| FMSP3 | 1 |
| FMSP4 | 1 |
| FMSP5 | 0 |
| FMSP6 | 1 |
| FMSP7 | 1 |

(b)

| PMS0 | MS0 |
|---|---|
| PMS1 | MS2 |
| PMS2 | MS3 |
| PMS3 | MS4 |
| PMS4 | MS6 |
| PMS5 | MS7 |
| PMS6 | 0 |
| PMS7 | 0 |

(c)

| FMSQ1 | 1 |
|---|---|
| FMSQ2 | 0 |
| FMSQ3 | 0 |
| FMSQ4 | 1 |
| FMSQ5 | 1 |
| FMSQ6 | 1 |
| FMSQ7 | 0 |
| FMSQ8 | 1 |
| FMSQ9 | 1 |
| FMSQa | 0 |
| FMSQb | 1 |
| FMSQc | 0 |
| FMSQd | 1 |
| FMSQe | 1 |
| FMSQf | 1 |

(d)

| QMS0 | PMS0 | MS0 |
|---|---|---|
| QMS1 | PMS0 | MS0 |
| QMS2 | PMS1 | MS2 |
| QMS3 | PMS2 | MS3 |
| QMS4 | PMS2 | MS3 |
| QMS5 | PMS2 | MS3 |
| QMS6 | PMS2 | MS3 |
| QMS7 | PMS3 | MS4 |
| QMS8 | PMS3 | MS4 |
| QMS9 | PMS3 | MS4 |
| QMSa | PMS4 | MS6 |
| QMSb | PMS4 | MS6 |
| QMSc | PMS5 | MS7 |
| QMSd | PMS5 | MS7 |
| QMSe | PMS5 | MS7 |
| QMSf | PMS5 | MS7 |

(e)

| RDY0 | (MS0+MS7) X RYCH0+(MS2+MS6) X RYCH2 +(MS3+MS4) X RYCH3 |
|---|---|
| RDY1 | (MS3+MS4) X RYCH0+(MS0+MS7) X RYCH1 +MS6 X RYCH3 |
| RDY2 | (MS3+MS4) X RYCH1+MS7 X RYCH2 |
| RDY3 | MS3 X RYCH2+MS7 X RYCH3 |

| FMSQ1 | 1 |
|---|---|
| FMSQ2 | 0 |
| FMSQ3 | 0 |
| FMSQ4 | 1 |
| FMSQ5 | 1 |
| FMSQ6 | 0 |
| FMSQ7 | 1 |
| FMSQ8 | 1 |
| FMSQ9 | 0 |
| FMSQa | 1 |
| FMSQb | 1 |
| FMSQc | 0 |
| FMSQd | 1 |
| FMSQe | 1 |
| FMSQf | 0 |

(b)

| QMS0 | PMS0 | MS0 |
|---|---|---|
| QMS1 | PMS0 | MS0 |
| QMS2 | PMS1 | MS2 |
| QMS3 | PMS2 | MS3 |
| QMS4 | PMS2 | MS3 |
| QMS5 | PMS2 | MS3 |
| QMS6 | PMS3 | MS4 |
| QMS7 | PMS3 | MS4 |
| QMS8 | PMS3 | MS4 |
| QMS9 | PMS4 | MS6 |
| QMSa | PMS4 | MS6 |
| QMSb | PMS4 | MS6 |
| QMSc | PMS5 | MS7 |
| QMSd | PMS5 | MS7 |
| QMSe | PMS5 | MS7 |
| QMSf | PMS6 | 0 |

(c)

| RDY0 | (MS0+MS7) X RYCH0+MS6 X RYCH1 +(MS2+MS4) X RYCH2+MS3 X RYCH3 |
|---|---|
| RDY1 | MS3 X RYCH0+(MS0+MS7) X RYCH1 +MS6 X RYCH2+MS4 X RYCH3 |
| RDY2 | MS4 X RYCH0+MS3 X RYCH1 +MS7 X RYCH2+MS6 X RYCH3 |
| RDY3 | RYAH3 |

US 6,668,344 B1

SEMICONDUCTOR INTEGRATED CIRCUIT WITH MEMORY REDUNDANCY CIRCUIT

FIELD OF THE INVENTION

The present invention relates to a semiconductor device and, more particularly, to a technique for repairing a defect by substituting a spare memory cell for a defective memory cell. Further, the invention relates to a technique for efficiently storing addresses.

BACKGROUND OF THE INVENTION

References referred in the specification are as follows.

{REF 1} Japanese patent laid-open No. 8-77791 (counterpart U.S. Pat. No. 5,621,691)
{REF 2} Japanese patent laid-open No. 2-192100 (counterpart U.S. Pat. No. 5,265,055)
{REF 3} U.S. Pat. No. 5,631,862
{REF 4} Japanese patent laid-open No. 4-274096 (counterpart U.S. Pat. No. 5,430,679)

The references will be referred to by the above reference numbers.

The packing density of a semiconductor memory has been increasing and a dynamic random access memory(DRAM) of 64 mega bits is being produced in quantity. When elements are becoming finer and the number of elements is increasing in association with the increase in the packing density, a problem of deterioration in the yield arises. As a countermeasure, there is a so-called a redundancy technique for repairing a defective memory cell by substituting a spare memory cell which is preliminarily provided on a memory chip for the defective memory cell.

In a redundancy circuit, a repairing address of a defective part is stored by nonvolatile storing means. As the nonvolatile storing means, a method of using fuses made of conductive layers and storing a repairing address depending on whether any of the fuses is blown or not with a laser is typical. When an address inputted from the outside in the event of accessing a memory coincides with the repairing address, the redundancy circuit instructs selection of a spare word line or a spare bit line and spare memory cells connected to the selected line are substituted for defective memory cells.

FIGS. 1 and 2 of {REF 1} show an example of the method of storing a defect address by using fuses. {REF 1} discloses a technique such that, in order to replace a column selection line designated by a binary address of eight bits, a repairing address is stored by using total nine fuses, of eight fuses for the binary address and one master fuse.

Prior to the present invention, the inventors of the present invention had examined the relation between the number of fuses in a redundancy circuit of a DRAM having an extremely large capacity such as 256 mega bits or 1 giga bits and the number of fuses blown for programming a defect address in the fuses. The number of fuses in a DRAM as an object is few thousands in total and it was found that enlargement in the chip area with the increase in the number of fuses and increase in time for storing the fuses hinders reduction in the manufacturing costs of a semiconductor device.

According to the result of the examination of the inventors, systems of storing address information by using fuses are mainly divided into two kinds; a system of storing a binary address in a binary address format, and a system of storing a decoded address in a decoded address format obtained by decoding the binary address. In order to distinguish the two systems from each other, in the specification, the former will be called as a binary address programming system (hereinbelow, abbreviated to "binary system") and the latter will be called as a decoded address programming system (hereinbelow, abbreviated to "decode system"). According to the binary system, although the number of fuses decreases, the number of fuses to be programmed increases. On the other hand, according to the decode system, although the number of fuses to be programmed decreases, the number of fuses increases.

In order to quantify the number of fuses in the binary system and the decode system, the inventors made models shown in FIGS. 3 to 6. The example relates to a case that four repairing addresses are stored in an address space expressed by three bits in a binary address and eight bits in a decoded address.

FIG. 3 shows an example of the decode system. In FIG. 3, when four addresses DA0, DA2, DA3, and DA6 in decoded addresses DA0 to DA7 obtained by decoding a 3-bit binary address become high, repair-decision results RH0 to RH3 become high. Four fuse sets DFS0 to DFS3 are provided to store the four repairing addresses. Each fuse set is made up of fuses corresponding to decoded addresses DA0 to DA7 of eight bits. In FIG. 3, the fuse-decision results are schematically shown. Fuses marked with X are blown and logic "1". Other fuses remain logic "0" as an initial value. FIG. 4 illustrates an example of a repair decision circuit of the decode system. Address compare circuits DACP0 to DACP3 are provided for the fuse sets DFS0 to DFS3, respectively. The address compare circuits DACP0 to DACP3 generate the repair-decision results RH0 to RH3, respectively, by obtaining the ANDs between the fuse-decision results of the corresponding fuse sets DFS0 to DFS3 and the inputted addresses DA0 to DA7 and obtaining the OR of the ANDs.

FIG. 5 shows an example of the binary system. In FIG. 5, four fuse sets BFS0 to BFS3 are provided to store four repairing addresses. Each fuse set is made up of three fuses corresponding to binary addresses AA0 to AA2 of three bits and one fuse (so-called a master fuse) for storing information USE indicating whether repair is to be made or not. In the binary system, the master fuse is indispensable. FIG. 5 schematically shows fuse decision results such that fuses marked with X are blown and logic "1". FIG. 6 shows an example of a repair decision circuit of the binary system. Address compare circuits BACP0 to BACP3 are provided for the fuse sets BFS0 to BFS3, respectively. The address compare circuits BACP0 to BACP3 generate repair-decision results RH0 to RH3, respectively, by obtaining the exclusive ORs of fuse-decision results of the corresponding fuse sets BFS0 to BFS3 and the addresses AA0 to AA2 to be inputted and obtaining the AND of the exclusive ORs and the fuse-decision result storing the information USE.

The number of fuses required in the two systems will now be generalized. The number NDF of fuses in the decode system necessary to store NS addresses from ND (ND=2^NA) obtained by decoding NA bits of a binary address is as follows.

$$NDF = NS \cdot ND = NS \cdot (2\hat{}NA) \qquad (\text{EQ. 1})$$

The numerical sign "^" denotes the power hereinbelow. In association with the increase in the number NA of addresses, the number NDF of fuses in the decode system remarkably increases. In the example of FIG. 5, NA=3, ND=8, NS=4, and NDF=24.

Meanwhile, the number NBF of fuses required in the binary system is obtained as follows.

$$NBF = NS \cdot (NA+1) \tag{EQ. 2}$$

Although the number is smaller than that in the decode system, it still increases with the increase in capacity. Addition of "1" in (EQ. 2) is to count the master fuse. In the example of FIG. 3, NA=3, NS=4, and NBF=16.

The area of fuses depends on the accuracy of a laser and scaling equivalent to the lithography technique is difficult to achieve. Consequently, even if the number of fuses is the same, the ratio of the area of fuses on a memory chip becomes higher as the progress of the lithography technique. As the number of fuses increases, the area of them increases. Not only the area of the fuses themselves but also the area of a fuse decision circuit and an address compare circuit also increases as the number of fuses increases. Especially, since the exclusive OR is used in the binary system, the circuit scale is accordingly enlarged. Due to the above, the overhead of the repair decision circuit to the chip area increases.

In the decode system, since the number of fuse to be programmed in one fuse set is always one, the programming is easily made but the number of fuses for storing one defect address is relatively large. On the other hand, in the binary system, although the number of necessary fuses is smaller than that in the decode system, the number of fuses to be blown is large. In case of the address of a defect is 111 in binary number, it is necessary to program total four fuses consisting of three fuses corresponding to the binary address 111 and one master fuse. Accordingly, the time to blow the fuses increases, the number of laser repair equipment required to fabricate semiconductor memories in quantity increases, and the throughput deteriorates. As the number of fuses to be blown increases, the probability of occurrence of a defect in the fuses during the blowing process becomes high and it affects on the yield.

SUMMARY OF THE INVENTION

It is an object of the invention to realize a semiconductor memory device having a redundancy circuit which solves the problems. More specifically, it is an object to realize a redundancy circuit having a smaller area and a higher repairing efficiency and whose programming time required to store a repairing address is short.

According to the invention, in order to achieve the object, there is provided a semiconductor device comprising a plurality of memory circuits designated by ND (ND=2^NA) addresses expressed by a binary address of NA bits and a defect address storing circuit including ND storage elements for storing NS (two or more) defect addresses of two in relation to a plurality of defects in the plurality of memory circuits, wherein the NS defect addresses are addresses which are selected from the ND addresses and are different from each other and each of the ND storage elements stores a first logical state or a second logical state in one bit.

BRIEF DESCRIPTION OF THE DRAWINGS

FIG. 22 is a diagram showing an example of an address shifter using wired OR.

FIG. 51 is a diagram showing program parameters of the defect repairing example of FIG. 19.

FIG. 52 is a diagram showing program conditions of the defect repairing example of FIG. 29.

FIG. 53 is a diagram showing program conditions of the defect repairing example of FIG. 36.

FIG. 54 is a diagram showing program conditions of the defect repairing example of FIG. 39.

DETAILED DESCRIPTION OF THE PREFERRED EMBODIMENTS

Embodiments of the invention will be described in detail hereinbelow with reference to the drawings. Circuit elements constructing blocks in the embodiments are formed on a single semiconductor substrate made of a single crystal silicon or the like by, although not limited, a known integrated circuit technique such as a CMOS (complementary MOS) transistor. An MOSFET shown without an arrow denotes an N-type MOSFET (NMOS) and is distinguished from a P-type MOSFET (PMOS) shown with an arrow.

First Embodiment

Figure 1:
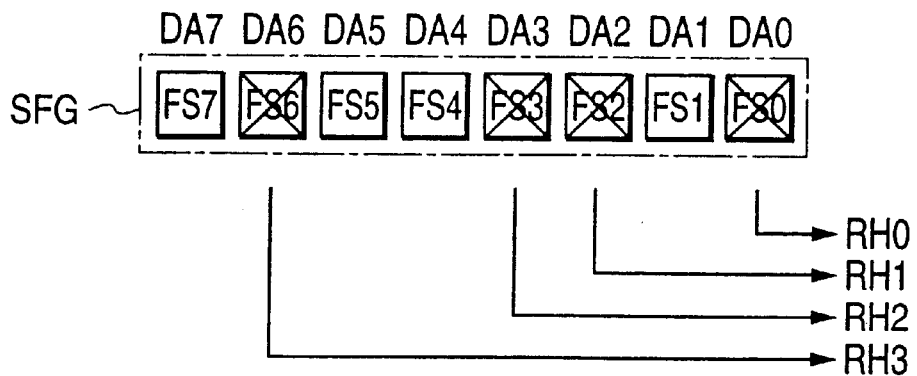
FIG. 1 is a diagram showing an example of a sorted address programming system.

A sorted address programming system (hereinbelow, referred to as a "sort system") according to the invention will be described by using a simple example. The name of the system is given by the inventors of the present invention, which comes from operation of sorting and storing repairing addresses in a specific order. FIG. 1 shows a sort system in a case where repair-decision results RH0 to RH3 become high when four addresses DA0, DA2, DA3, and DA6 in eight decoded addresses DA0 to DA7 obtained by decoding binary addresses of three bits go high. The case corresponds to a case where four fuse sets for storing four defect addresses are provided for eight addresses. A fuse set SFG consists of fuses corresponding to the eight decoded addresses DA0 to DA7. In FIG. 1, fuse-decision results FS0 to FS7 are schematically shown. Fuses FS0, FS2, FS3, and FS6 marked with X are blown and logic "1". The other fuses which are not blown are logic "0".

Whether addresses stored in the fuse set SFG coincide with inputted addresses or not is determined as follows. Any one of the decoded addresses DA0 to DA7 selectively becomes logic "1".

When DA0 becomes "1", FS0 is "1". Since FS0 is the first fuse from the right in the fuses FS0 to FS7 which are "1", FS0 is allocated as a first repairing address. Consequently, the first repair-decision result RH0 becomes "1" and the other results RH1 to RH3 remain logical "0". Even when DA1 becomes "1", since FS1 is "0", each of the repair-decision results RH0 to RH3 is "0".

When DA2 becomes "1", FS2 is "1" and the second one of the fuses which are "1" from the right side. FS2 is therefore allocated as a second repairing address. Consequently, the second repair-decision result RH1 becomes "1" and the other results RH0, RH2, and RH3 remain "0".

Similarly, when DA3 becomes "1", FS3 is "1" and the third one of the fuses which are "1" from the right side. F3 is therefore allocated as a third repairing address. Consequently, the third repair-decision result RH2 becomes "1" and the other results RH0, RH1, and RH3 remain "0". Even when DA4 or DA5 becomes "1", FS4 and FS5 are "0", so that all of the repair-decision results RH0 to RH3 are "0".

Finally, when DA6 becomes "1", FS6 is "1". Since FS6 is the fourth one of the fuses which are "1" from the right side, it is allocated as a fourth repairing address. As a result, the fourth repair-decision result RH3 becomes "1" and the other results RH0 to RH2 remain logic "0". Even when DA7 becomes "1", FS7 is "0", so that all of the repair-decision results RH0 to RH3 are "0".

Figure 3:
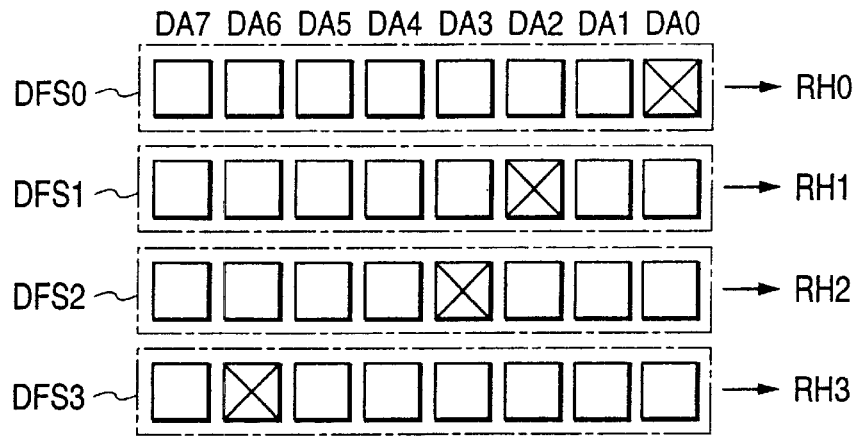
FIG. 3 is a diagram showing a model of a decoded address programming system.
Figure 5:
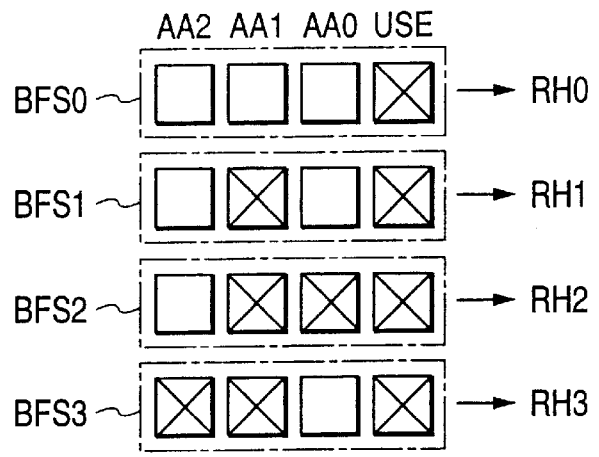
FIG. 5 is a diagram showing a model of a binary address programming system.
Figure 6:
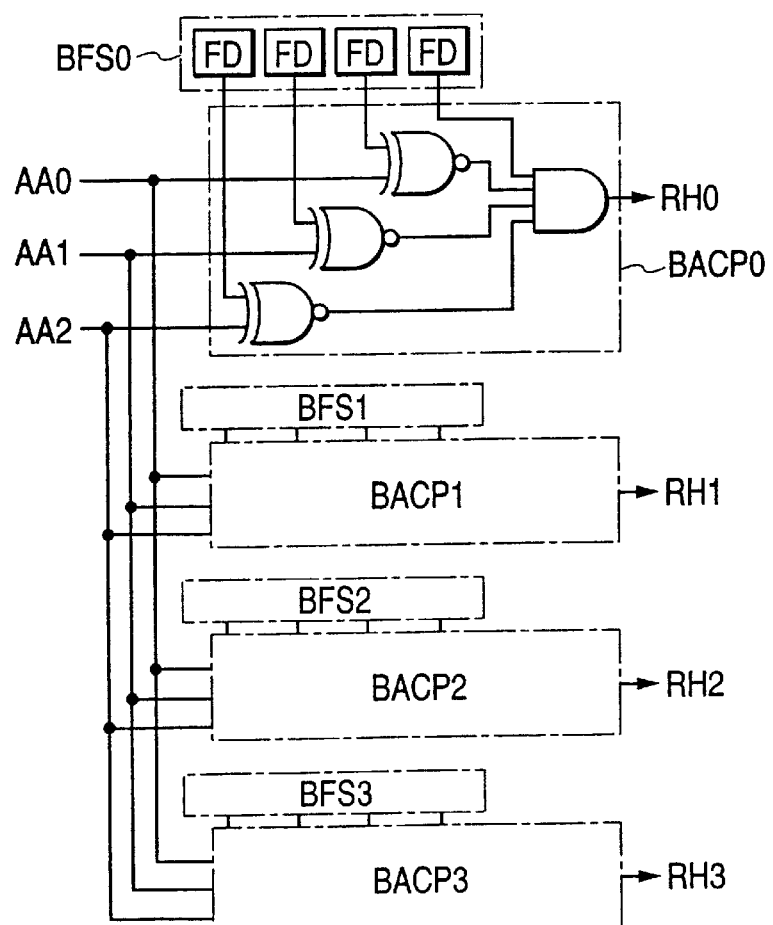
FIG. 6 is a diagram showing an example of a repair decision circuit of the binary address programming system (binary system).
Figure 16:
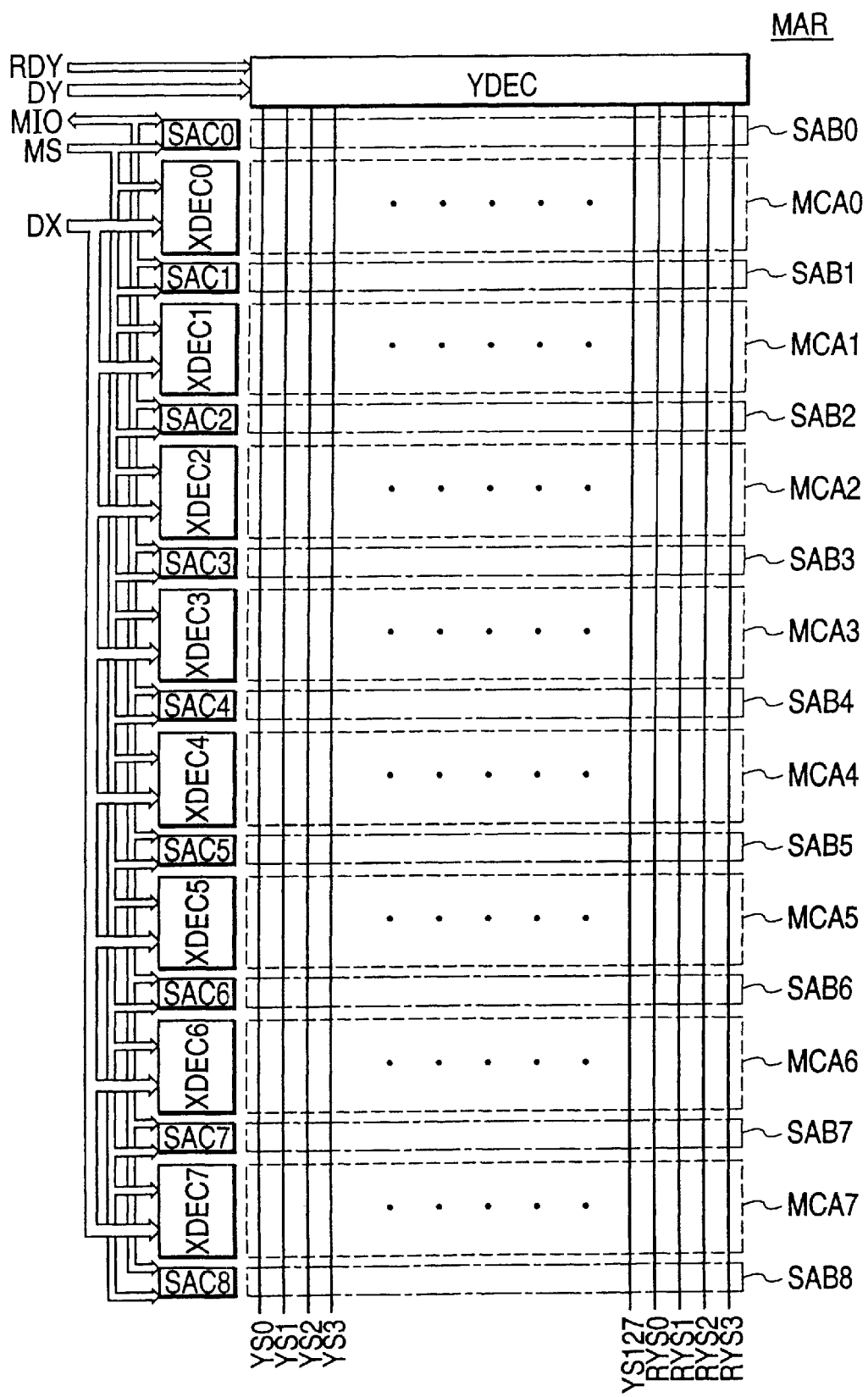
FIG. 16 is a diagram showing an example of a memory array.

As described above, in the sort system, four arbitrary addresses which are not repeated in the eight addresses can be stored by using eight fuses. Since 32 fuses are necessary in the decode system as shown in FIGS. 3 and 16 fuses are required in the binary system as shown in FIG. 5, the number of fuses in the sort system is smaller. The reason why the number of fuses is small is because that the combinations of the addresses and the repair-decision results are determined in accordance with the order of the addresses and information indicative of the ordinal position of the fuse in the corresponding fuse decision results which are "1" is used in order to obtain a certain repair decision result. That is, the repairing address is stored not as an array but as a combination. In memory defect repairing, generally, a plurality of repair-decision results can have equal roles and a combination of the repairing addresses and a fuse set can be arbitrary set. In the sort system, this advantage is used to thereby reduce an amount of information to be stored.

In the sort system, the number of fuses to be blown is four which is the same as the decode system but is smaller than that of the binary system. Although the number of fuses to be blown generally increases in order to decrease the number of necessary fuses, according to the sort system, the number of necessary fuses can be reduced without increasing the number of fuses to be blown.

The number of necessary fuses will now be generalized. The number NSF of fuses in the sort system of the embodiment necessary to determine repair by storing NS addresses out of ND addresses obtained by decoding NA bits is expressed as follows.

$$NSF = ND = 2^{NA} \qquad (EQ. 3)$$

When (EQ. 1) and (EQ. 3) are compared with each other, it is understood that the number of fuses in the sort system is 1/NS of that of the decode system and always smaller. In the sort system, by using the fuses of one set in the decode system, a plurality of repairing addresses can be stored.

The number NBF of fuses in the binary system of (EQ. 2) and the number NSF of fuses in the sort system of (EQ. 3) are compared and the condition to satisfy NSF<NBF is obtained. The right sides of (EQ. 2) and (EQ. 3) are compared as follows.

$$(2^{NA}) < NS \cdot (NA+1) \qquad (EQ. 4)$$

(EQ. 4) is arranged with respect to NS.

$$NS > (2^{NA})/(NA+1) \qquad (EQ. 5)$$

That is, the number of fuses can be reduced in the sort system as compared with the binary system within the range of satisfying the condition of (EQ. 5). For example, when NA is 3, as long as NS is 3 and over, the number of fuses can be reduced.

Figure 2:
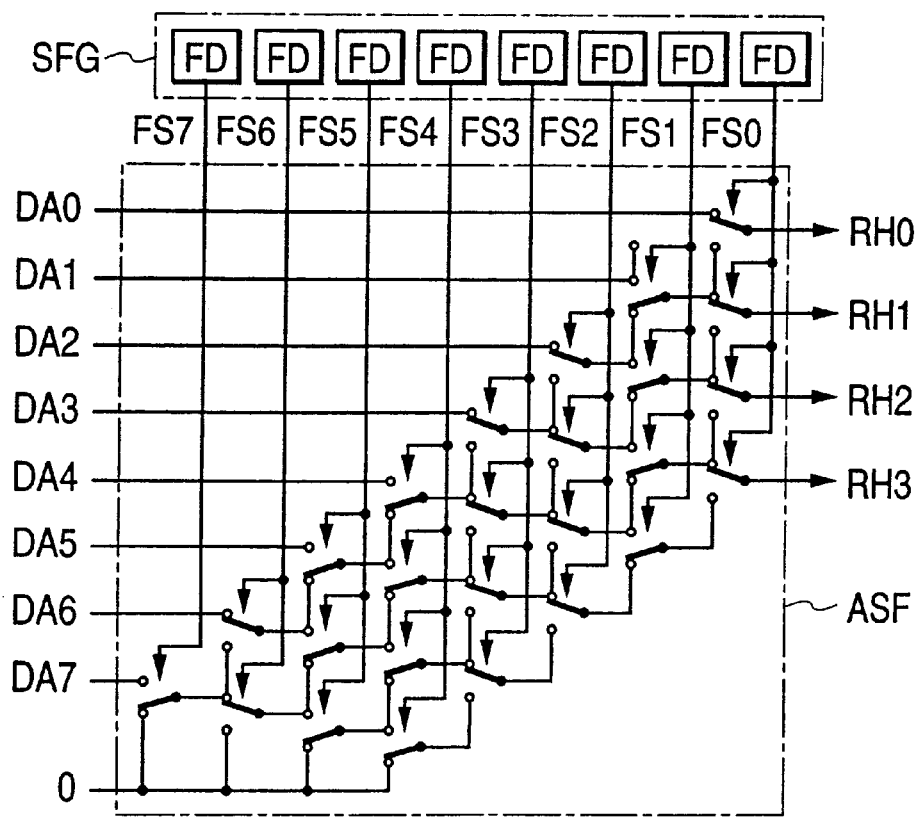
FIG. 2 is a diagram showing an example of a repair decision circuit of the sorted address programming system.

FIG. 2 schematically shows an example of a repair decision circuit realizing the sort system shown in FIG. 1, which is comprised of the fuse set SFG and the address shifter ASF. The fuse set SFG is made up of eight fuse decision circuits FD and outputs fuse-decision results FS0 to FS7. The address shifter ASF can be formed by a group of three-terminal switches, shifts the addresses DA0 to DA7 in accordance with the fuse-decision results FS0 to FS7, and outputs the repair-decision results RH0 to RH3. FIG. 2 shows a state of the switches corresponding to the example shown in FIG. 1. For example, DA0 is transmitted to RH0 by a switch controlled by FS0. DA2 is transmitted to RH2 by switches controlled by FS0 to FS2. In such a manner, the operation is realized. When the number of substitution addresses to be stored is three or less, the substitution addresses are sequentially allocated in accordance with the order of RH0, RH1, RH2, and RH3 and the logical value "0" is transmitted to the remaining repair decision results.

Figure 4:
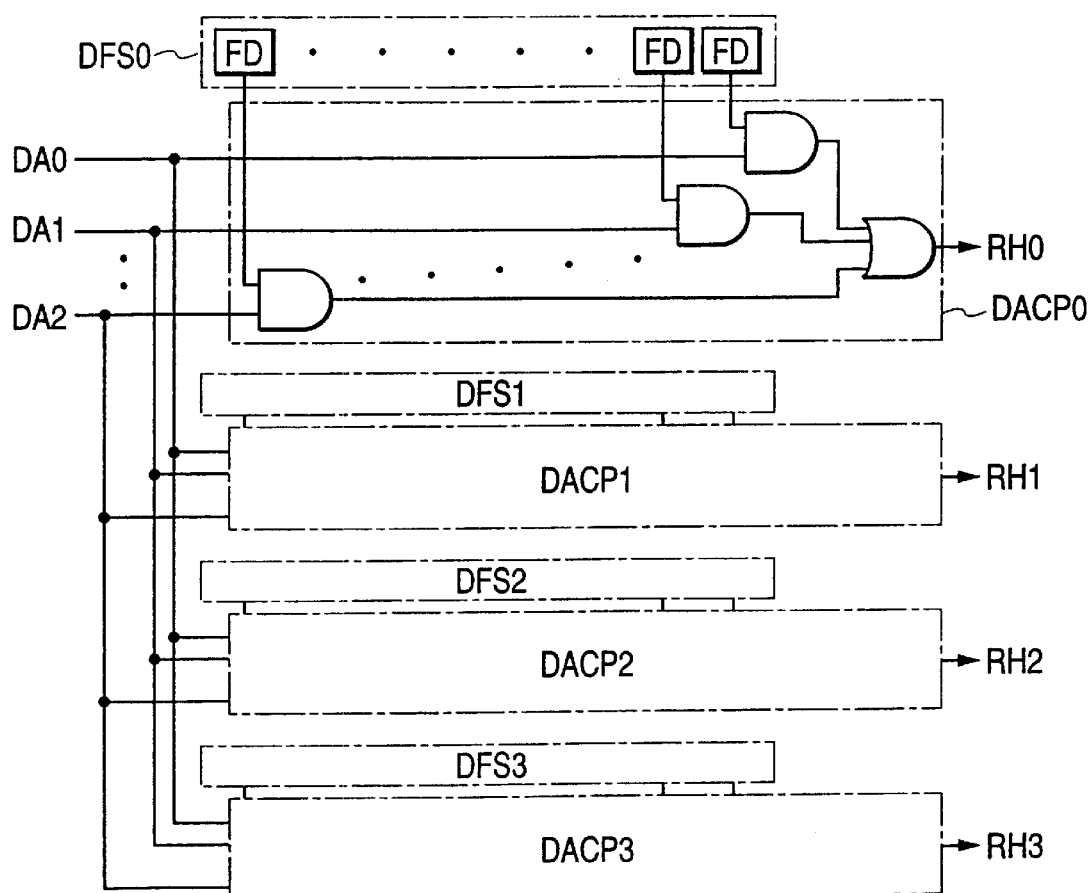
FIG. 4 is a diagram showing an example of a repair decision circuit of the decoded address programming system in FIG. 3.

Although 22 three-terminal switches are used for the address shifter ASF, since four repair decision results are outputted in a lump, the circuit scale is smaller than that of four comparing circuits shown in FIGS. 4 and 5. In combination with reduction in the number of fuses, therefore, the area of the repair decision circuit can be reduced.

The address shifter ASF can be also simply called as a shifter, expressing the function of shifting signals. From the viewpoint of its purpose, the address shifter can be also called as an address compare circuit for comparing a plurality of defect addresses stored in the fuse set SFG with the access addresses DA0 to DA7 inputted from the outside and outputting a match signal when there is a match.

Figure 55:
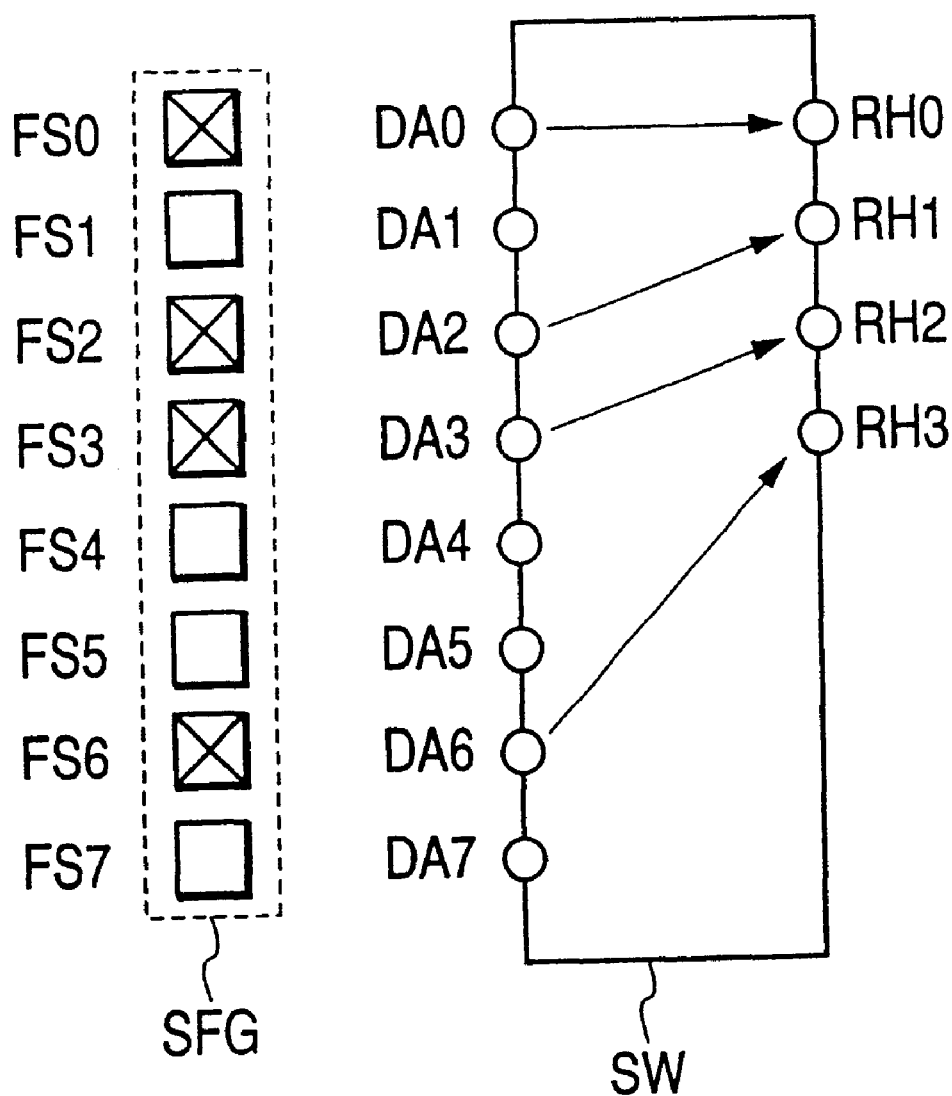
FIG. 55 is a diagram in which the sorted address programming system of FIG. 1 is realized by a switch circuit.

FIG. 55 is a diagram showing the shifter of FIG. 2 as a switch circuit in order to understand the operation. In a switch circuit SW in FIG. 55, four (NS) logical connecting paths are formed between eight (ND) input nodes and four (NS) output nodes. The four (NS) logical connecting paths are determined by programs of four (ND) fuses (storage elements) in the fuse circuit SFG. There is a rule such that the logical connecting paths formed in the switch circuit do not cross each other. That is, the logical connecting paths such that DA0 is connected to RH1 and DA2 is connected to RH0 cannot be permitted. The input nodes (DA0, DA2, DA3, DA6) are sequentially associated with output nodes (RH0, RH1, RH2, RH3), respectively, in accordance with the order from small values. This is the concept of the sorted address programming system of the invention.

One of embodiments used to repair a defect in a memory circuit relates to subarray-replacement redundancy. Specifically, a memory circuit having eight (ND) normal memory mats and four (NS) spare memory mats will be viewed. It is assumed that the total 12 memory mats are equivalent. A spare memory mat can be substituted for a defective normal memory mat by the repair decision circuit in FIG. 2. One of the four spare memory mats can be selected according to the outputs RH0 to RH3 of the shifter in FIG. 2.

Second Embodiment

An embodiment in which the sort system is applied to programming of a mat selection signal for a flexible redundancy column repair in a synchronous DRAM (SDRAM) will be described with reference to FIGS. 7 to 19. The flexible redundancy column repair is described in {REF 2}. That is, in a memory device in which a plurality of bit lines divided into a plurality of memory mats are selected by a common column selection line, both of an address designating a memory mat and an address for designating the column selection line are stored as repairing addresses. Consequently, substitution every bit line can be realized, so that many deflects can be repaired with a small number of redundant column selection lines. One of novel points of the second embodiment as compared with {REF 2} is that the sort system of the invention is used to store the address of a defective memory mat.

Figure 7:
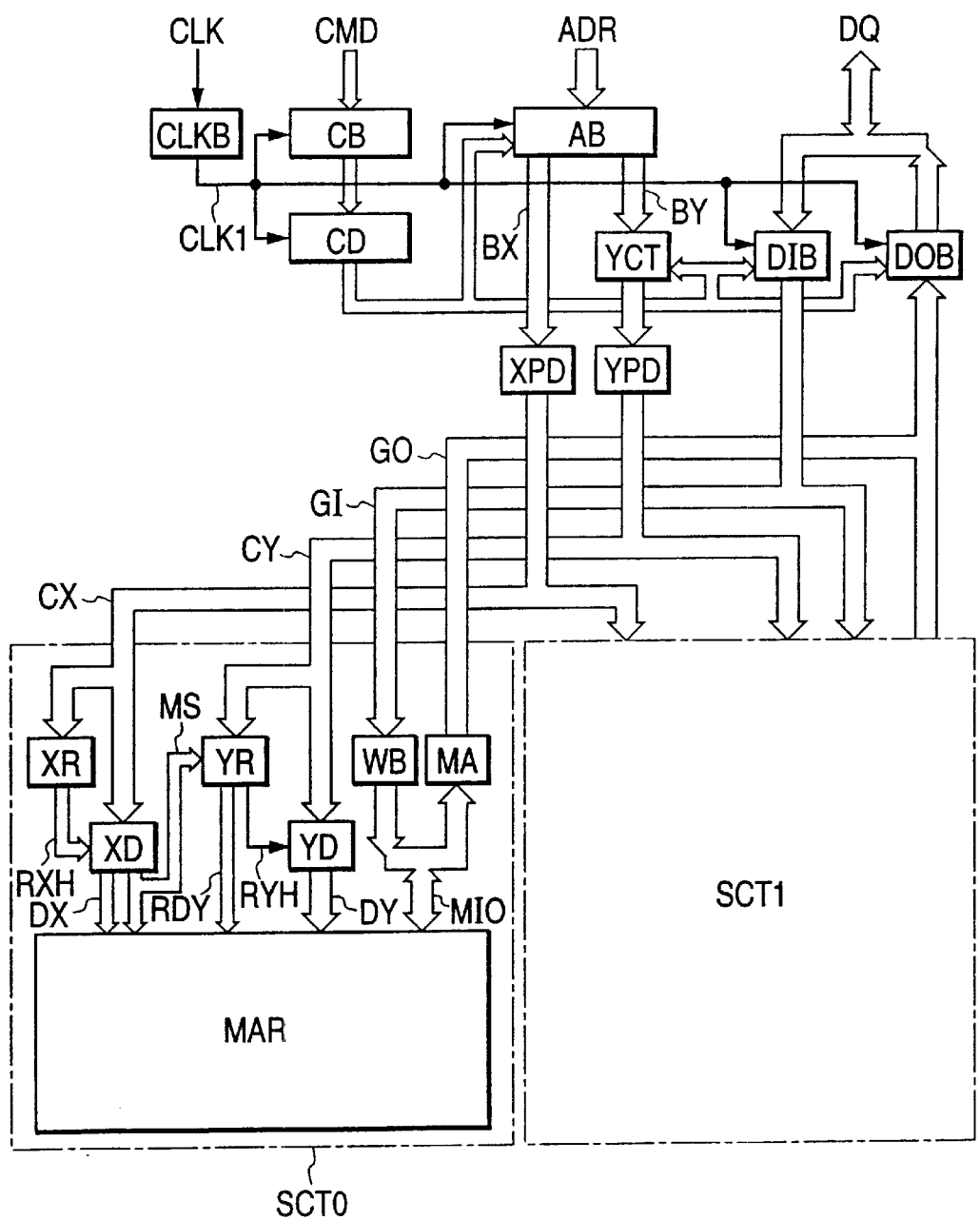
FIG. 7 is a block diagram showing a main part of a synchronous DRAM.

The construction of the whole SDRAM will be described first. FIG. 7 is a block diagram showing a main part of the SDRAM. Indirect peripheral circuits of the SDRAM comprise a clock buffer CLKB, a control signal buffer CB, a command decoder CD, an address buffer AB, a column address counter YCT, a row address pre-decoder XPD, a column address pre-decoder YPD, an input buffer DIB, and an output buffer DOB. Further, in relation to a memory array MAR, a row related redundancy circuit XR, a row address driver XD, a column related redundancy circuit YR, a row address driver YD, a write buffer WB, a main amplifier MA, and the like are provided. The number of sectors of a memory core corresponds to the number of memory arrays according to the specification such as a memory capacity and the number of sets. For simplicity of explanation, only two sectors SCT0 and SCT1 are shown here.

The circuit blocks fill the following roles. The clock buffer CLKB uses an external clock CLK as an internal clock CLKI and distributes it to the command decoder CD and the like. The command decoder CD generates control signals for controlling the address buffer AB, column address counter YCT, input buffer DIB, output buffer DOB, and the like in response to an external control signal CMD. The address buffer AB takes a binary address ADR from the outside at desired timing according to the external clock CLK and sends a row address BX to the row address pre-decoder XPD. The row address pre-decoder XPD pre-decodes the row address BX and distributes a predecoded row address CX to the sectors SCT0 and SCT1. The address buffer AB sends a column address BY to the column address counter YCT. The column address counter YCT uses the column address BY as an initial value and generates a column address for performing a burst operation. The column address is predecoded by the column address predecoder YPD and a predecoded column address CY is distributed to the sectors SCT0 and SCT1.

The input buffer DIB takes input/output data DQ from the outside at desired timing and outputs write data GI. Meanwhile, the output buffer DOB outputs read data GO at desired timing to the input/output data DQ.

In the sector SCT0 or SCT1, the row related redundancy circuit XR determines whether the predecoded row address CX is to be replaced or not and outputs row related repair-decision result RXH to the row address driver XD. The row address driver XD receives the predecoded row address CX and the row related repair-decision result RXH and outputs a desired mat selection signal MS and a row address signal DX to the memory array MAR.

The column related redundancy circuit YR determines the presence or absence of the replacement with respect to the predecoded column address CY and the mat selection signal MS and outputs a column related repair-decision result RYH to the column address driver YD. The sort system described with reference to FIG. 1 is applied to the column related redundancy circuit YR. The column address driver YD receives the predecoded column address CY and the column related repair-decision result RYH and outputs a desired column address signal DY to the memory array MAR.

The write buffer WB outputs the write data GI to a main input/output line MI0. Meanwhile, the main amplifier MA amplifies a signal on the main input/output line MI0 and outputs the read data GO.

Figure 8:
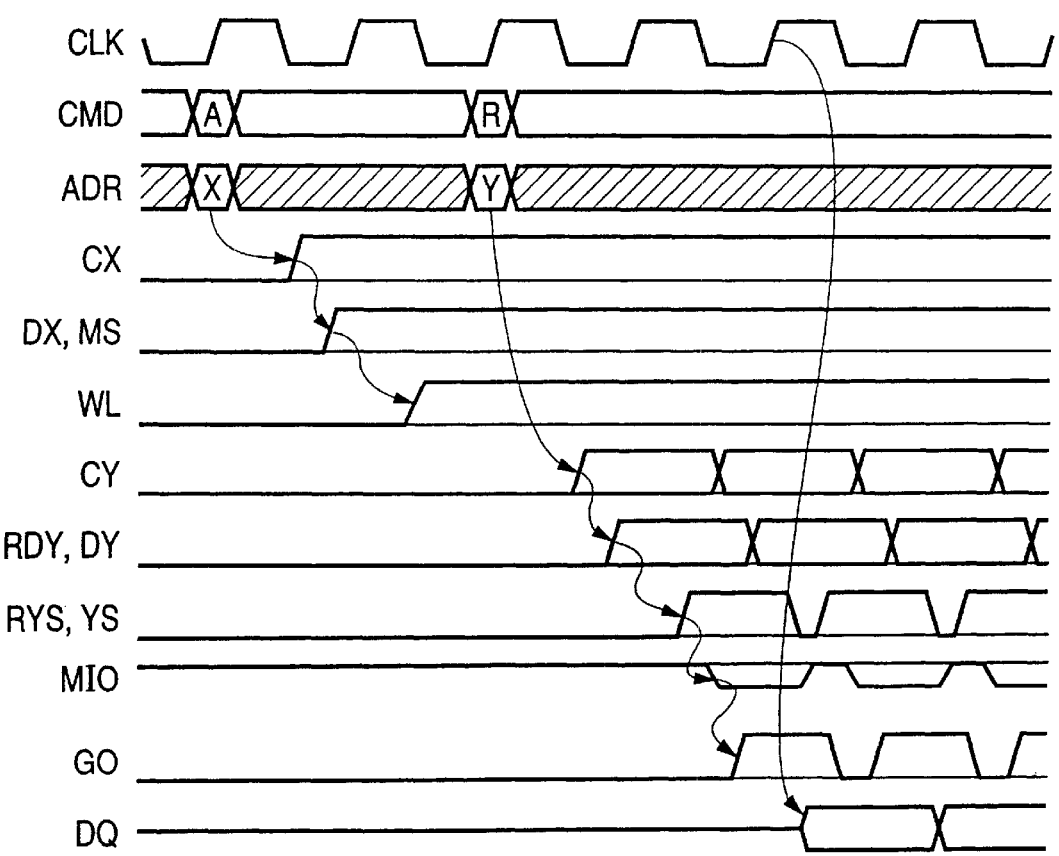
FIG. 8 is a diagram showing operational timing.

FIG. 8 shows an example of the timing of reading operation of the SDRAM illustrated in FIG. 7. According to the timing chart, the operation of the SDRAM in FIG. 7 will be described. The command decoder CD determines the control signal CMD and an activation command A is given every rising edge of the external clock CLK, thereby taking a row address X from the address ADR and storing it into the address buffer AB. The row address pre-decoder XPD outputs a predecoded row address CX. In response to the predecoded row address CX, a desired mat selection signal MS or row address signal DX is outputted from either the sector SCT0 or SCT1 and a word line WL which will be described hereinlater is selected in the memory array MAR.

When the read command R is given as the control signal CMD, a column address Y is taken from the address ADR into the address buffer AB. The column address counter YCT operates every clock cycle and the column address predecoder YPD outputs the predecoded column address CY corresponding to a burst operation. Either in the sector SCT0 or SCT1, in response to the mat selection signal MS and the predecoded column address CY, the column related redundancy circuit YR operates. According to the result of the circuit YR, either the column address signal DY or a redundant column address signal RDY is outputted, and either a column selection line YS or a redundant column selection line RYS which will be described hereinlater is selected in the memory array MAR. By the operation, a signal is read onto the main input/output line MI0, the main amplifier MA outputs the read data GO, and the output buffer DOB outputs the data as input/output data DQ at timing according to the external clock CLK.

In the SDRAM, as mentioned above, the address multiplexing method of taking the column address Y after the desired number of clock cycles since the row address X is taken is used in order to reduce the number of address pins. The method takes an advantage such that since the column related operation is performed after completion of the row related operation in the memory core, access time is not influenced when the column address is taken after the row address. Consequently, there is a time after the mat selection signal MS and the row address signal DX which are used for the row related operation are outputted until the column address signal DY is used for the column related operation. Although not limited, in the embodiment, the time is utilized so that the access time will not be influenced even when there is a delay in the repair decision according to the sorted system shown below.

Figure 9:
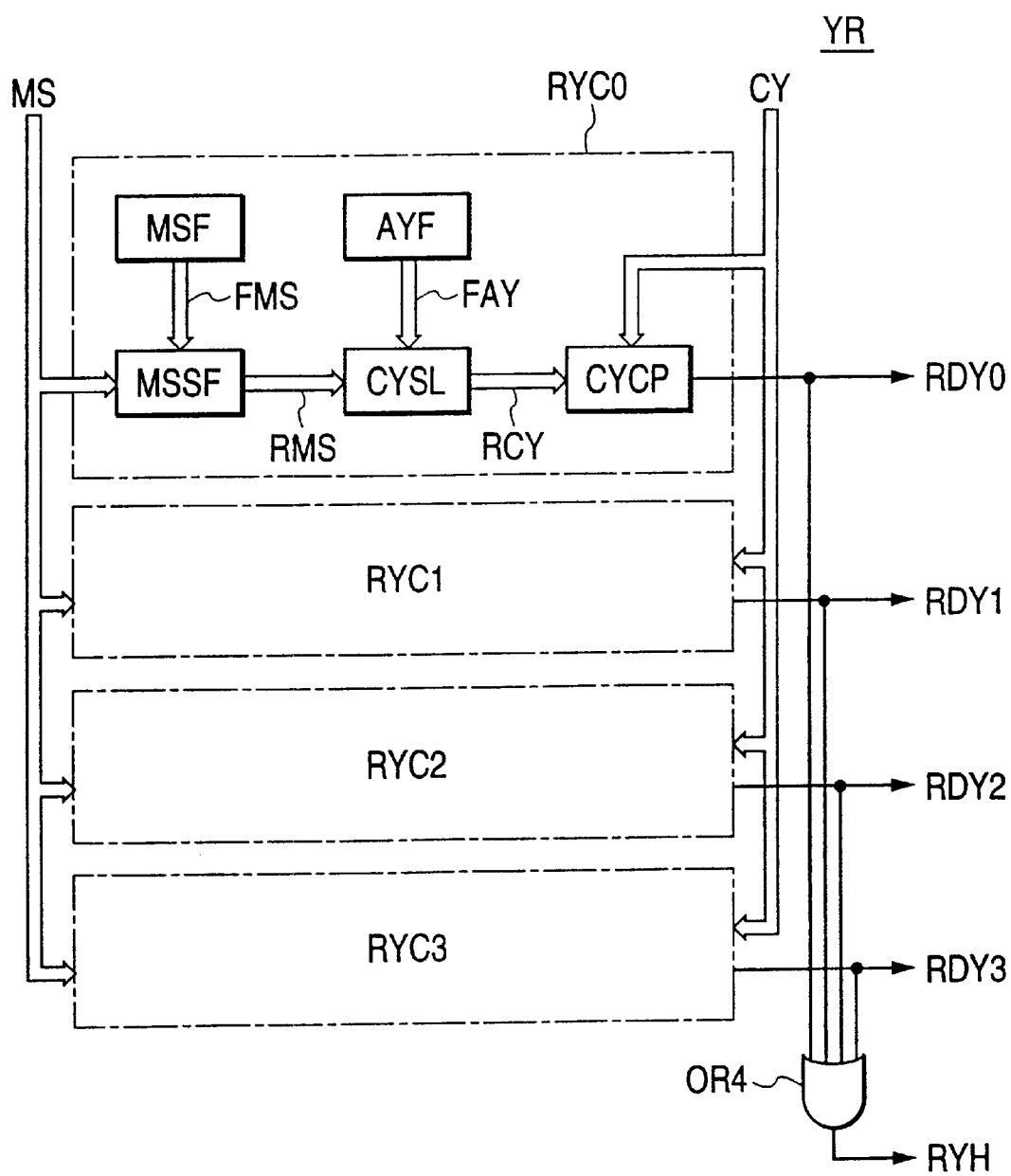
FIG. 9 is a diagram showing an example of a column related redundancy circuit.

FIG. 9 shows an example of the column related redundancy circuit YR in FIG. 7. By using the sort system described with reference to FIGS. 1 and 2, the column-related repair decision is made. Four comparing circuits RYC0 to RYC3 are provided and output comparison results RDY0 to RDY3, respectively. In this example, it is assumed that four redundant column selection lines (RYS0 to RYS3 in FIG. 16 which will be described hereinlater) which are independently selected by RDY0 to RDY3 are provided in one sector. The redundant column selection line may be also called a spare column selection line. A 4-input OR circuit OR4 obtains the OR of the comparison results RDY0 to RDY3 and outputs the column related repair-decision result RYH. RYH is used to inhibit the selection of a normal column selection line in the event of performing the repair.

Each of the comparing circuits RYC0 to RYC3 has a first fuse circuit MSF for storing the repairing addresses of four memory mats in accordance with the sort system and a second fuse circuit AYF for storing four sets of repairing column addresses in accordance with the binary system. In the above-described arrangement, four bit lines at most a redundant column selection line can repair. The comparing circuits RYC0 to RYC3 are independent circuits and each of them can be regarded as an independent redundancy circuit.

The construction of the comparing circuit will be described in more detail by using the comparing circuit RYC0 as an example. Programming of the repairing address regarding the memory mat, comparison of the repairing address with the mat selection signal MS which is supplied, and determination of the presence or absence of a repair are performed by the first fuse circuit MSF for storing the repairing memory mat in the sort system and an address shifter MSSF for shifting the mat selection signal MS in accordance with the stored information FMS in the circuit MSF and comparing the signal MS with the repairing mat address. The mat selection signal denotes an address obtained by decoding higher bits (three higher bits in this case) in the binary row address.

An output RMS (that is, the decision result regarding the repair of the memory mat) of the address shifter MSSF is supplied to an address selection circuit CYSL. The circuit CYSL also receives a signal FAY stored in the second fuse circuit AYF for storing the repairing column address in the binary system. When the address shifter MSSF supplies the signal RSM indicative the presence of a repair, the address selection circuit CYSL outputs a column address stored in the second fuse circuit AYF as an a signal RCY to an address comparing circuit CYCP. The address comparing circuit CYCP compares the repairing column address RCY with the column address CY supplied from the outside. When the addresses coincide with each other, the address comparing circuit CYCP determines the presence of a repair and activates the signal RDY0 for selecting a redundant column selection line. When the mat selection signal MS is inputted, the address shifter MSSF and the address selecting circuit CYCL operate. Consequently, the operations are finished until the predecoded column address CY is inputted, thereby preventing the path from becoming a critical path of the access time. The constructions of the circuits will be more specifically shown.

Figure 10:
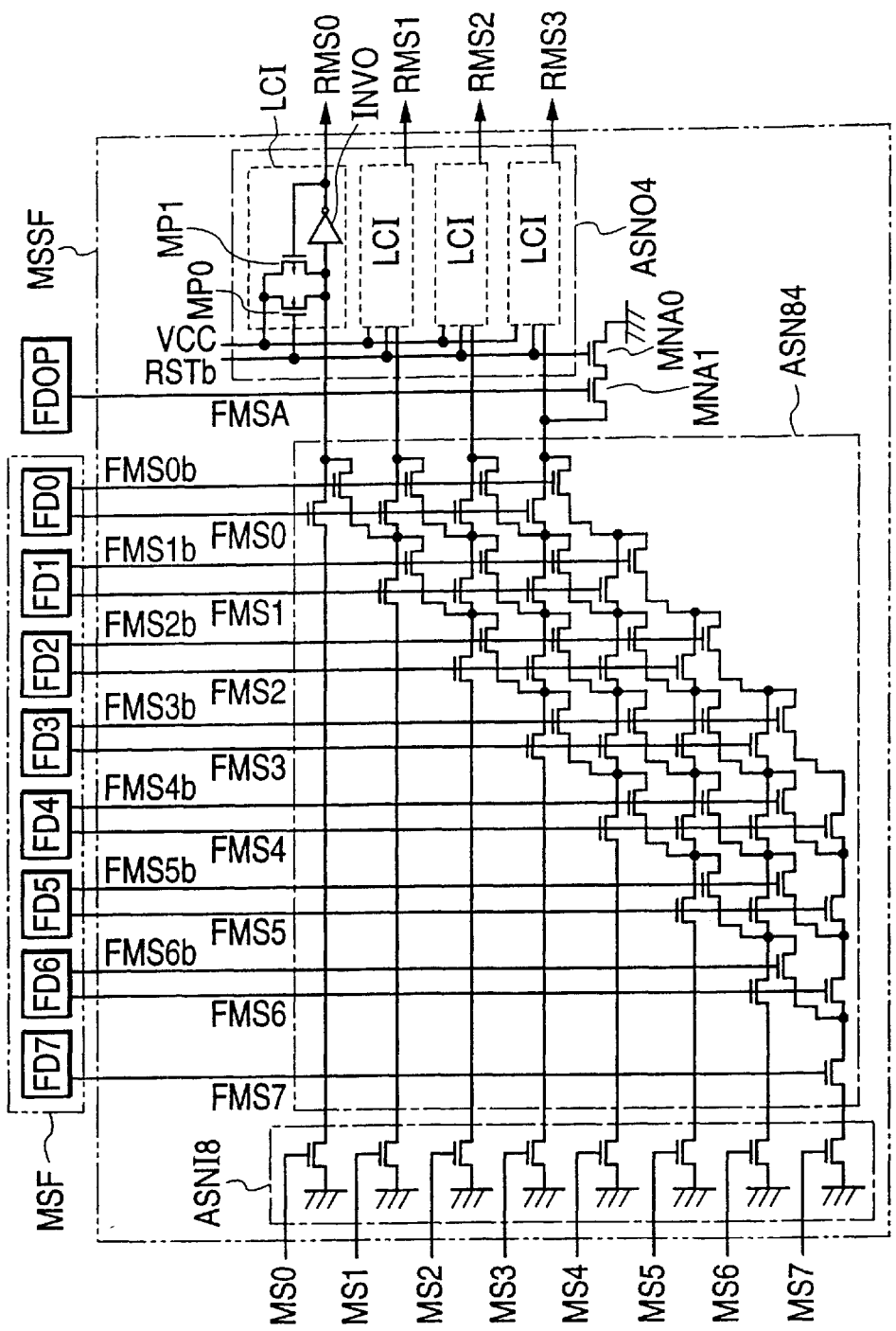
FIG. 10 is a diagram showing an example of a repairing mat address comparing shifter.

FIG. 10 shows an an example of the first fuse circuit MSF and the address shifter MSSF in FIG. 9. It is a specific example of the redundancy circuit according to the sort system shown in FIG. 2. The first fuse circuit MSF is comprised of eight fuse decision circuits FD0 to FD7 and outputs fuse-decision results FMS0 to FMS7 and complementary signals FMS0b to FMS6b of FMS0 to FMS6.

The address shifter MSSF has: an input part ASNI8 to which the mat selection signals MS0 to MS7 each obtained by decoding a row address of higher three bits are inputted; an output part ASNO4 for outputting comparison results RMS0 to RMS3 of the repairing mat selection signals; and a pass transistor part ASN84 having eight input terminals and four output terminals in which a desired signal path is formed between the input part ASNI8 and the output part ASNO4. The input part ASNI8 is comprised of eight NMOS transistors whose sources are connected to a ground voltage VSS. The pass transistor part ASN84 is comprised of 48 NMOS transistors whose gates are connected to the fuse-decision results FMS0b, FMS0, FMS1b, FMS1, . . . , FMS6b, FMS6, and FMS7. The output part ASN04 is comprised of four level-holding inverters LCI. Each level holding inverter LSI comprises a PMOS transistor MP0 for resetting, a feedback PMOS transistor MP1, and a CMOS inverter INVO.

The operation of the circuit of FIG. 10 will be performed as follows. When a row-related operation is executed, a reset signal RSTb is set to the high level, thereby activating the level holding inverters LCI in the output part ASNO4. When any of the mat selection signals MS0 to MS7 which are supplied from the outside goes high, any of the NMOS transistors is made conductive in the input part ASNI8. When a signal path leading from the conducted NMOS transistor in the input part ASNI8 to the level holding inverter LCI in the output part ASNO4 is formed in the pass transistor part ASN84, a current flows through the input part ASNI8 and the pass transistor part ASN84, a low-level signal is supplied to the inverter holding inverter LCI. In this case, the CMOS inverter INVO outputs a high-level signal and the feedback PMOS transistor MP1 is turned off. That is, one of the outputs of the output part ASNO4 goes high. The signals supplied to the other level holding inverters LCI are held at the high level by the feedback PMOS transistor MP1, and the inverters LCI keep on outputting low-level signals. By employing the level holding inverters, erroneous determination due to noises is prevented.

By using the NMOS pass transistor logic as described above, the address shifter can be formed with a small number of elements. The three-terminal switch in FIG. 2 is realized by two NMOS transistors to which fuse decision results which are complementary to each other are supplied. In the level holding inverter LCI, when the input is open, a low-level signal is outputted. By utilizing the function, pass transistors for transmitting a logic signal "0" are omitted, thereby reducing the number of elements. Although a number of NMOS pass transistors form a signal path in the address shifter, the circuit can be realized without becoming a critical path of access time, delay time does not become a problem.

In order to realize the function of designating substitution on the basis of a unit of one redundant column selection line by referring to only the column address without performing flexible redundancy repair, an option fuse decision circuit FDOP and NMOS transistors MNAQ and MNA1 are further added in the circuit of FIG. 10. When the fuse decision circuit FDOP is programmed and the fuse-decision result FMSA is set to the high level, the NMOS transistor MNA1 is always ON. Consequently, when the reset signal RSTb goes high, the NMOS transistor MNA0 is turned ON and the comparison result RMS3 becomes at the high level irrespective of the mat selection signals MS0 to MS7. In this case, the fuse decision circuits FD0 to FD7 are not programmed so that FMS0 to FMS7 are at the low level and no current flows through the pass transistor part ASN84. By adding the small number of circuits, the function of setting one of the comparison results to the high level irrespective of the mat selection signals MS0 t MS7 is realized. Consequently, a defect such as disconnection of the column selection line can be dealt with.

Figure 11:
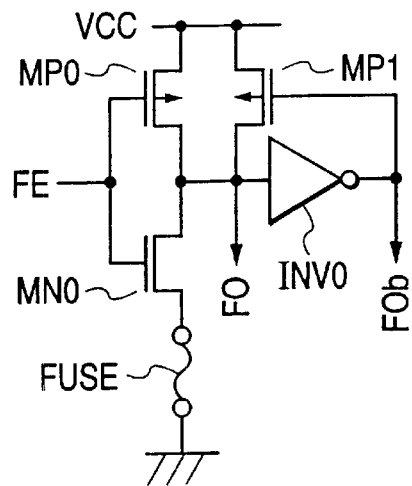
FIG. 11 is a diagram showing an example of a fuse decision circuit.

FIG. 11 shows an example of each of the fuse decision circuits FD0 to FD7 and FDOP in FIG. 10. The fuse circuit MSF or AYF in FIG. 9 is formed by a plurality of the circuits. The fuse decision circuit comprises a fuse FUSE, an NMOS transistor MN0, the PMOS transistors MP0 and MP1, and the CMOS inverter INV0. The fuse FUSE can be formed by wiring layers or the like and is made conductive on a completed chip. A completed chip is tested and, after that, a predetermined fuse is selectively blown by a laser or the like and programmed for storing a defect address. The PMOS transistors MP0 and MP1 and the CMOS inverter INV0 function in a manner similar to the level holding inverter in FIG. 10.

The fuse decision circuit operates as follows. The NMOS transistor MN0 is OFF and the PMOS transistor MP0 is ON during an enable signal FE is at the low level. Irrespective of the state of the fuse FUSE, an output F0 is high and an output FOb is low. When the enable signal FE goes high, the NMOS transistor MN0 is turned on and the PMOS transistor MP0 is turned off. When the fuse FUSE is not blown, the decision result F0 is low and the result FOb is high. On the other hand, when the fuse FUSE is blown, the decision result FO is kept low by the PMOS transistor MP1 and FOb is kept high by the inverter INV0.

In the fuse decision circuit, complimentary outputs are obtained by using the CMOS inverter INV0 necessary to make the output fully amplified. The circuit is therefore suited for the construction using complimentary fuse decision results as shown in FIG. 10. When only the decision result of a positive output such as FMSA and FMS7 in FIG. 10 is necessary, it is sufficient to use only the output FO.

Although the fuse which is regarded as most practical at present is used in the fuse decision circuit, a storage element for storing the logic "1" or "0" in one bit is sufficient.

Figure 12:
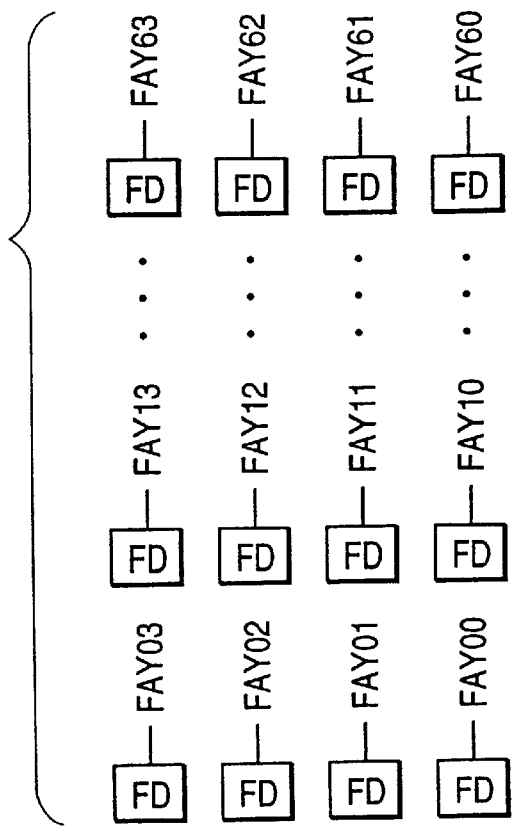
FIG. 12 is a diagram showing an example of a fuse circuit of a repairing column address.
Figure 13:
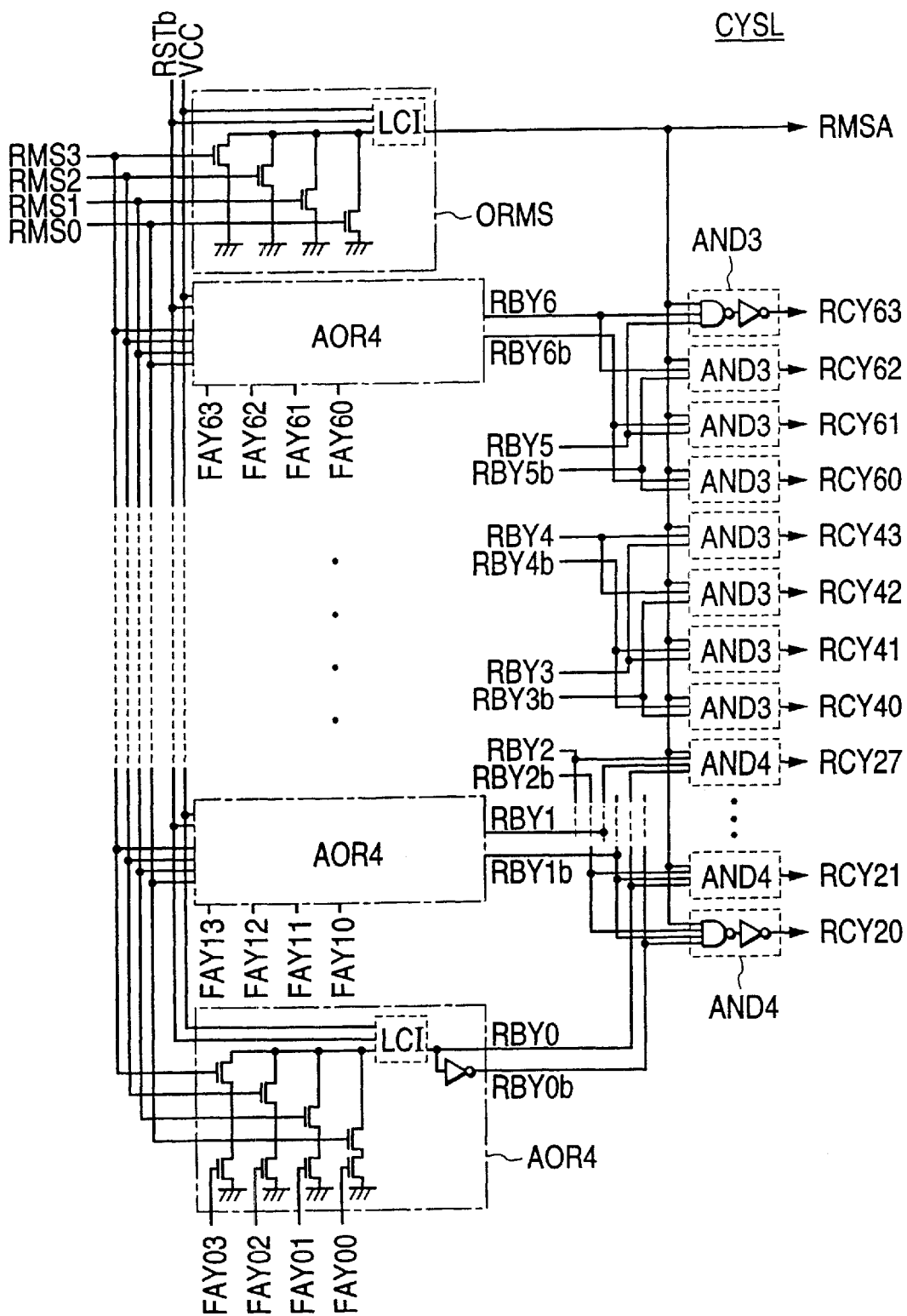
FIG. 13 is a diagram showing an example of a column address selecting circuit.

FIG. 12 shows an example of the second fuse circuit AYF in FIG. 9. FIG. 13 shows an example of the address selection circuit CYSL. The fuse circuit of FIG. 12 is comprised of a number of fuse decision circuits FD and stores four sets of encoded binary repairing column addresses FAY00 to FAY60, FAY01 to FAY61, FAY02 to FAY62, and FAY03 to FAY63. The fuse decision circuit FD is constructed, for example, as shown in FIG. 11.

When any of the outputs RMS0 to RMS3 of the address shifter MSSF shown in FIG. 10 goes high, the address selection circuit of FIG. 13 selects an output of the second fuse circuit AYF of FIG. 12 and outputs the repairing column address RCY corresponding to the predecoded column address CY. The address selection circuit CYSL comprises seven logic circuits AOR4, a 4-input OR circuit ORMS, eight 4-input AND circuits AND4, and eight 3-input AND circuits AND3. In each logic circuit AOR4, four sets of the transistors are connected to the level holding inverter LCI in parallel. Each set consists of an NMOS transistor having the gate to which any of the outputs RMS0 to RMS3 of the address shifter is connected and an NMOS transistor having the gate to which any of the decision results of the second fuse circuit is connected, which are connected in series. The level holding inverter LCI can be constructed as shown in FIG. 10. The OR of the ANDs of RMS0 and FAY00, RMS1 and FAY01, RMS2 and FAY002, and RMS3 and FAY03 can be obtained as an output RBY0. Further, by the CMOS inverter, a complimentary signal such as RBY0b is outputted. In such a manner, complimentary binary repairing column addresses RBY0 and RBY0b to RBY6 and RBY6b corresponding to the column addresses BY in FIG. 2 can be obtained.

In the 4-input OR circuit ORMS, four NMOS transistors having gates to which the outputs RMS0 to RMS3 of the address shifter are connected are coupled to the level holding inverter LCI in parallel and the OR of the outputs RMS0 to RMS3 is obtained as an output RMSA. The RMSA indicates the presence or absence of the column address to be replaced in response to the inputted mat selection signal MS.

The AND of the output RMSA with any desired combination of the repairing column addresses RBY0 and RBY0b to RBY6 and RBY6b is calculated by each of the AND circuits AND4 and AND3, thereby obtaining repairing column addresses RCY20 to RCY27, RCY40 to RCY43, and RCY60 to RCY63 corresponding to the predecoded column address CY in FIG. 2. When there is no column address to be replaced in response to the inputted mat selection signal MS, the repairing column addresses RCY20 to RCY27, RCY40 to RCY43, and RCY60 to RCY63 become low by the output RMSA.

As mentioned above, after selecting any of the binary decision results FAY00 to FAY60, FAY01 to FAY61, FAY02 to FAY62, and FAY03 to FAY63 of the second fuse circuit, the selected results are predecoded and the repairing column addresses corresponding to the predecoded column addresses are generated. Consequently, the circuit scale, the occupying area, and power consumption are reduced.

Figure 14:
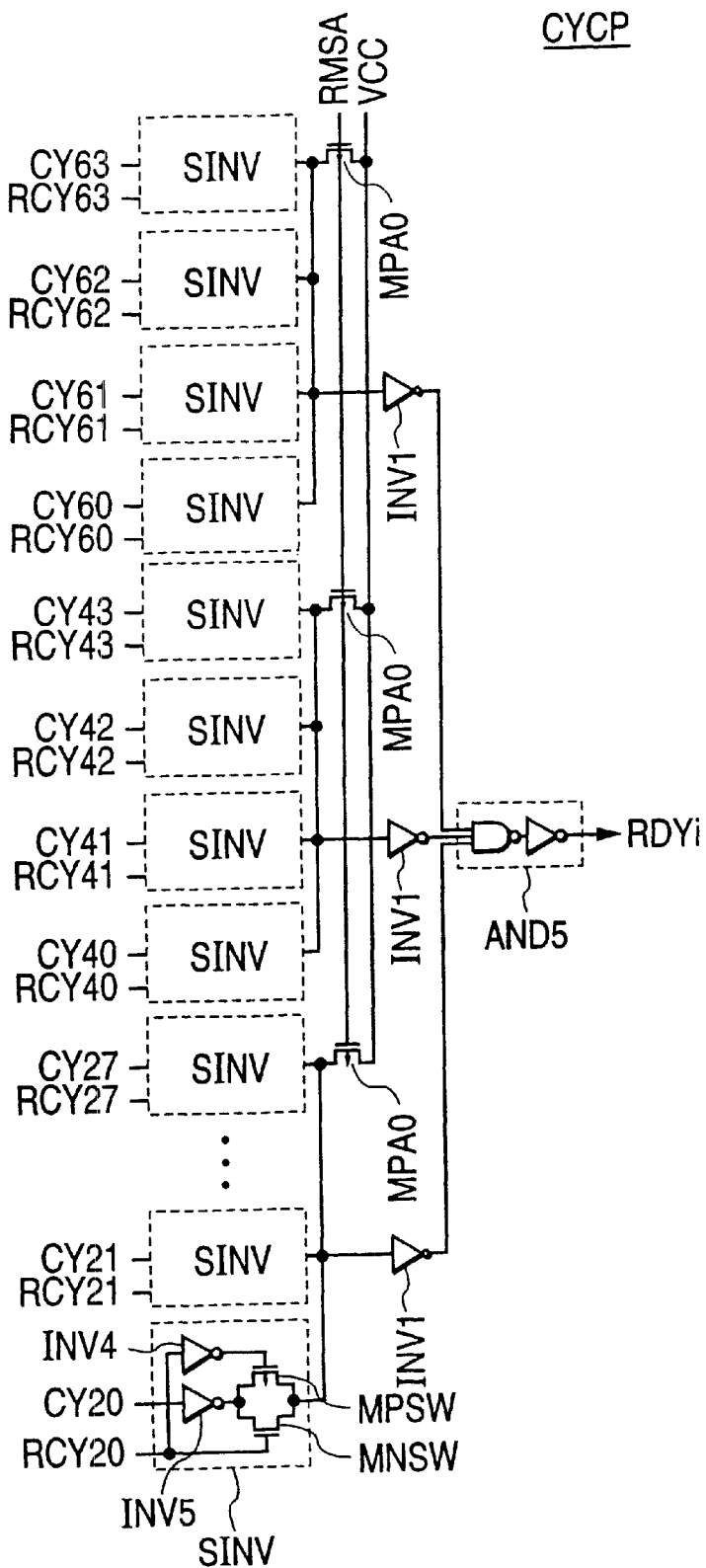
FIG. 14 is a diagram showing an example of a column address comparing circuit.

FIG. 14 shows an example of the address comparing circuit CYCP for the repairing column address in FIG. 9. The circuit CYCP comprises sixteen inverters SINV with switches, three PMOS transistors MPA0, three CMOS inverters INV1, and a 3-input AND circuit AND5. Each inverter SINV with a switch is comprised of CMOS inverters INV4 and INV5, a PMOS transistor MPSW, and an NMOS transistor MNSW. For example, in the inverter SINV with a switch to which a repairing column address RCY20 and a predecoded column address CY20 are supplied, when RCY20 is at the high level, the PMOS transistor MPSW and the NMOS transistor MNSW are turned on and CY20 is inverted and outputted. On the other hand, when RCY20 is at the low level, the PMOS transistor MPSW and the NMOS transistor MNSW are turned off and the inverter SINV has high output impedance.

By supplying outputs of a plurality of inverters SINV with switches to the CMOS inverter INV1, the OR of the AND of RCY20 and CY20, . . . , and the AND of RCY27 and CY27, the OR of the AND of RCY40 and CY40, . . . and the AND of RCY43 and CY43, and the OR of the AND of RCY60 and CY60, . . . , and the AND of RCY63 and CY63 are obtained. By calculating the ANDs by the 3-input AND circuit AND5, a comparison result RDYi is outputted. The comparison result RDYi is each of the comparison results RDY0 to RDY3 as outputs of the four comparing circuits RYC0 to RYC3. In the three PMOS transistors MPA0, when there is no column address to be replaced and all of RCY20 to RCY27, RCY40 to RCY43, and RCY60 to RCY63 are at the low level, by setting RMSA to the low level as shown in FIG. 13, the input of the CMOS inverter INV1 is prevented from being floated and RDYi is set to the low level.

The circuit operates when the predecoded column address CY is inputted and becomes a critical path that determines the access time from the read command R shown in FIG. 8. The circuit is therefore constructed by CMOS circuits so as to reduce the delay time.

In order to explain the role of the column related redundancy circuit YR specifically shown above, the components relating to the column related operation in the circuit blocks of FIG. 7 are shown as below.

Figure 15:
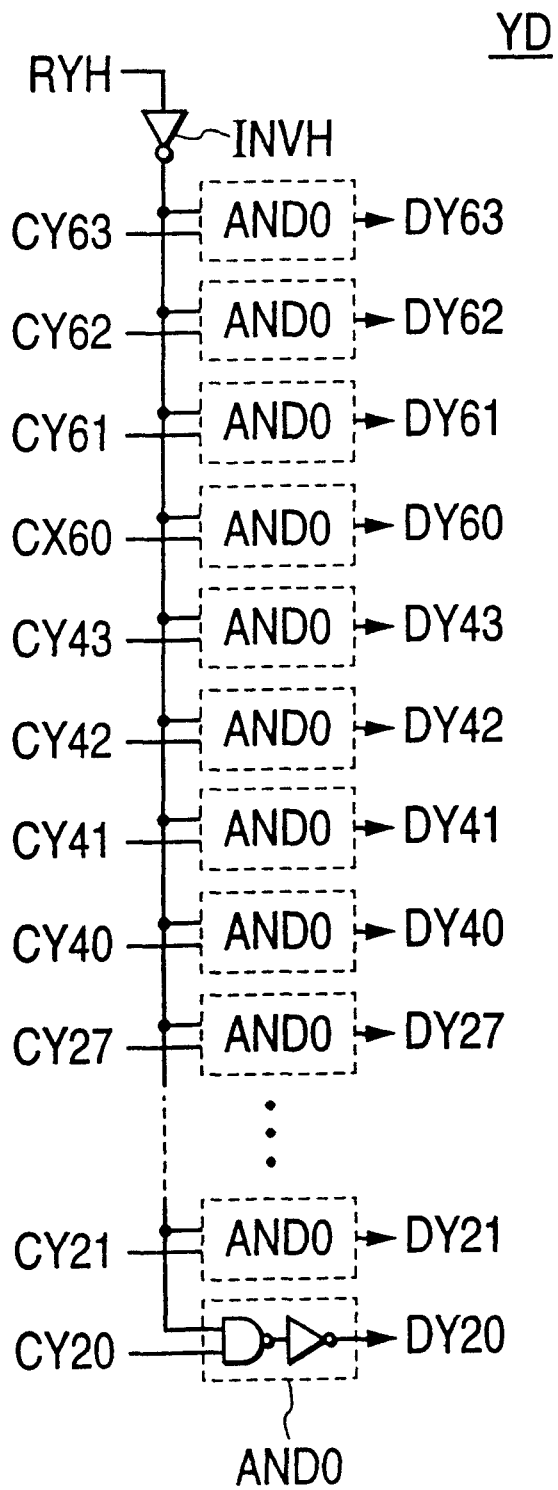
FIG. 15 is a diagram showing an example of a column address driver.

FIG. 15 shows an example of the column address driver YD in FIG. 7. As described above, the column address driver YD supplies column address signals DY20 to DY27, DY40 to DY43, and DY60 to DY63 to the column decoder in the memory array MAR in FIG. 7. The column related repair-decision result RYH from the column related redundancy circuit is received by the CMOS inverter INVH, the AND of the output of the CMOS inverter INVH and each of the predecoded column addresses CY20 to CY27, CY40 to CY43, and CY60 to CY63 is obtained by the 2-input AND circuit AND0 constructed by an NAND gate and an inverter, and the column address signals DY20 to DY27, DY40 to DY43, and DY60 to DY63 are outputted. That is, when the column related repair-decision result RYH is at the high level, the column address signal which is low is outputted. When the result RYH is at the low level, the column address signal which is the same value as that of the predecoded column address is outputted. When a redundant column selection line is substituted for a normal column selection line, the operation of the normal column selection line is stopped by the circuit.

FIG. 16 shows an example of the memory array MAR in FIG. 7. In this case, the memory cell array in which memory cells are arranged in matrix are divided into eight mats MCA0 to MCA7. On both sides of the mats, sense amplifier parts SAB0 to SAB8 are provided. Row decoders XDEC0 to XDEC7 are provided for the mats MCA0 to MCA7, respectively, and sense amplifier control circuits SAC0 to SAC8 are provided for the sense amplifier parts SAB0 to SAB8, respectively. A column decoder YDEC is shared by the divided mats MCA0 to MCA7 and selectively drives 128 column selection lines YS0 to YS127 and four redundant column selection lines RYS0 to RYS3. The column related redundancy circuit YR shown in FIGS. 9 to 14 and the column address driver YD of FIG. 15 correspond to the number of column selection lines and the number of redundant column selection lines shown in this figure. For example, the reason why the number of comparison results is four in FIG. 9 is because RDY0, . . . , RDY3 correspond to the redundant column selection lines RYS0, . . . , RYS3 in a one-to-one manner.

Figure 17:
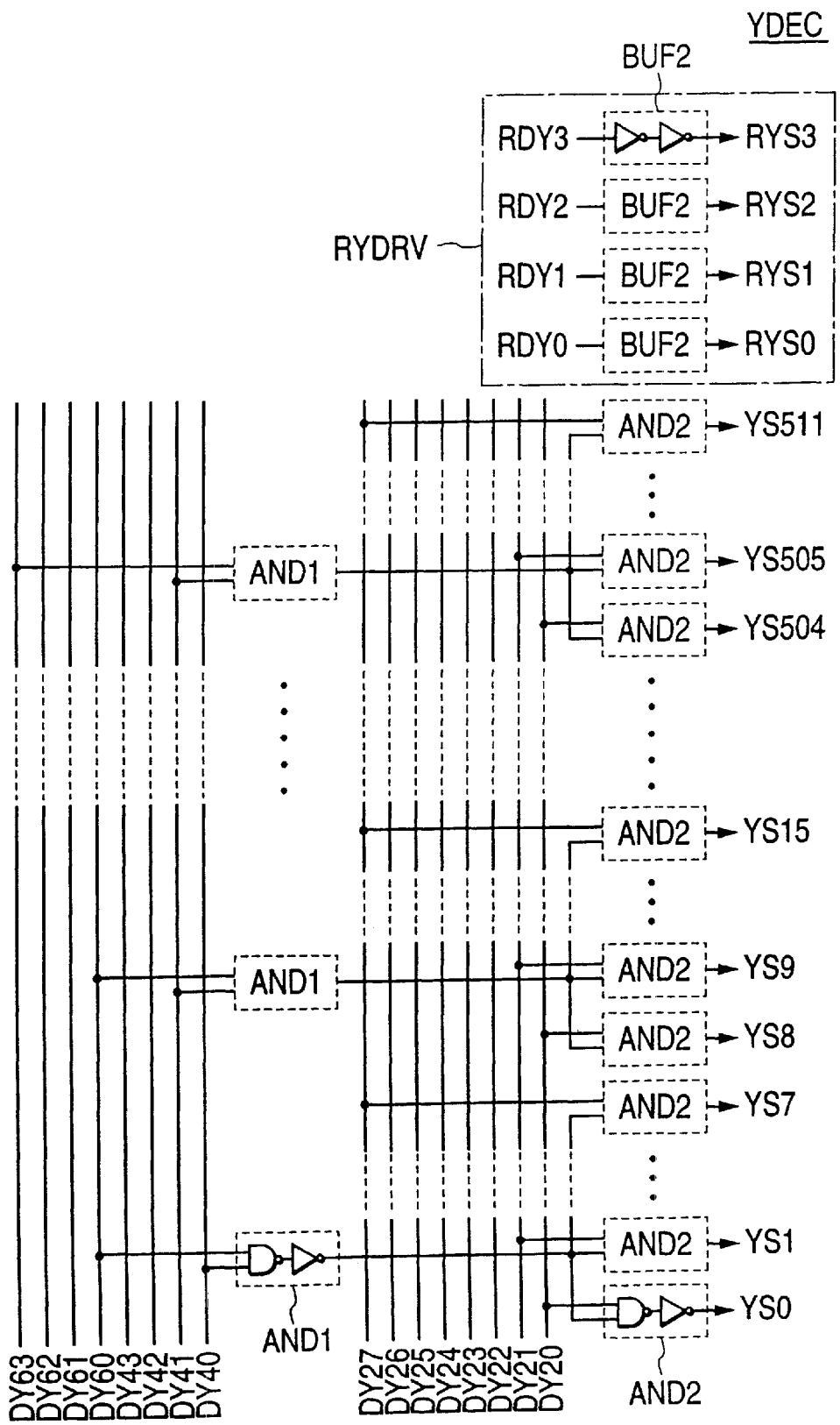
FIG. 17 is a diagram showing an example of a column decoder.

FIG. 17 shows an example of the column decoder YDEC in FIG. 16. For the decoding operation of selecting any of the column selection lines YS0 to YS127, a number of 2-input AND circuits AND1 and AND2 each comprising the NAND gate and the inverter are provided. The column address signals DY20 to DY27 each obtained by predecoding three bits of the column address and the column address signals DY40 to DY43 and DY60 to DY63 each obtained by predecoding two bits of the column address are inputted.

First, the AND of any of the signals DY60 to DY63 and any of the signals DY40 to DY43 is obtained by the AND circuit AND1, and then the AND of an output of the AND circuit AND1 and any of the signals DY20 to DY27 is obtained, thereby decoding seven bits of the address, so that desired one can be selected from the 128 column selection lines YS0 to YS127. For driving the redundant column selection lines RYS0 to RYS3, a redundant column driver RYDRV comprising four buffer circuits BUF2 each of which is constructed by connecting two inverters is also provided.

Figure 18:
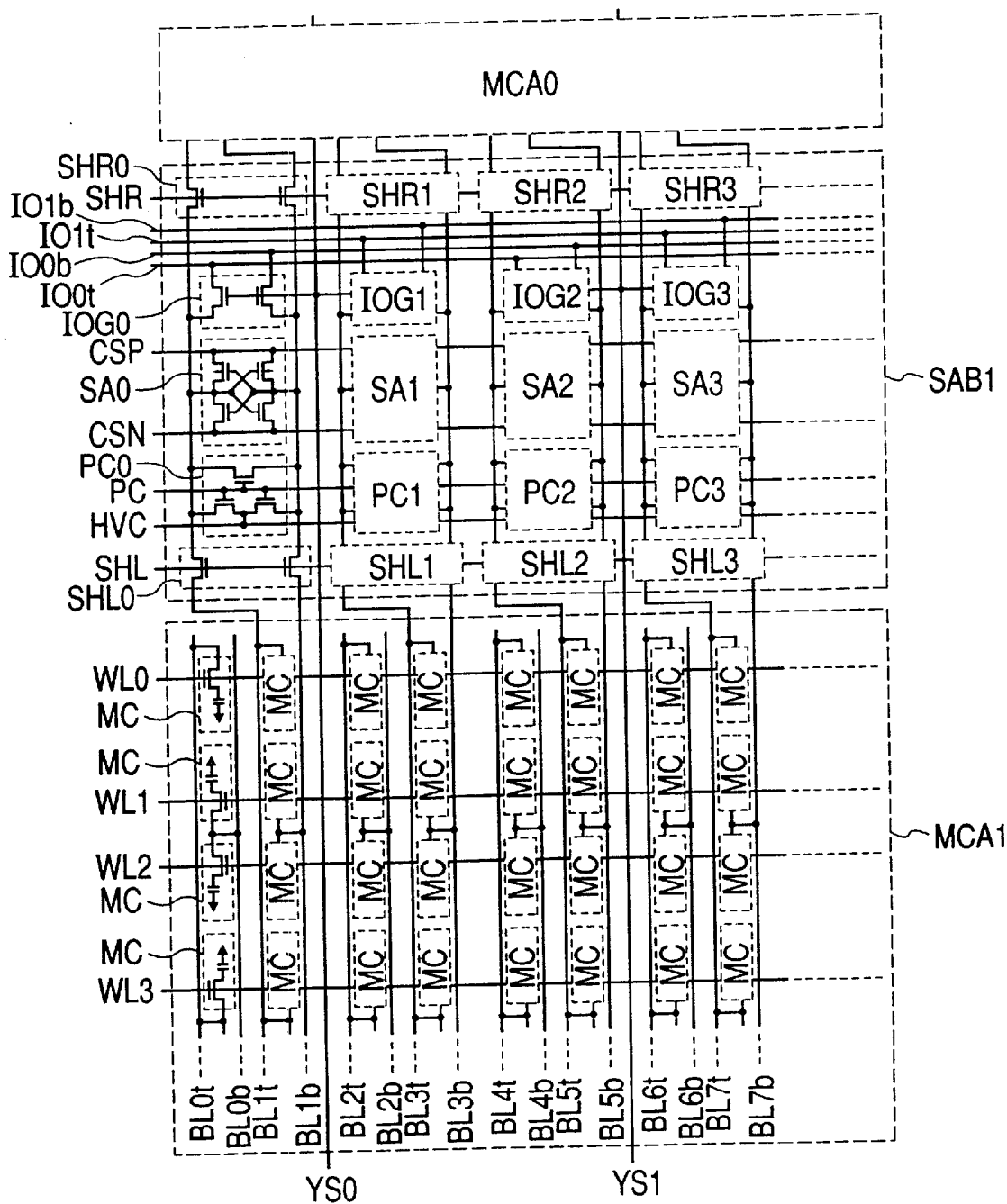
FIG. 18 is a diagram showing an example of a memory cell array and a sense amplifier part.

FIG. 18 shows an example of the sense amplifier part SAB1 and the mat MCA1 in FIG. 16. The mat MCA1 takes the form of known folded bit line structure in which memory cells MC are disposed at intersecting points of one of bit line pairs BL0t and BL0b, BL0t and BL0b, . . . and the word lines WL0, WL1, . . . The memory cell MC is a 1-transistor 1-capacitor type memory cell comprising one NMOS transistor and one capacitor. The sense amplifier part SAB1 is shared by the two mats MCA0 and MCA1 and comprises shared gates SHL0, SHL1, . . . , and SHR0, SHR1, . . . , precharging circuits PC0, PC1, . . . , sense amplifiers SA0, SA1, . . . , input/output gates IOG0, IOG1, . . . The precharging circuits PC0, PC1, . . . precharge the bit line pairs in the mats MCA0 and MCA1 to a precharge voltage HVC. Each of the shared gates SHL0, SHL1, . . . and SHR0, SHR1, . . . connects the bit line pair in the mat MCA0 or MCA1 and the sense amplifier and separates the bit line pair in the other mat. When a word line is selectively driven in the mat connected to the sense amplifier part, a signal is read on each of the bit line pairs BL0t and BL0b, BL0t and BL0b, . . . from the memory cells MC and amplified by each of the sense amplifiers SA0, SA1, . . . The input/output gates (or column switches) IOG0, IOG1, . . . are selected by the column selection lines YS0, YS1, . . . , thereby connecting desired sense amplifiers to the input/output line pairs IO0t and IO0b, and IO1t and IO1b. An example in which the column selection line is disposed every two sense amplifiers in the sense amplifier part, that is, every four pairs of the bit lines in the mat is shown. By substituting the redundant column selection line for the column selection line, the sense amplifier for receiving/transmitting data from/to the input/output lines IO0t and IO0b and IO1t and IO1b can be replaced and a defective memory cell can be repaired by being replaced to a redundant memory cell.

Figure 19:
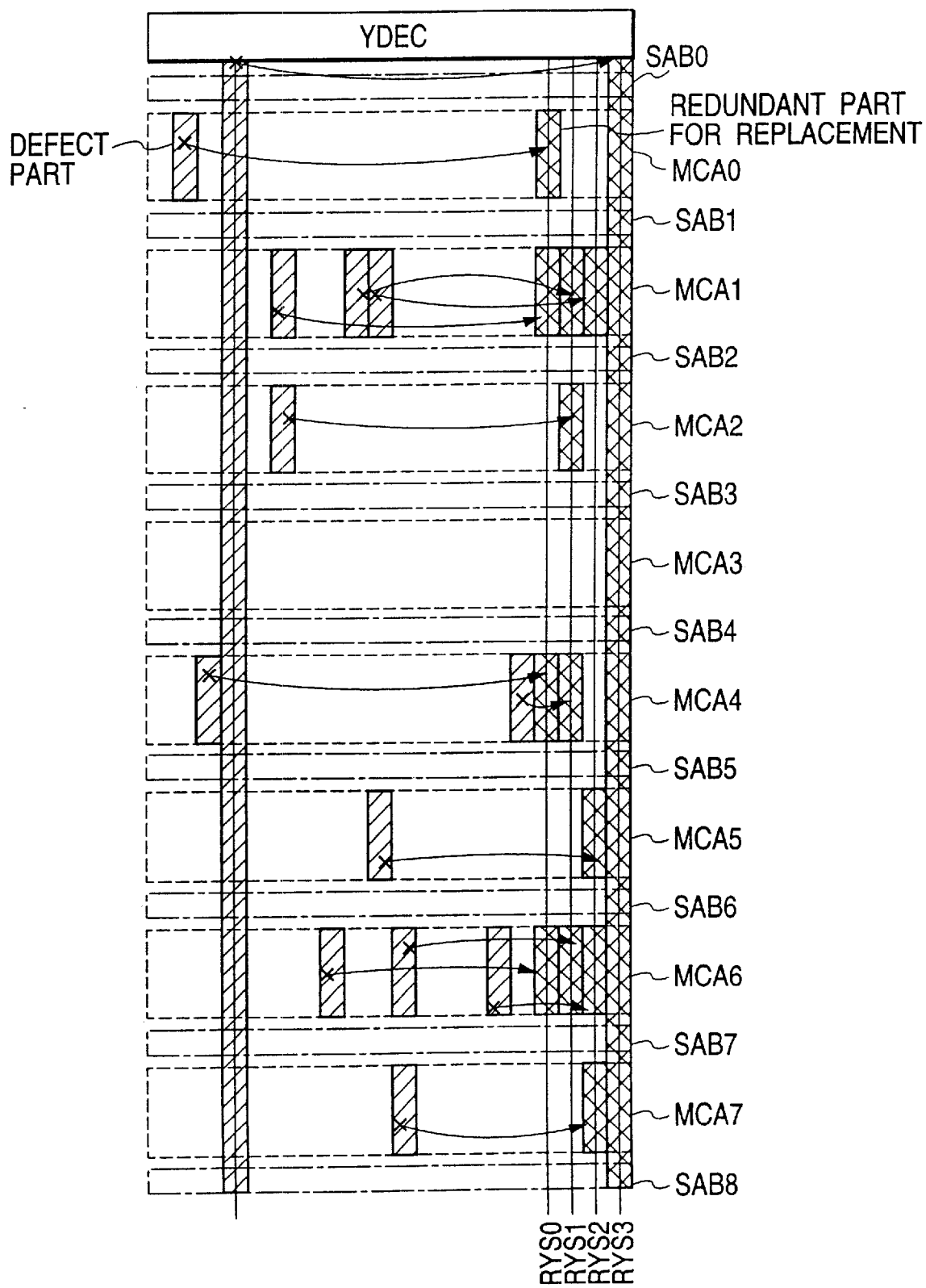
FIG. 19 is a diagram showing a substitution example of column selection lines.

FIG. 19 illustrates a replacement example of the column selection line in the construction as described above. By substituting the redundant column selection line for the column selection line, the redundant bit line is substituted for the bit line in each mat and a group of redundant memory cells is substituted for the group of memory cells of a defect part. Diagonally shaded areas are replaced by grid patterned areas. In this case, the fuse-decision result of the first fuse circuit MSF illustrated in FIG. 10 is as shown in FIG. 51A and the output of the address shifter MSSF is as shown in FIG. 51B.

In the example, the fuse-decision result FMSA of the first fuse circuit MSF in the comparing circuit RYC3 is set to "1" and the redundant column selection line RYS3 is substituted for the column selection line irrespective of the mat selection signal. Other redundant column selection lines RYS0 to RYS2 are substituted for the column selection lines in four mats out of eight mats. Consequently, in FIG. 51A, the number of "1" from each of the comparing circuits RYC0 to RYC2 is four. In the column related redundancy system of the embodiment, the repair can be flexibly performed. Hitherto, in such a flexible redundancy system, the number of fuse sets is large. When the decode system or the binary system is used, there is accordingly a drawback that the number of necessary fuses and the number of fuses to be blown are large. In the embodiment, the mat selection signals are arranged in the sort system, thereby reducing the number of fuses and the number of fuses to be blown. That is, increase in the chip area is suppressed by using a small number of fuses, the cost required to blow the fuses is reduced since the number of fuses to be blown is small, the yield is increased because of high repairing efficiency, and a manufacturing cost of an SDRAM can be reduced.

Although the embodiment has been described by preventing specific numerical values such as four redundant column selection lines for 128 normal column selection lines, it will be obviously understood that the invention is also effective to cases where other numerical values are used. Although the flexible redundancy repair on the mat unit basis has been described, the invention can be also applied to the case where a plurality of mats are used as a unit. Specifically, when the pair of mats MCA0 and MCA4, the pair of mats MCA1 and MCA5, the pair of mats MCA2 and MCA6, and the pair of mats MCA3 and MCA7 in FIG. 16 operate degenerately, they can be dealt as four logical memory mats. Although the SDRAM has been described as an example, the embodiment relates to the repair of a defect in a memory array. When the invention is applied to other DRAMs such as fast page mode ones, similar effects can be therefore produced. The invention can be also applied to memories other than DRAMs. The embodiments shown below are in a like manner.

Third Embodiment

A modification of the circuit in FIG. 10 of the address shifter serving as a main part of the redundant circuit according to the sort system of the invention.

Figure 20:
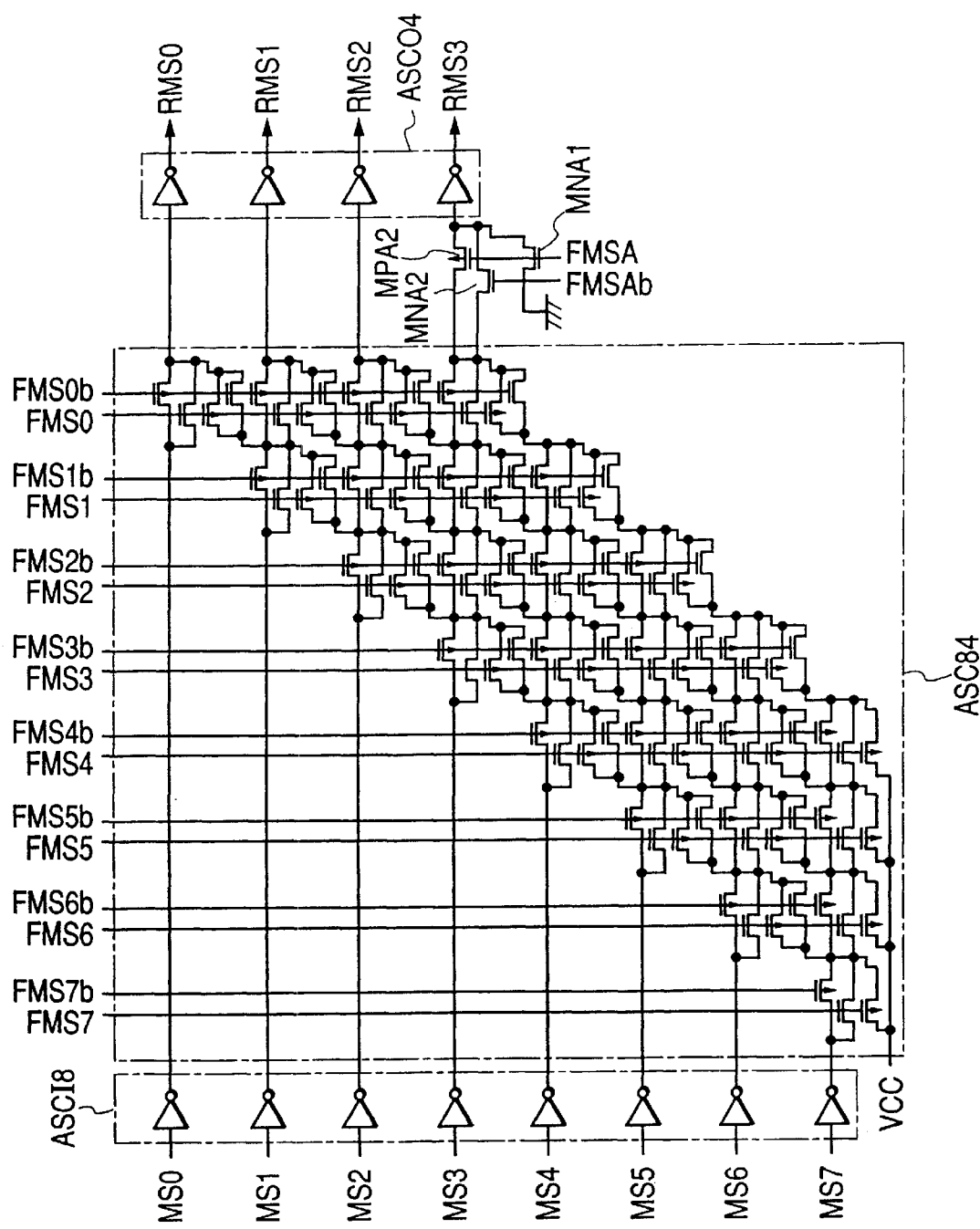
FIG. 20 is a diagram showing an example of an address shifter using CMOS pass transistors.

FIG. 20 shows an example of an address shifter using a CMOS pass transistor. In a manner similar to the circuit shown in FIG. 10, the circuit can be used as the address shifter MSSF in FIG. 9. The circuit comprises: an input part ASCI8 having eight CMOS inverters to which mat selection signals MS0 to MS7 are inputted; an output part ASCO4 having four CMOS inverters for outputting the comparison results RMS0 to RMS3 of the repairing mat addresses; a pass transistor part ASC84 for forming a desired signal path between the input part ASCI8 and the output part ASCO4; NMOS transistors MNA1 and MNA2; and a PMOS transistor MPA2. The pass transistor part ASC84 is comprised of 48 NMOS transistors and 52 PMOS transistors whose gates are connected to the fuse-decision results FMS0b, FMS0, FMS1b, FMS1, . . . , FMS7b, and FMS7. Except for four PMOS transistors for transmitting the source voltage VCC, the NMOS transistors and the PMOS transistors are paired, respectively, to thereby form 48 CMOS switches.

The operation is performed as follows. When any of the mat selection signals MS0 to MS7 goes high, any of the CMOS inverters in the input part ASCI8 outputs a low-level signal. When a signal path leasing from the CMOS inverter outputting the low-level signal in the input part ASCI8 to the CMOS inverter in the output part ASCO4 is formed by the CMOS switches in the pass transistor part ASN84, the CMOS inverter in the output part ASCO4 outputs a high-level signal. Since the high-level signal is inputted to the other CMOS inverters in the output part ASCO4, low-level signals are outputted from the other CMOS inverters.

When the fuse-decision result FMSA is high and the result FMSAb is low, the NMOS transistor MNA1 is always ON, so that the comparison result RMS3 goes high irrespective of the mat selection signals MS0 to MS7. In this case, since the NMOS transistor MNA2 and the PMOS transistor MPA2 are turned off, an output of the pass transistor part ASC84 and that of the NMOS transistor MNA1 do not collide with each other.

By using the CMOS pass transistors as described above, although the number of elements is larger than that in the address shifter using the NMOS pass transistors shown in FIG. 10, the nodes in the pass transistor part ASC84 have either the source voltage VCC or the ground voltage VSS, so that the output part ASCO4 can be constructed by ordinary CMOS inverters. In the address shifter shown in FIG. 10, the transistor size has to be set so that the input of the level holding inverter LCI which has been fed back from the PMOS transistor MP1 can be inverted by the maximum nine NMOS transistors which are connected in series. On the other hand, the full amplitude can be transmitted in the circuit shown in FIG. 20, so that the operation can be stably performed by using transistors having a relatively small size.

Fourth Embodiment

Figure 21:
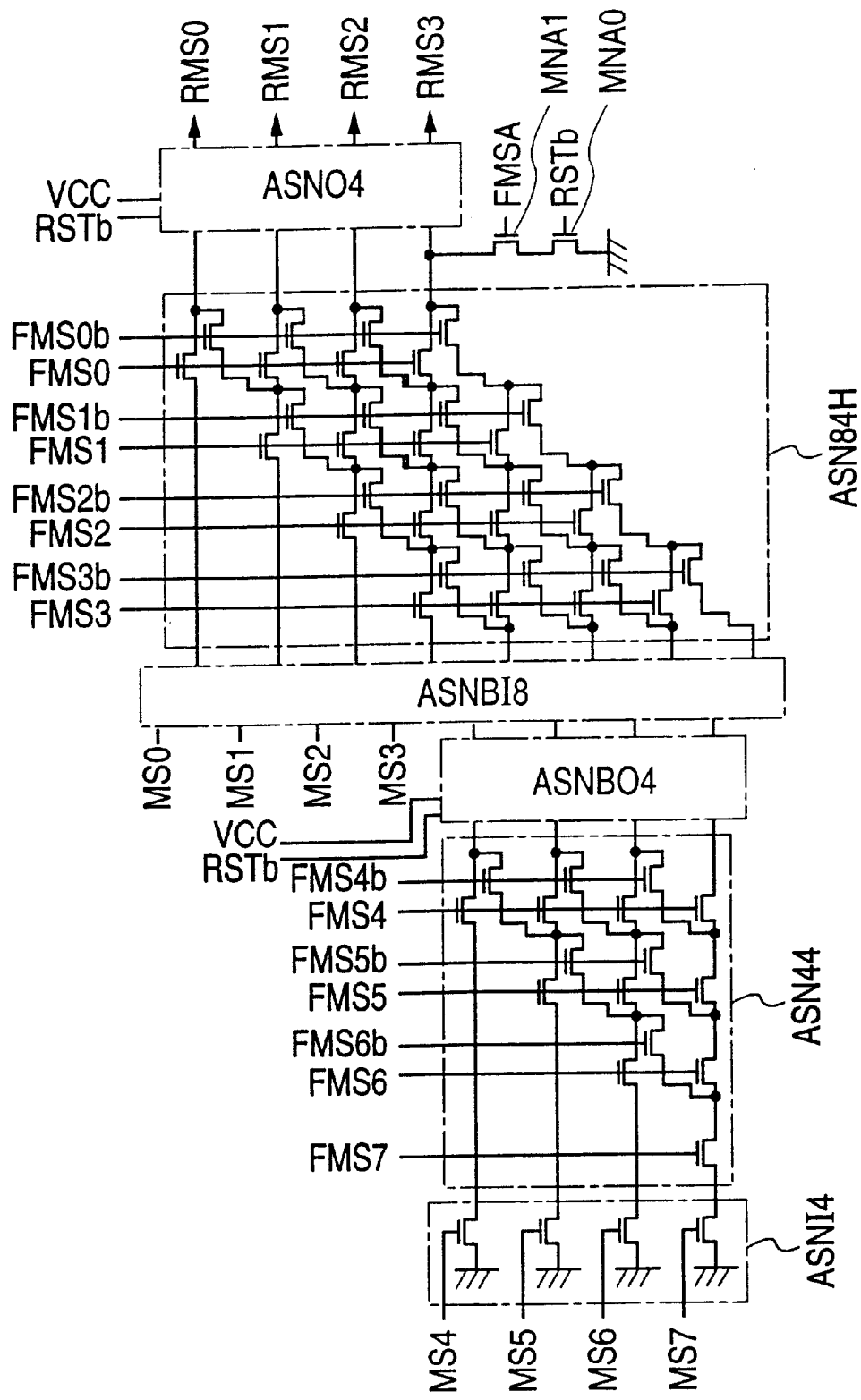
FIG. 21 is a diagram showing an example of an address shifter in which buffers are provided.

FIG. 21 shows another example of the address shifter using the NMOS pass transistors. In a manner similar to the circuits shown in FIGS. 10 and 20, the circuit can be used as the address shifter MSSF in FIG. 9. The circuit is characterized in that the NMOS pass transistor part is divided into two parts and a buffer is interposed between the two parts. The circuit comprises: an input part ASNI4 to which the mat selection signals MS4 to MS7 are inputted; ASNB04 and ASNBI8 serving as buffers; an output part ASNO4 for outputting the comparison results RMS0 to RMS3 of the repairing mat addresses; a 4-input 4-output pass transistor part ASN44 for forming a desired signal path between the input part ASNI4 and the buffer ASNBO4; an 8-input 4-output pass transistor part ASN84H for forming a desired signal path between the buffer ASNBI8 and the output part ASNO4; and NMOS transistors MNA0 and MNA1. The input part ASNI4 is comprised of four NMOS transistors whose sources are connected to the ground voltage VSS. The pass transistor part ASN44 is comprised of 16 NMOS transistors whose gates are connected to the fuse-decision results FMS4b, FMS4, FMS5b, FMS5, FMS6b, FMS6, and FMS7. The pass transistor part ASN84H is comprised of 32 NMOS transistors whose gates are connected to fuse-decision results FMS0b, FMS0, FMS1b, FMS1, FMS2b, FMS2, FMS3b, and FMS3. That is, the pass transistor part ASN84 in FIG. 10 is divided into the two parts ASN44 and ASN84H in the circuit. Each of the buffer ASNB04 and the output part ASNO4 has the same construction as that of the output part ASNO4 in FIG. 10 and is comprised of four level holding inverters LCI. The buffer ASNBI8 has the same construction as that of the input part ASNI8 in FIG. 10 and is comprised of eight NMOS transistors.

The operation is performed as follows. When the row-related operation is performed, the reset signal RSTb is set to the high level to make the level holding inverters LCI in the buffer ASNB04 and the output part ASNO4 active. When any of the mat selection signals MS0 to MS3 goes high, any of the NMOS transistors in the buffer ASNBI8 is made conductive. When a signal path to the output part ASNO4 is formed in the pass transistor part ASN84H, the output goes high. Meanwhile, when any of the mat selection signals MS4 to MS7 goes high, any of the NMOS transistors is made conductive in the input part ASNI4. When a signal path leading to the buffer ASNBO4 is formed in the pass transistor part ASN44, the output goes high. The result is supplied to the buffer ASNBI8 and one of the outputs of the output part ASN04 goes high in accordance with the signal path formed in the pass transistor part ASN84H. When the fuse-decision result FMSA is at the high level, in a manner similar to the address shifter shown in FIG. 10, the comparison result RMS3 goes high irrespective of the mat selection signals MS0 to MS7.

By dividing the NMOS pass transistor part and inserting the buffers, the number of NMOS transistors which are connected in series between the level holding inverter and the ground voltage VSS can be reduced. The increase in the resistance due to the serial connection can be limited and the operation can be performed stably. Effects similar to those of the address shifter using the CMOS pass transistors shown in FIG. 20 are obtained with the less number of elements to be added.

Fifth Embodiment

Figure 22:
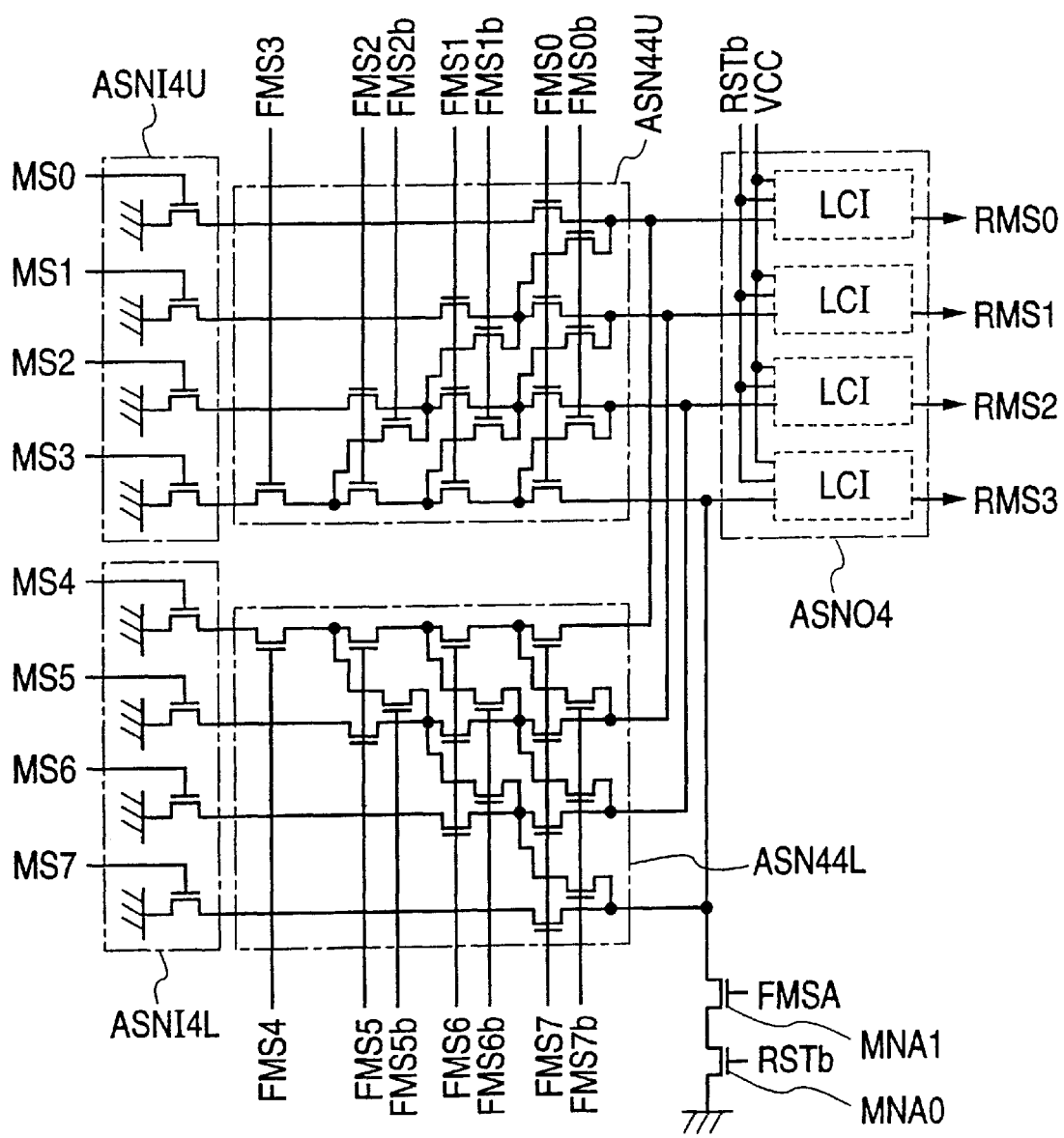

FIG. 22 shows further another construction of the address shifter using the NMOS pass transistors. In a manner similar to the circuits shown in FIGS. 10, 20, and 21, the circuit of FIG. 22 can be also used as the address shifter MSSF in FIG. 9. The circuit is characterized in that the circuit scale of the pass transistor part is reduced by dividing the mat selection signals which are supplied into two groups and providing a pass transistor part for each of the groups. The circuit comprises: an input part ASNI4U to which the mat selection signals MS0 to MS3 are supplied; an input part ASNI4L to which the mat selection signals MS4 to MS7 are supplied; an output part ASNO4 for outputting the comparison results RMS0 to RMS3 of the repairing mat addresses; a 4-input 4-output pass transistor part ASN44U provided between the input part ASNI4U and the output part ASN04; a 4-input 4-output pass transistor part ASN44L provided between the input part ASNI4L and the output part ASNO4; and the NMOS transistors MNA0 and MNA1. Each of the input parts ASNI4U and ASNI4L is comprised of four NMOS transistors whose sources are connected to the ground voltage VSS in a manner similar to the input part ASNI4 in FIG. 21. Each of the pass transistor parts ASN44U and ASN44L is comprised of 16 NMOS transistors. The pass transistor part ASN44U is controlled by fuse-decision results FMS0b, FMS0, FMS1b, FMS1, FMS2b, FMS2, and FMS3. The pass transistor part ASN44L is controlled by fuse-decision results FMS7b, FMS7, FMS6b, FMS6, FMS5b, FMS5, and FMS4. The ORs of outputs of the pass transistor units ASN44U and ASN44L are obtained by the wired OR at the input terminals of the output part ASN04. The output part ASN04 has the same construction as that of the output part ASN04 in FIG. 10 and is comprised of four level-holding inverters LSI.

The operation is performed as follows. In case of carrying out the row-related operation, the reset signal RSTb is set to the high level to thereby make the level holding inverters LCI in the output part ASN04 active. When any of the mat selection signals MS0 to MS3 goes high, any of the NMOS transistors is made conductive in the input part ASNI4U. When a signal path leading to the output part ASN04 is formed in the pass transistor part ASN44U, the output goes high. In this case, since all of the mat selection signals MS4 to MS7 are at the low level, a current path is not formed in the input part ASNI4L and the pass transistor part ASN44L. On the other hand, when any of the mat selection signals MS4 to MS7 goes high, any of the NMOS transistors is made conductive in the input part ASNI4L. When a signal path leading to the output part ASN04 is formed in the pass transistor part ASN44L, the output goes high. In this case, since all of the mat selection signals MS0 to MS3 are at the low level, a current path is not formed in the input part ASNI4U and the pass transistor part ASN44U. The pass transistor part ASN44U is connected so that the mat selection signals MS0, MS1, MS2, and MS3 which are selected by the fuse-decision results are sequentially allocated to RMS0, RMS1, RMS2, and RMS3 in accordance with the selected order. The pass transistor part ASN44L is connected so that the mat selection signals MS7, MS6, MS5, and MS4 which are selected by the fuse-decision results are allocated, contrarily, to RMS3, RMS2, RMS1, and RMS0 in accordance with the selected order. Consequently, when the first fuse circuit is in a right state to store the maximum four mat selection signals, two or more mat selection signals are not allocated to the same output of the address shifter. When the fuse-decision result FMSA is at the high level, in a manner similar to the address shifter shown in FIG. 10, the comparison result RMS3 goes high irrespective of the mat selection signals MS0 to MS7.

By dividing the eight mat selection signals into two groups each having of four signals and providing the pass transistor part for each group, the circuit can be constructed by two 4-input 4-output pass transistor parts, so that the number of elements is smaller than that of the construction of FIG. 10 using the 8-input 4-output pass transistor part and the occupied area can be made smaller. In a manner similar to the construction in which the buffers are interposed shown in FIG. 21, the number of NMOS transistors which are connected in series from the level holding inverter to the ground voltage VSS can be reduced and the operation can be performed stably.

Sixth Embodiment

Figure 23:
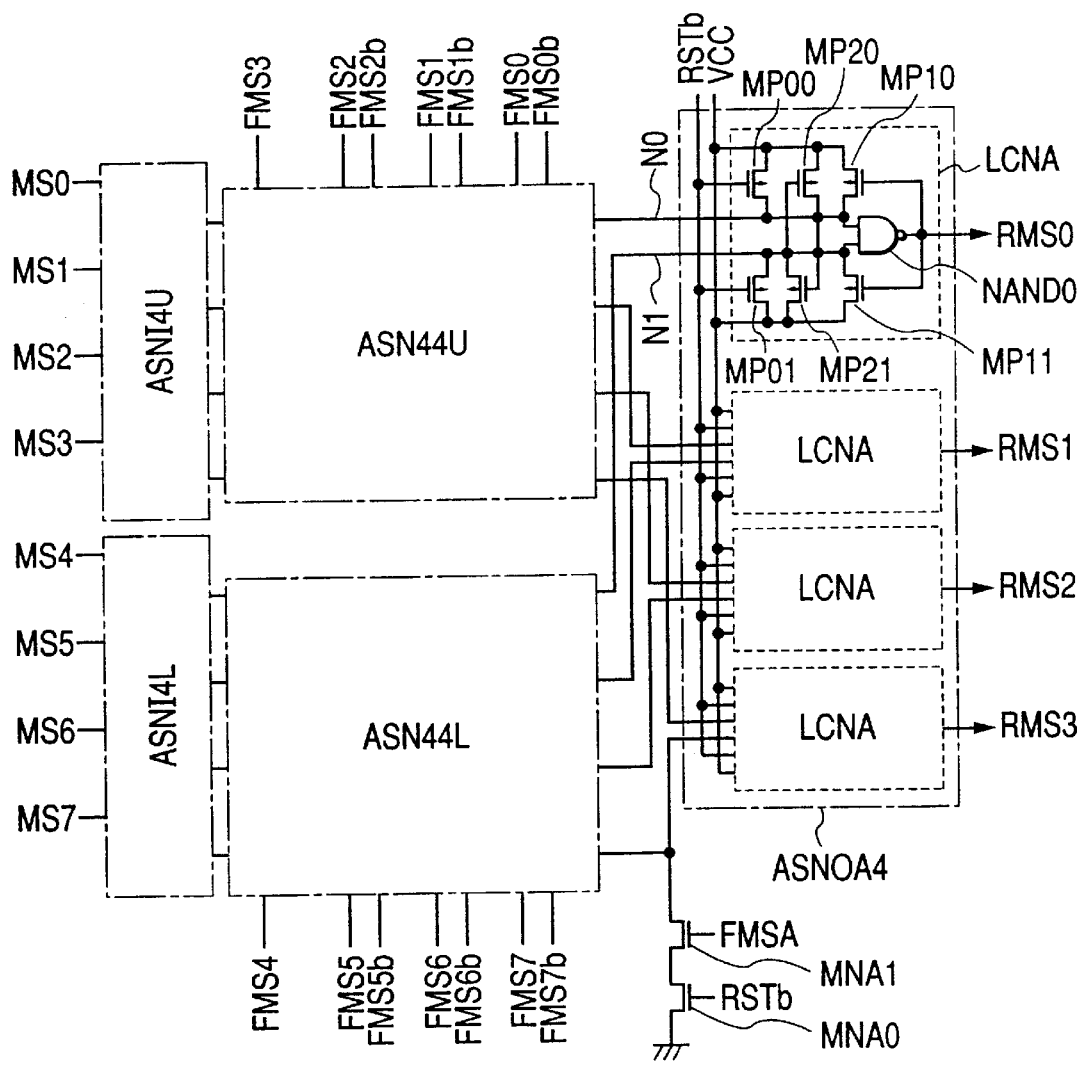
FIG. 23 is a diagram showing an example of an address shifter using level holding NAND circuits.

FIG. 23 shows another example of the address shifter in which the mat selection signals are divided into two groups and each group is provided with a pass transistor part. The circuit is a modification of the address shifter shown in FIG. 22. The input parts ASNI4U and ASNI4L, the pass transistor parts ASN44U and ASN44L, and the NMOS transistors MNA0 and MNA1 have the same constructions as those shown in FIG. 22. An output part ASNOA4 for outputting the comparison results RMS0 to RMS3 of the repairing mat addresses is different from the output part ASN04 in FIG. 22 and is comprised of four level-holding NAND circuits LCNA.

The level-holding NAND circuits LCNA in the output part ASN0A4 operate as follows. In case of performing a row-related operation, the reset signal RSTb is set to the high level and transistors MP00 and MP01 are turned off. At this time, both of nodes N0 and N1 are at the high level and transistors MP20 and MP21 are OFF. An NAND gate NAND0 generates a low-level output and transistors MP10 and MP11 are ON. In this case, for example, when a current path leading from the node N0 to the ground voltage VSS is formed in the input part ASNI4U and the pass transistor part ASN44U, the node N0 goes low and the NAND gate NAND0 outputs a high-level signal. As a result, although the transistors MP10 and MP11 are turned off, the transistor MP21 is turned on and the node N1 is kept at the high level.

Since the output is the wired OR in the construction shown in FIG. 22, for example, when a current path is formed in the pass transistor part ASN44U, there is a case that the NMOS pass transistors which are ON become a load. On the other hand, outputs of the pass transistor parts ASN44U and ASN44L are separated from each other in the construction of FIG. 23, so that the transistors do not become a load. As a result, the parasitic capacitance charged and discharged decreases, so that the current consumption can be reduced and a more stable operation can be performed. By obtaining the OR of two inputs in the output part, the number of elements increases. According to the construction, however, by using the level holding NAND circuit for holding the level of one of inputs high by using the PMOS transistor whose gate receives the other input, increase in the number of elements is minimized. In the case where one of the inputs is allowed to be floated, the number of elements can be reduced by eliminating the transistors MP20 and MP21.

Seventh Embodiment

The modifications of the address shifter of the embodiment shown in FIGS. 7 to 19 have been described above. Modifications of the fuse circuit will now be shown.

Figure 24:
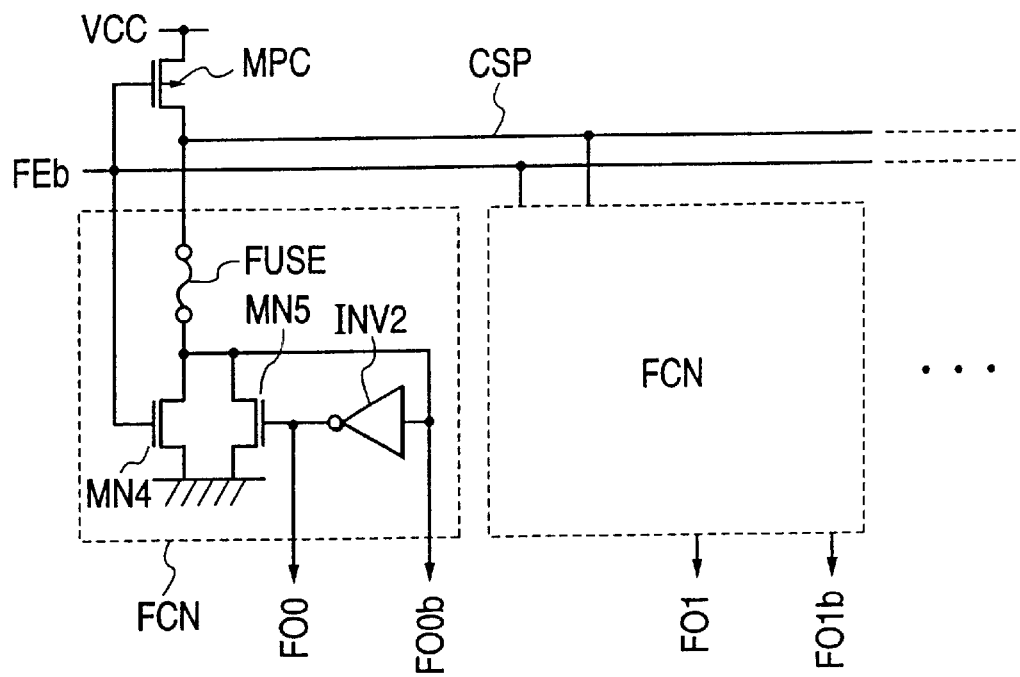
FIG. 24 is a diagram showing another example of the fuse decision circuit.

FIG. 24 shows an example of the fuse circuit in which the PMOS transistor is commonly used, which can be used as the fuse circuit MSF or AYF in FIG. 9. In the circuit of FIG. 24, a PMOS transistor MPC is provided at a node CSP which is commonly used by a plurality of fuse circuit cells FCN. Each fuse circuit cell comprises a fuse FUSE, NMOS transistors MN4 and MN5, and a CMOS inverter INV2.

The fuse circuit operates as follows. During an enable signal FEb is at the high level, the PMOS transistor MPC is OFF and the NMOS transistor MN4 is ON in each fuse circuit cell FCN. Irrespective of the state of the fuse FUSE, the outputs FO0, FO1, . . . are at the high level and the outputs FO0b, FO1b, . . . are at the low level. When the enable signal FEb goes low, the PMOS transistor MPC is turned on, the node CSP goes high, and the NMOS transistor MN4 is turned off in each fuse circuit cell FCN. When the fuse FUSE is not blown, the decision result is inverted. On the other hand, when the fuse FUSE is blown, the same state is kept by the NMOS transistor MN5.

In the fuse circuit, by sharing the PMOS transistor MPC by the plurality of the fuse circuit cells FCN, the number of elements can be reduced as compared with the case where the fuse circuit is constructed by the fuse decision circuit shown in FIG. 11. In a manner similar to the fuse decision circuit of FIG. 11, complementary outputs are obtained by using the CMOS inverter INV2 necessary to make the output fully amplified. As shown in FIG. 10, the fuse circuit is suited to the construction using complementary fuse-decision results. In the fuse decision circuit shown in FIG. 11, the fuse FUSE is provided on the NMOS transistor side for the decision-result output. In the fuse circuit cell FCN, the fuse FUSE is provided on the PMOS transistor side. It can be, however, provided on the NMOS transistor side.

Figure 25:
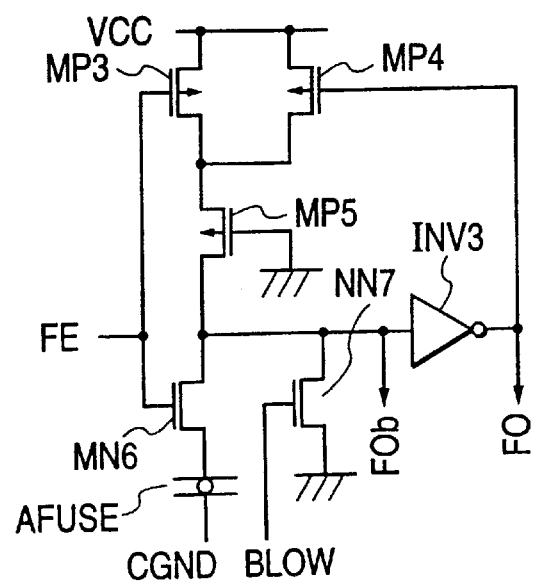
FIG. 25 is a diagram showing an example of an anti-fuse decision circuit.

FIG. 25 shows an anti-fuse decision circuit. Such an anti-fuse decision circuit is disclosed in, for example, {REF 3}. The fuse circuit MSF or AYF in FIG. 9 can be also realized by the circuit. The anti-fuse decision circuit comprises an anti-fuse AFUSE, NMOS transistors MN6 and MN7, PMOS transistors MP3, MP4, and MP5, and a CMOS inverter INV3. The fuse AFUSE can be realized by, for instance, a capacitor of the same insulating film as a storage capacity of the memory cell. In the fuse, the conductive layer is blown by a laser or the like. On the other hand, the insulating film is electrically blown in the anti-fuse. In contrast to the fuse, the anti-fuse is in an open state at the time of manufacture and is made conductive by being blown and selectively disconnected.

In case of blowing the anti-fuse, the enable signal FE is set to the high level so that the PMOS transistor MP3 is turned off and the NMOS transistor MN6 is turned off, thereby applying a high voltage which is higher than the source voltage VCC to a control signal CGND. By setting a "blow" control signal BLOW to the high level, the NMOS transistor MN7 is turned on. The output node F0b goes low, the output node F0 goes high by the inverter INV3, and the PMOS transistor MP4 is turned off. As a result, a high voltage is applied to the anti-fuse AFUSE, the insulating film is destroyed, and conduction is made.

In case of deciding whether the anti-fuse is blown or not, the enable signal FE is set to the low level, the output F0b is set to the high level and the output F0 is set to the low level. When the enable signal FE goes high, the NMOS transistor MN6 is turned on and the PMOS transistor MP3 is turned off. When the anti-fuse AFUSE is blown, a current flows through the anti-fuse AFUSE and a load resistance is increased by the PMOS transistor MP5, so that the decision result F0 goes high and the decision result F0b goes low. On the other hand, when the anti-fuse AFUSE is not blown, the decision result F0 is kept at the low level by the PMOS transistor MP4 and the decision result F0b keeps the high level by the inverter INV0.

By using the anti-fuse formed by a capacitor instead of the fuse, the anti-fuse can be electrically blown, so that it is unnecessary to provide an opening through which the anti-fuse is blown and the fabrication process can be simplified. An effect that the blowing operation can be performed after assembling the fuse in the package is also produced. The number of elements used for the anti-fuse decision circuit is, however, larger than that of an ordinary fuse decision circuit. Moreover, since the transistor size has to be determined so that the transistors MN6 and MN7 which construct a current path at the time of blow are of a sufficiently low resistance and that the transistor MP5 for determining a load resistance at the time of decision is of a sufficiently high resistance, the area becomes large. The sort system of the invention is suitable since the problem of the area of the anti-fuse decision circuit can be lightened. The invention is characterized by the sort system when the repairing address is stored. In a manner similar to the case of the anti-fuse, the invention is also effective to the case of using a non-volatile storage element except for a normal fuse.

Eighth Embodiment

A modification of the column related redundancy circuit shown in FIG. 9 will be described with reference to FIGS. 26 to 29. When the unit of substituting the column selection line is not one, although the unit is fixed to the mat unit in the systems explained with reference to FIGS. 7 to 19, the embodiment is characterized in that a function of extending the unit to a plurality of successive mats is added. It is assumed that the constructions of the whole SDRAM shown in FIG. 7, the column address driver YD in FIG. 15, and the memory array MAR shown in FIGS. 16 to 18 are the same as those of the system described with reference to FIGS. 7 to 19.

Figure 26:
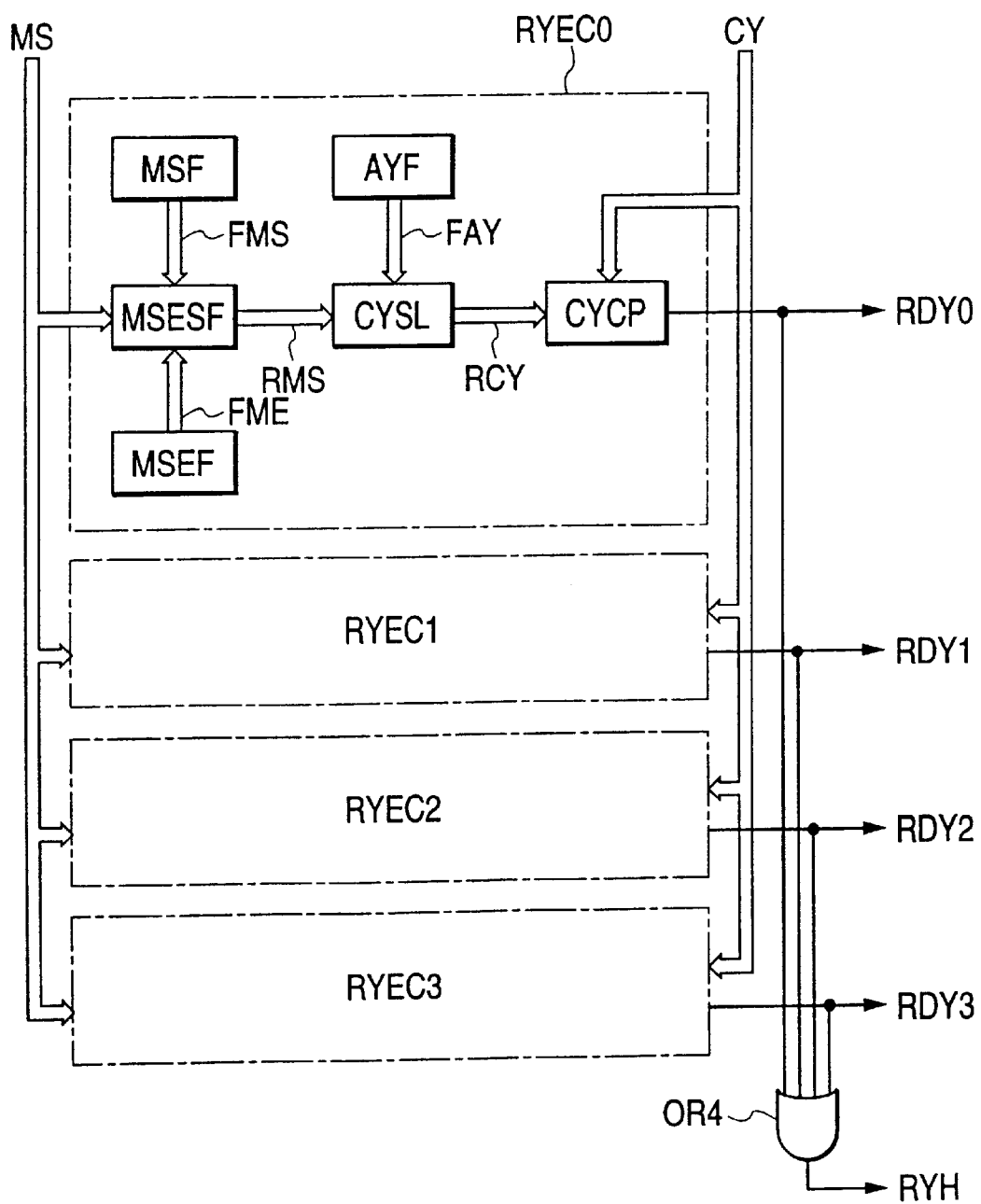
FIG. 26 is a diagram showing another example of the column related repair decision circuit.

FIG. 26 shows another example of the column related redundancy circuit according to the embodiment. The different points from FIG. 9 are that an address shifter MSESF obtained by slightly modifying the shifter in FIG. 9 is used and a third fuse circuit MSEF for programming that a substitution unit is a plurality of mats is added. The other circuits are the same as those in FIG. 9.

Figure 27:
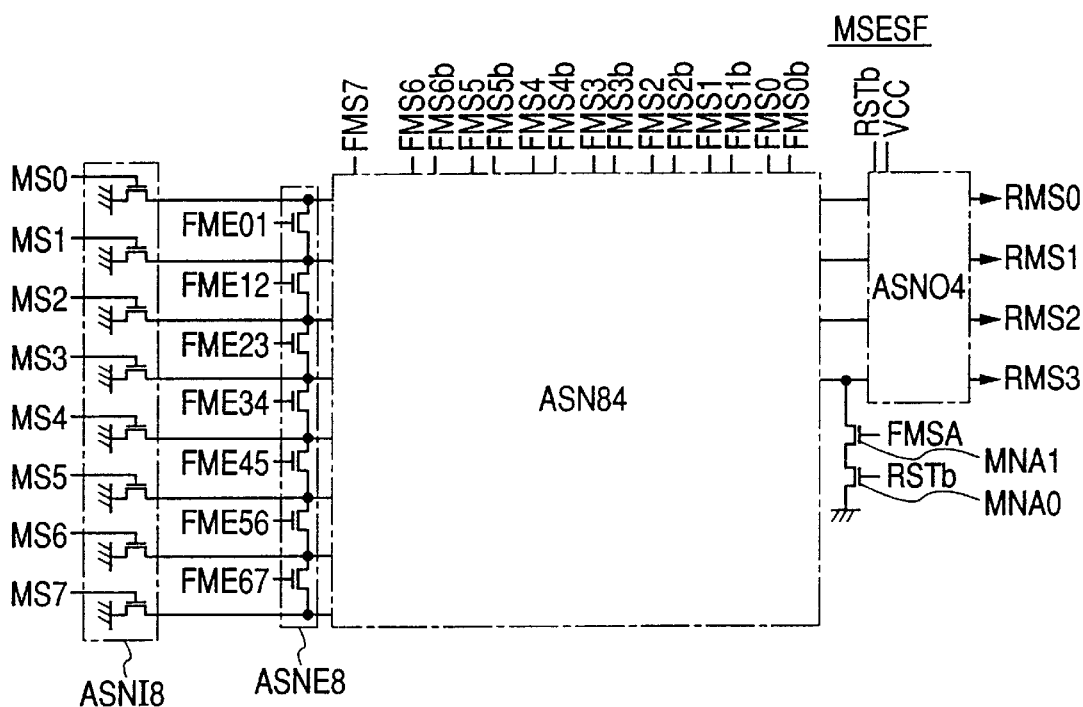
FIG. 27 is a diagram showing an example of an address shifter for obtaining the ORs of a plurality of mat addresses.

FIG. 27 shows an example of the modified address shifter MSESF. The difference from the circuit of FIG. 10 is that a switch part ASNE8 is provided between the input part ASNI8 and the pass transistor part ASN84. The switch part ASNE8 is made up of seven NMOS transistors each provided between neighboring two outputs of eight outputs of the input part ASNI8. The switch part ASNE8 obtains the ORs of the mat selection signals by short-circuiting the outputs of the input part ASNI8 by the switch part ASNE8 in accordance with the fuse-decision results FME01, FEM12, . . . , FME67 of the third fuse circuit MSEF in FIG. 26.

Figure 28:
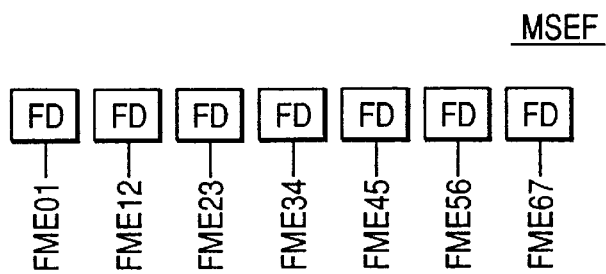
FIG. 28 is a diagram showing an example of a fuse circuit for storing the ORs of a plurality of mat addresses.

FIG. 28 shows an example of the third fuse circuit MSEF. The eight fuse decision circuits FD output fuse-decision results FME01, FME12, . . . , FME67, respectively. For example, the circuit shown in FIG. 11 is used as the fuse decision circuit FD and it is sufficient to use only the positive output F0 in FIG. 11.

Figure 29:
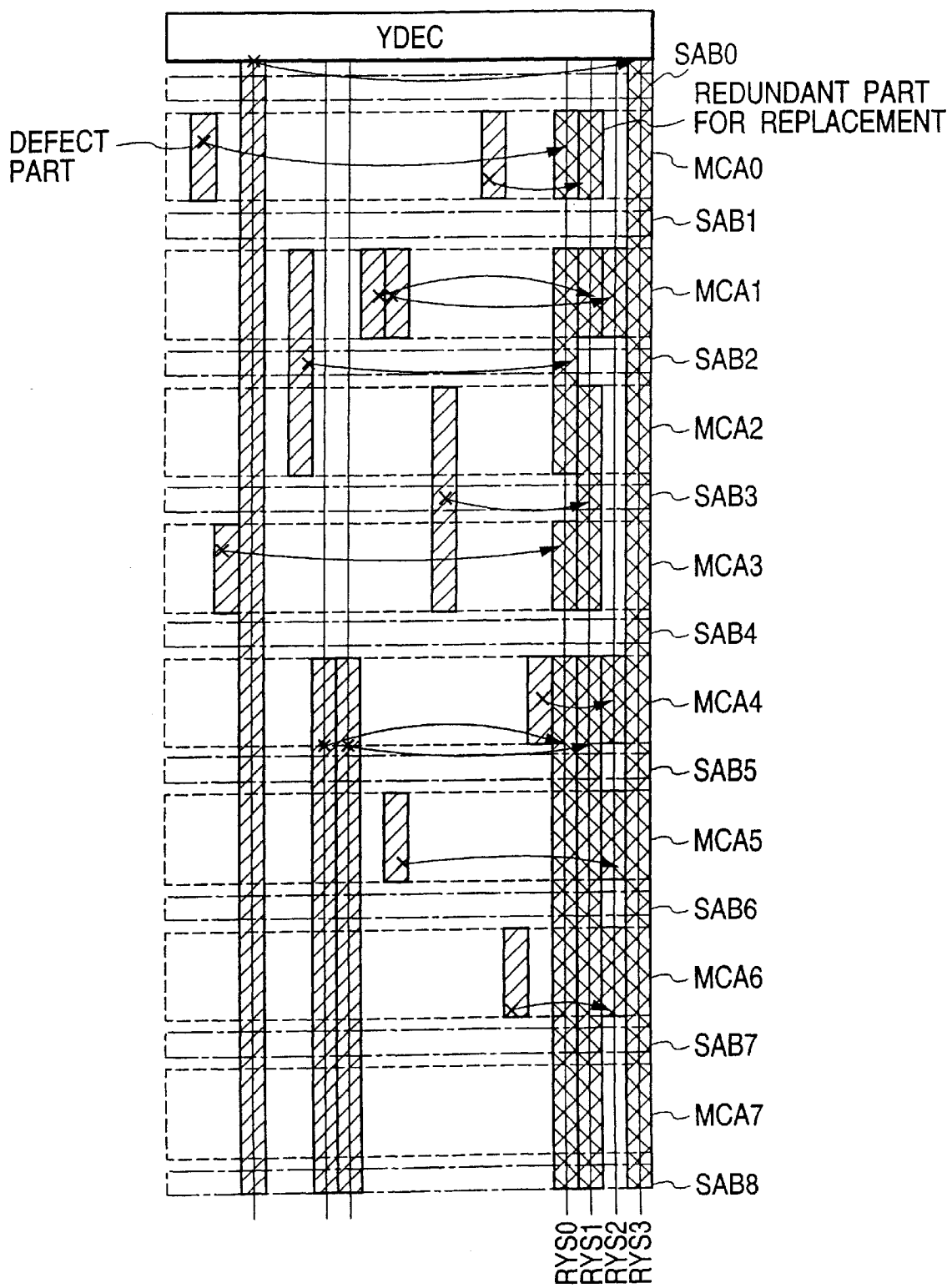
FIG. 29 is a diagram showing a substitution example of column selection lines.

FIG. 29 shows a replacement example of the column selection line having the construction as described above. Diagonally shaded areas are replaced by grid patterned areas. In this case, the fuse-decision results of the first fuse circuit MSF in FIG. 26 are as shown in FIG. 52A. The fuse-decision results of the third fuse circuit MSEF are as shown in FIG. 52B. Outputs of the address shifter MSESF are values shown by the logical expressions of FIG. 52C. In FIG. 52C, the sign "+" shows the OR.

In the example, the fuse decision circuit FME12 in the third fuse circuit MSEF is set to "1" in the comparing circuit RYEC0, and the column selection line is replaced by a redundant column selection line RYS0 commonly in the mats MCA1 and MCA2. The fuse decision circuit FME23 is set to "1" in the comparing circuit RYEC1, and the column selection line RYS1 is replaced with the redundant column selection line RYS1 commonly in the mats MCA2 and MCA3. By performing such replacement, a defect in the sense amplifier part can be dealt with. As shown in FIGS. 16 and 18, a sense amplifier part is shared by neighboring two mats. When there is a defect in the sense amplifier part, the same column selection line has to be replaced in the neighboring two mats. Moreover, since the sense amplifier parts are provided on both sides of a mat, the number of combinations of the neighboring two mats is seven. According to the embodiment, by obtaining the OR of the mat selection signals, a defect in the sense amplifier part can be efficiently dealt with by using a fuse set of one column address.

In the comparing circuits RYEC0 and RYEC1, each of the fuse-decision results FME45, FME56, and FME67 is set to "1" and redundant column selection lines RYS0 and RYS1 are substituted for the column selection lines commonly in the mats MCA4 to MCA7. By the substitution, a defect in the column selection line can be efficiently repaired. That is, it is effective on a defect such as disconnection or short-circuit occurring in some midpoint in the column selection line. The example of FIG. 29 shows a defect such as a short-circuit in two column selection lines between the mat MCA4 and the sense amplifier part SAB5. The column selection lines can be repaired by substitution irrespective of the mat selection signal also in the embodiments described with reference to FIGS. 7 to 19. In such a case, the repaired column selection line cannot be used for a repair of another defect. In the embodiment, however, the redundant column selection lines RYS0 and RYS1 are used for the replacement of another defect in the mats MCA0 to MCA3, so that the embodiment is more efficient.

The fuse-decision result FMSA in the first fuse circuit MSF is set to "1" in the comparing circuit RYEC3 and the redundancy column selection line RYS3 is substituted for the column selection line irrespective of the mat selection signal. The substitution can be performed irrespective of the mat selection signal also by setting all of the fuse-decision results FME01, FEM12, FME23, FME34, FME45, FME56, and FME67, to "1". By using the fuse-decision result FMSA, however, a large number of fuses to be blown can be reduced. When the number of fuses to be blown is not so important, the NMOS transistors MNA0 and MNA1 are eliminated in the address shifter of FIG. 27, thereby enabling the number of elements and the area to be further reduced.

By extending the unit of replacing the column selection line to the plurality of successive mats as described above, various defects can be efficiently repaired. Since the invention is not based on the repair address programming system, when the decode system shown in FIGS. 3 and 4 is used to store the mat selection signal, similarly, the substitution unit can be extended to a plurality of successive mats. Further, it is preferable to use the sort system of the invention as well since the number of fuses can be reduced.

Ninth Embodiment

The embodiments of applying the sort system shown in FIG. 1 to the column related flexible redundancy repair have been described above. It is a precondition of the sort system shown in FIG. 1 that the repairing addresses of the number smaller than the plurality of addresses are stored without being repeated. The sort system of storing the repairing addresses from the plurality of addresses as the combinations in which the same number may be used will now be described.

Figure 30:
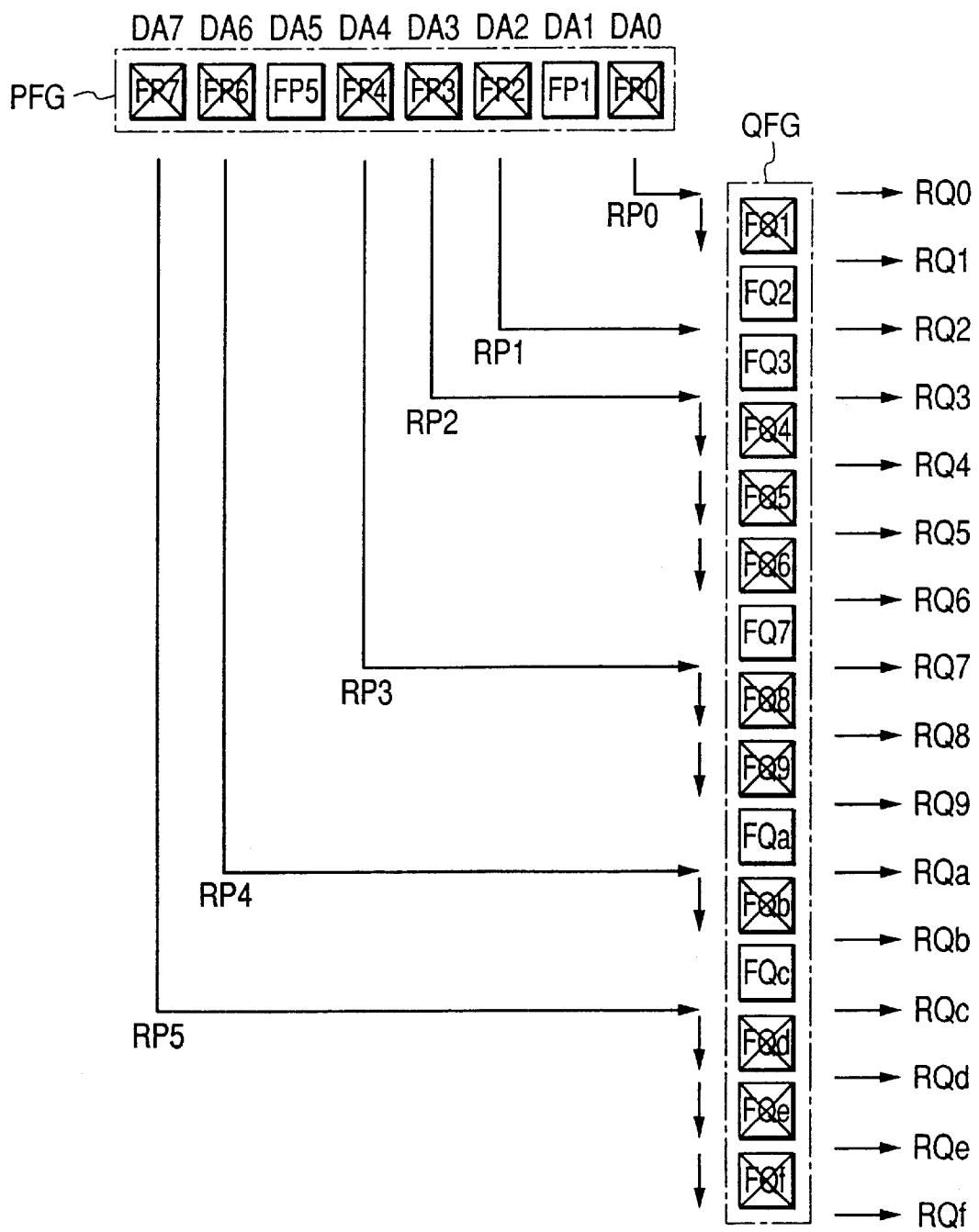
FIG. 30 is a diagram showing another example of the sorted address programming system.

FIG. 30 shows a sort system in the case where repair-decision results RQ0 and RQ1 go high when an address DA0 in eight decoded addresses DA0 to DA7 becomes high, a repair-decision result RQ2 goes high when the address DA2 becomes high, repair-decision results RQ3 to RQ6 go high when the address DA3 becomes high, repair-decision results RQ7 to RQ9 go high when the address DA4 becomes high, repair-decision results RQa and RQb go high when the address DA6 becomes high, and repair-decision results RQc to RQf go high when the address DA7 becomes high. The case corresponds to a case where 16 fuse sets may have the same addresses to the eight addresses, namely, the maximum four fuse sets can have the same address.

In a manner similar to the fuse group SFG in FIG. 1, a first fuse group PFG is comprised of fuses corresponding to the decoded eight addresses DA0 to DA7, each showing the presence/absence of the repairing address for each address. On the other hand, a second fuse group QFG is comprised of fuses corresponding to the repair-decision results and show the correspondence between the repairing addresses and the repair-decision results. In FIG. 30, fuse-decision results FP0 to FP7 of the first fuse group PFG and fuse-decision results FQ1 to FQf of the second fuse group QFG are schematically shown. The fuses FP0, FP2, FP3, FP4, FP6, FP7 and FQ1, FQ4, FQ5, FQ6, FQ8, FQ9, FQb, FQd, FQe, and FQf which are marked with X are blown and logic "1".

Whether the address stored in the fuse groups PFG and QFG coincides with the inputted address or not is determined as follows. One of the addresses DA0 to DA7 selectively becomes logic "1". In a manner similar to the sort system shown in FIG. 1, since the fuses FP0, FP2, FP3, FP4, FP6, and FP7 in the first fuse group PFG are "1", when DA0, DA2, DA3, DA4, DA6, and DA7 become "1", decision intermediate results RP0, RP1, RP2, RP3, RP4, and RP5 in which the repairing addresses are stored become "1". That is, DA0, DA2, DA3, DA4, DA6, and DA7 are outputted to RP0, RP1, PR2, RP3, RP4, and RP5, respectively.

The decision intermediate results are associated with the repair-decision results RQ0 to RQf by the second fuse group QFG. First, RP0 as the first decision intermediate result, that is, DA0 is outputted as the first repair-decision result RQ0. Since FQ1 is "1", RP0 namely DA0 is outputted as RQ1 in a manner similar to RQ0. Since FQ2 is "0", RP1 which is subsequent to RP0 outputted as RQ1, namely, DA2 is outputted as RQ2. Similarly, RP2 namely DA3 is outputted as RQ3 to RQ6. RP3 namely DA4 is outputted as RQ7 to RQ9. RP4, namely, DA6 is outputted to RQa and RQb. RP5, namely, DA7 is outputted as RQc to RQf. By the operation, the repair-decision results with respect to the desired address can be obtained.

Figure 56:
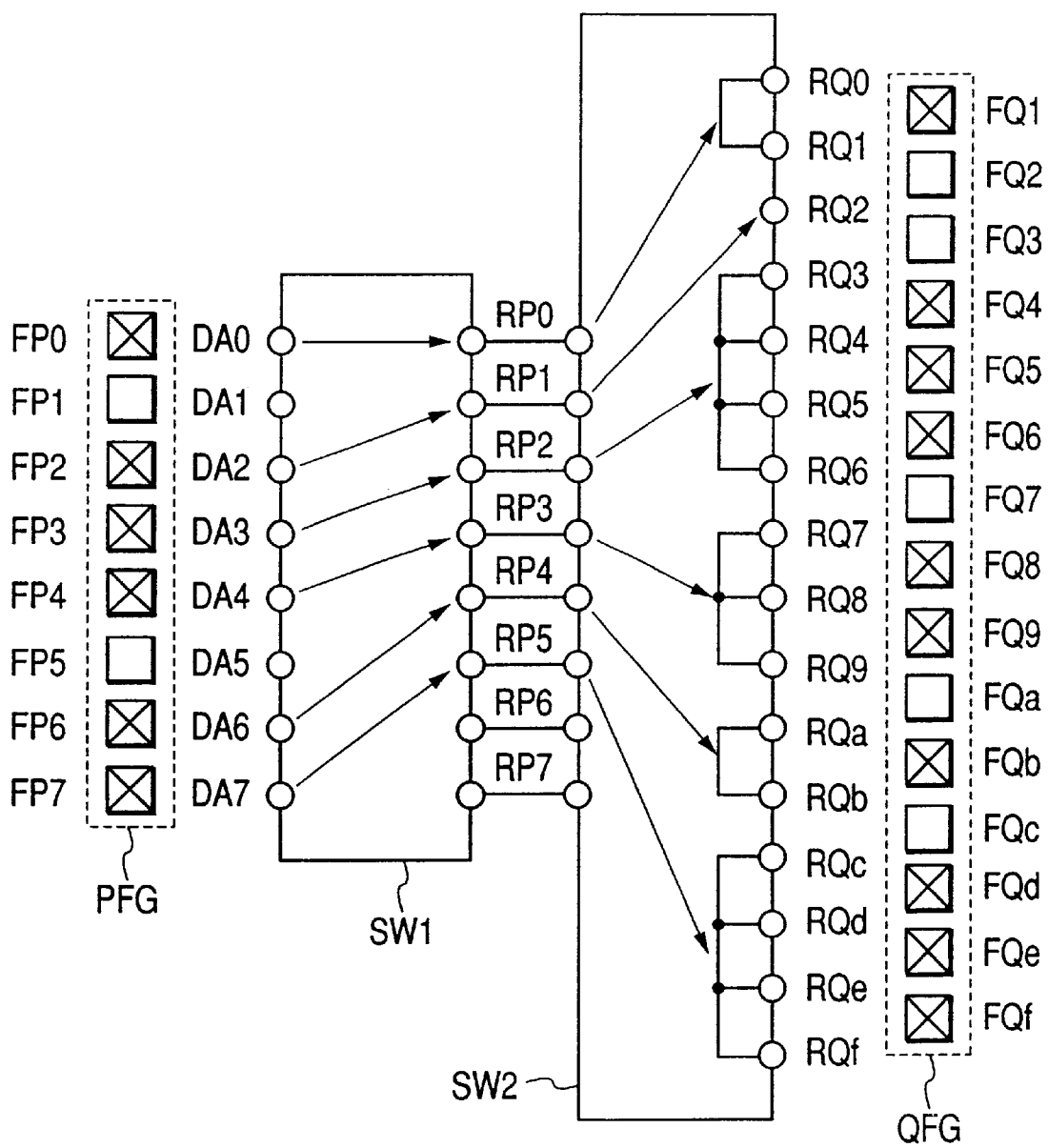
FIG. 56 is a diagram in which the sorted address programming system of FIG. 30 is realized by switch circuits.

FIG. 56 is a diagram showing the sort system of storing the repeated addresses in FIG. 30 as a switch circuit in a manner similar to FIG. 55. In the switch circuit SW1 in FIG. 55, maximum eight first logical connecting paths are formed between eight (ND) first input nodes and eight (NS) first output nodes. The first logical connecting path is determined by the program of corresponding fuses (storage elements) in the first fuse circuit PFG. Although total six first logical connecting paths are shown here as an example in association with the example of FIG. 30, since there is the possibility that all of the maximum eight paths are selected, the number of the first output nodes is set to eight. The first switch circuit is embodied in FIG. 32 which will be described hereinlater.

Outputs of the first output nodes are transmitted as they are to a second switch circuit. In the second switch circuit, maximum 16 second logical connecting paths are formed between eight (ND) first input nodes and 16 (NS) first output nodes. The second logical connecting path is determined by the programming of the fuses (storage elements) corresponding to a second fuse circuit QFG. It would be easier to think in such a manner that the fuses programmed in the second fuse circuit QFG represent the connection of neighboring nodes in the second output nodes. The connection of neighboring nodes denotes that the same address is repeated. In association with the example of FIG. 30, the results are divided into six groups; the first group of the results RQ0 and RQ1, the second group of RQ2, and the like. The second input nodes are sequentially connected to the six groups in accordance with the order from smaller values. That is, the association between the second input nodes and the groups is similar to that of the first switch circuit. The second switch is embodied in FIG. 33 which will be described hereinlater.

As described above, in the sort system, 16 combinations of the repairing addresses can be programmed from the eight addresses which may be repeated by using total 23 fuses consisting of 8 fuses and 15 fuses. In order to program such information, 128 fuses which is four times as many as those in FIG. 3 are necessary in the decode system. 64 fuses which is four times as many as those in FIG. 5 are required in the binary system. In the sort system shown in FIG. 1, the number which is four times as many as that in FIG. 1, namely, 32 is necessary so that four addresses have the same value. Consequently, the sort system of FIG. 1 has a higher effect on reduction in the number of fuses as compared with the decode system and the binary system. In the sort system which can program the repeated addresses shown in the embodiment, the number of fuses can be further reduced to 23. The reason why the number of fuses can be reduced as described above is that, in a manner similar to the system of FIG. 1, the repairing addresses are programmed not as permutation but combinations. The system of the embodiment is an extension of the sort system of FIG. 1 so as to allow the same address to correspond to a plurality of decision results.

The number of fuses to be blown to store 16 addresses is 16 in the sort system, which is equal to that in the case where four sets of the sort system of FIG. 1 are provided and that of the decode system but is smaller than that of the binary system. The number fuses blown is larger than the number of fuses which are not blown in the first fuse group PFG in FIG. 30. It is because the case of performing the maximum repair is shown. Generally, since the case of using all of repairing addresses is rare, it is more efficient to blow the fuses in the event of repair.

The number of necessary fuses will be generalized. Since the number NPF of fuses in the first fuse set PFG is $$NPF=ND \qquad (\text{EQ. 6})$$

and the number NQF of fuses in the second fuse set QFG is $$NQF=NS-1 \qquad (\text{EQ. 7})$$

the number of fuses in the sort system of the embodiment which is necessary to perform the repair decision by storing NS addresses which may be repeated from the ND addresses obtained by decoding NA bits is obtained as follows.

$$NPF+NQF=ND+NS-1=(2^{\wedge}NA)+NS-1 \qquad (\text{EQ. 8})$$

When (EQ. 8) is compared with (EQ. 2) in order to obtain the condition satisfying NPF+NQF<NBF such that the number of fuses of (EQ. 8) is smaller than the number NBF of fuses in the binary system, $$(2^{\wedge}NA)+NS-1<NS(NA+1)= \qquad (\text{EQ. 9})$$

that is, $$NS>((2^{\wedge}NA)-1)/NA \qquad (\text{EQ. 10})$$

the number of fuses of the sort system is smaller than that of the binary system.

Tenth Embodiment

An embodiment in which the sort system shown in FIG. 30 is applied to the programming of the mat selection signal of the column related flexible redundancy repair in an SDRAM will be described. The mat selection signals for determining a repair of a plurality of redundant column selection lines are stored in a lump. In this case, since a plurality of values which may be repeated are stored from the plurality of mat selection signals, the sort system shown in FIG. 30 is suitable. It is assumed that the constructions of the whole SDRAM shown in FIG. 7, the column address driver YD in FIG. 15, and the memory arrays MAR shown in FIGS. 16 to 18 are the same as those described with reference to FIGS. 7 to 19.

Figure 31:
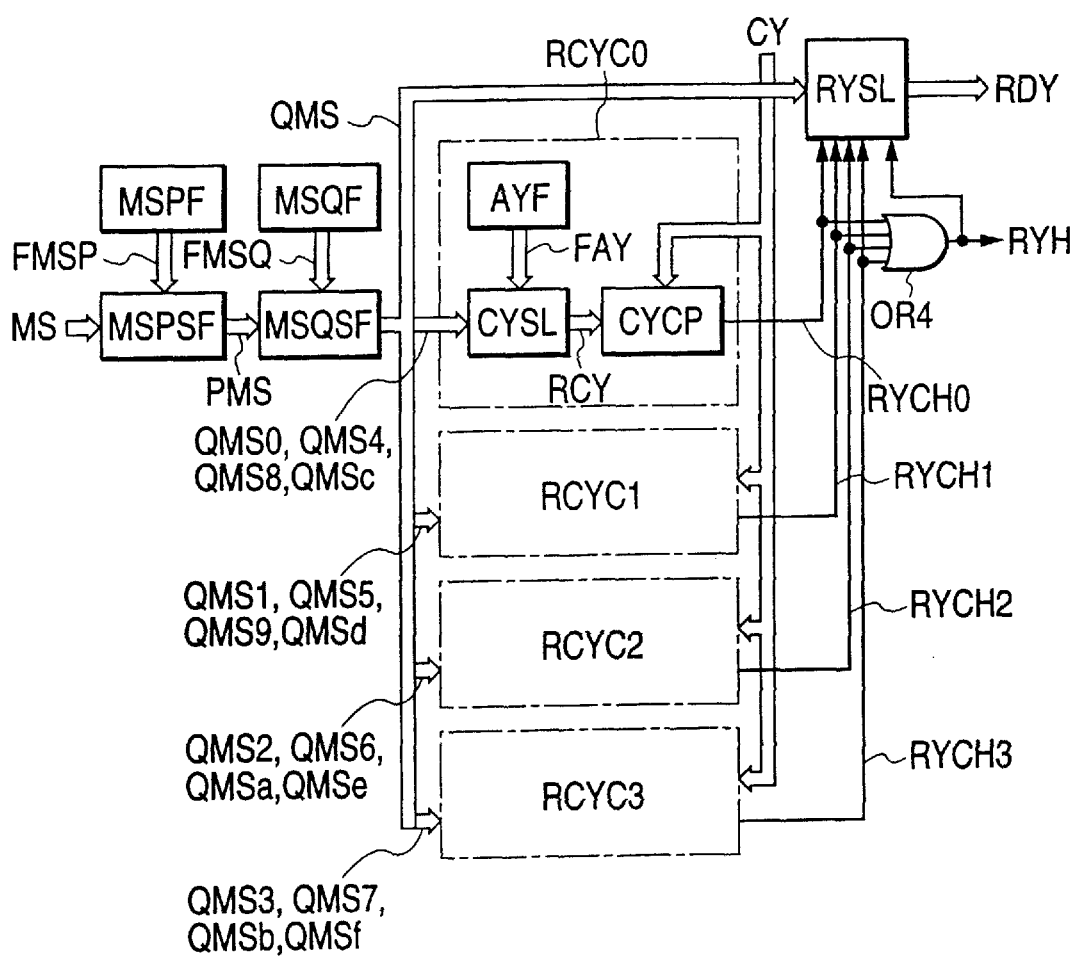
FIG. 31 is a diagram showing another example of the column related redundancy circuit.

FIG. 31 shows another example of the column related redundancy circuit and is used as the column related redundancy circuit YR in FIG. 7 in a manner similar to those shown in FIGS. 9 and 26. The repair decision circuit comprises, in addition to a first fuse circuit MSPF for storing the presence or absence of a repair of each mat and a first address shifter MSPSF controlled by the decision result of the first fuse circuit MSPF, a second fuse circuit MSQF for storing the correspondence between the repairing mat selection signal and the repairing column address, and a second address shifter MSQSF controlled by the decision result of the second fuse circuit MSQF. It can be regarded that the fuse circuits MSF and the address shifters MSSF which are provided for the four comparing circuits, respectively, in FIG. 9 are commonly used. By the components, the sort system shown in FIG. 30 is realized.

Four column address comparing circuits RCYC0 to RCYC3 output column address comparison results RYCH0 to RYCH3, respectively. A column related repair-decision result RYH is outputted by a four-input OR circuit OR4 and a repair-decision result RDY is outputted from a redundancy column address selection circuit RYSL. Total 16 outputs QMS of the address shifter MSQSF are sequentially supplied to the comparing circuits RCYC0 to RCYC3 so that each circuit receives four outputs. For example, QMS0, QMS4, QMS8, and QMSc are supplied to the circuit RCYC0. Each of the comparing circuits RCYC0 to RCYC3 comprises: the third fuse circuit AYF for storing the repairing column address in an encoded binary state; the address selection circuit CYSL for selecting a repairing column address by selecting the fuse-decision result FAY of the third fuse circuit AYF in accordance with the output QMS of the second address shifter MSQSF; and the address comparing circuit CYCP for comparing the repairing column address RCY with the predecoded column address CY. The circuits are constructed as shown in FIGS. 12 to 14. In this case, the output RDYi of the address comparing circuit CYCP in FIG. 14 corresponds to the comparison results RYCH0 to RYCH3 of the comparing circuits RCYC0 to RCYC3.

Figure 32:
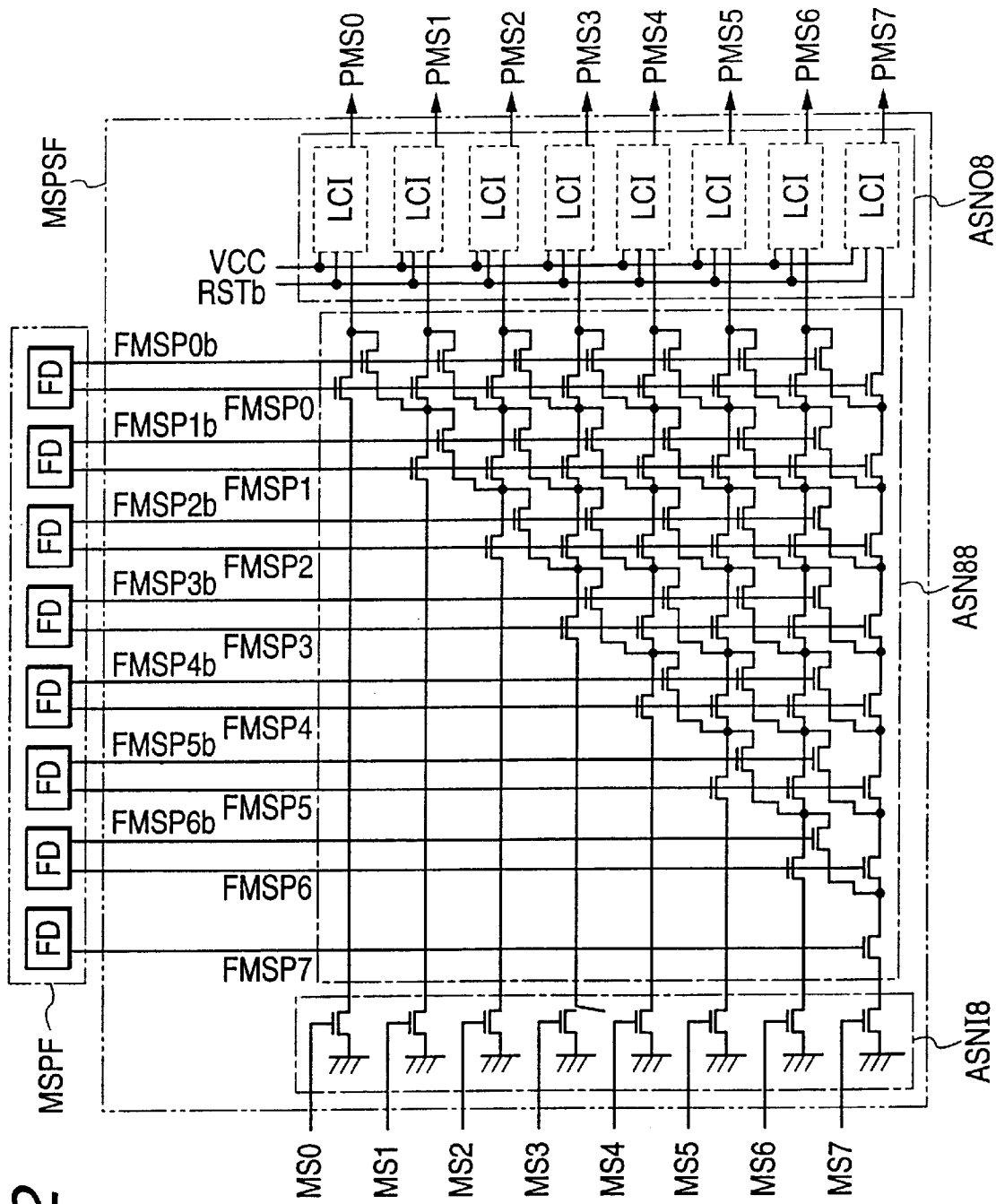
FIG. 32 is a diagram showing an example of an address shifter for comparing mat selection signals.

FIG. 32 shows an example of the first fuse circuit MSPF and the first address shifter MSPSF in FIG. 31. The first fuse circuit MSPF is made up of eight fuse decision circuits FD and outputs fuse-decision results FMSP0 to FMSP7 and their complementary signals FMSP0b to FMSP6b. The fuse decision circuit FD can be constructed, for instance, as shown in FIG. 11. The first address shifter MSPSF comprises: the input part ASNI8 to which the mat selection signals MS0 to MS7 are supplied; an output part ASNO8 for outputting intermediate decision results PMS0 to PMS7 of the repairing mat selection signals; and an 8-input 8-output pass transistor part ASN08 in which a desired signal path is formed between the input part ASNI8 and the output part ASN08. In the embodiment, since 16 repairing mat selection signals corresponding to four redundant column selection lines are stored in a lump, there is the possibility that all of the eight mat selection signals are outputted, so that eight output terminals are provided. In a manner similar to the address shifter MSSF shown in FIG. 10, the input part ASNI8 is made up of eight NMOS transistors whose sources are connected to the ground voltage VSS. The pass transistor part ASN84 is made up of 64 NMOS transistors whose gates are connected to the fuse-decision results FMS0b, FMS0, FMS1b, FMS1, . . . , FMS6b, FMS6, and FMS7. The output part ASNO8 is comprised of eight level-holding inverters LCI. Each of the inverters LCI is constructed as shown in FIG. 10. In a manner similar to the address shifter MSSF shown in FIG. 10, by setting the reset signal RSTb to the high level, the inverters LCI are made active. The mat selection signals MS0 to MS7 supplied to the input part ASNI8 are transmitted through the signal path formed in the pass transistor part ASN84 according to the fuse-decision results FMS0b, FMS0, FMS1b, FMS1, . . . , FMS6b, FMS6, and FMS7, and the intermediate decision results PMS0 to PMS7 are outputted from the output part ASNO8.

Figure 33:
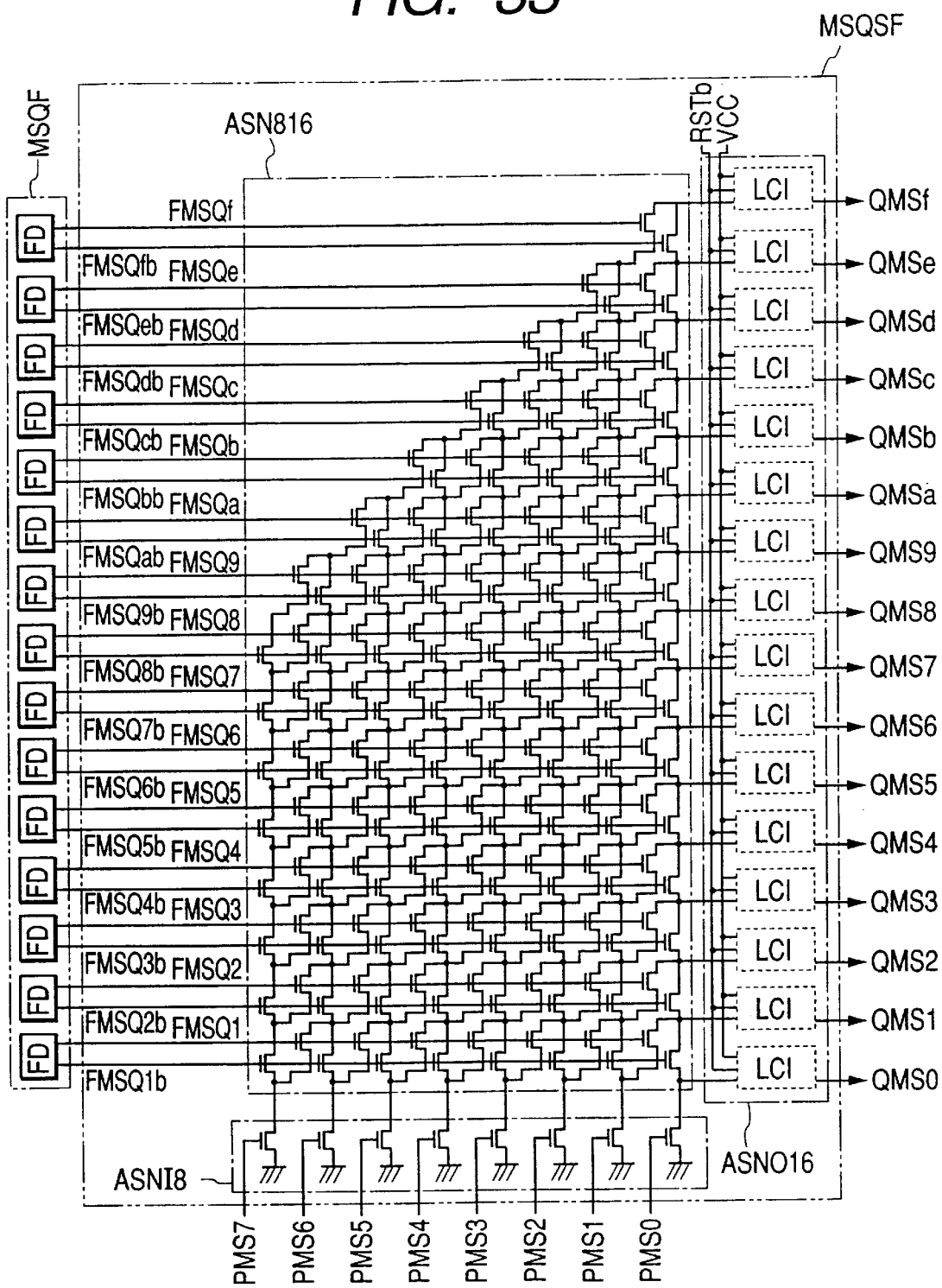
FIG. 33 is a diagram showing an example of an address shifter for selecting the mat selection signals.

FIG. 33 shows an example of the second fuse circuit MSQF and the second address shifter MSQSF in FIG. 31. The second fuse circuit MSQF is made up of 15 fuse decision circuits FD and outputs fuse-decision results FMSQ1 to FMSQf and their complementary signals FMSQ1b to FMSQfb. The fuse decision circuit FD can be constructed, for example, as shown FIG. 11. The second address shifter MSQSF comprises: the input part ASNI8 to which the intermediate decision results PMS0 to PMS7 of the repairing mat selection signals are supplied; an output part ASNO16 for outputting the decision results QMS0 to QMSf of the repairing mat selection signals; and an 8-input 16-output pass transistor part ASN816 in which a desired signal path is formed between the input part ASNI8 and the output part ASNO16. The input part ASNI8 is made up of eight NMOS transistors whose sources are connected to the ground voltage VSS in a manner similar to FIGS. 10, 32, and the like. The pass transistor part ASN816 is made up of 176 NMOS transistors whose gates are connected to the fuse-decision results FMSQ1b, FMSQ1, FMSQ2b, FMSQ2, . . . , FMSQfb, and FMSQf. The circuit is different from the address shifters for determining the presence or absence of the repair with respect to each mat which have been described above but is an address shifter for associating the repairing mat selection signal with the repairing column address. Consequently, the number of outputs is larger than the number of inputs. The connection arrangement in the pass transistor part ASN816 is largely different from that in the part ASN84 shown in FIG. 10 and that in the part ASN88 in FIG. 32. The output part ASNO16 is made up of eight level-holding inverters LCI and each of the level-holding inverters LCI is constructed as shown in FIG. 10. In a manner similar to the address shifter MSPSF in FIG. 32, by setting the reset signal RSTb to the high level, the inverters LCI are made active, the intermediate decision results PMS0 to PMS7 supplied to the input part ASNI8 are transmitted via the signal path formed in the pass transistor part ASN816 in accordance with the fuse-decision results FMSQ1b, FMSQ1, FMSQ2b, FMSQ2, . . . , FMSQfb, and FMSQf and the decision results QMS0 to QMSf are outputted from the output part ASNO16. In this circuit as well, by using the NMOS pass transistors, the complicated logic is realized with a small number of elements.

Figure 34:
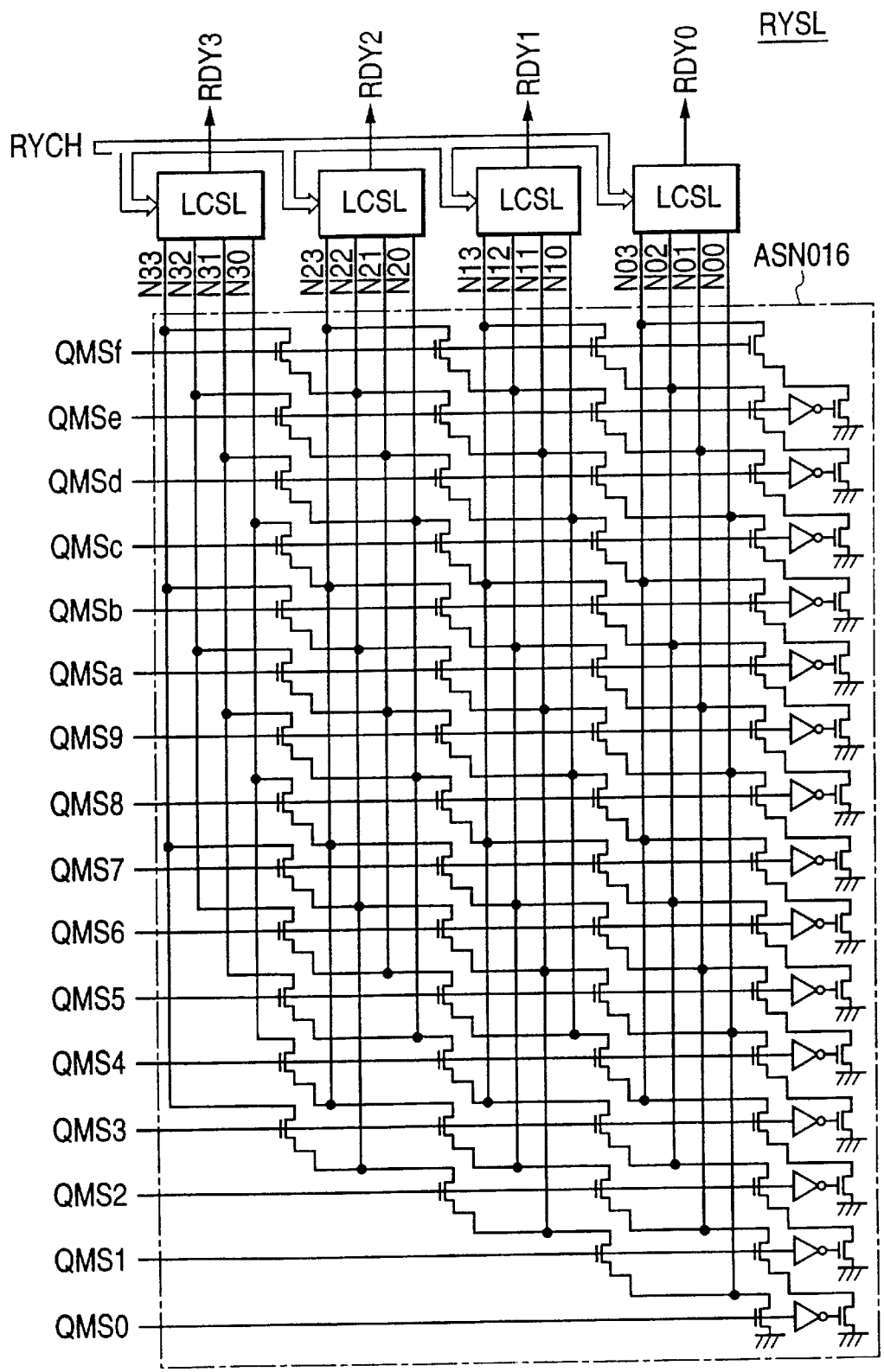
FIG. 34 is a diagram showing an example of a redundancy address selecting circuit.

FIG. 34 shows an example of the redundant column address selection circuit RYSL in FIG. 31, which is made up of the pass transistor part ASNO16 and four selectors LCSL. The pass transistor part ASNO16 comprises: 58 NMOS transistors having the gates to which the decision results QMS0 to QMSf outputted from the address shifter MSQSF are connected; 15 CMOS inverters to which the results QMS0 to QMSe are supplied; and 15 NMOS transistors having the gates to which outputs of the CMOS inverters are connected. By the elements, a current path is formed between desired output terminals N00 to N03, N10 to N13, N20 to N23, or N30 to N33 and the ground voltage VSS. When four outputs are supplied to the respective selectors LCSL, according to the outputs, the outputs RYCH0 to RYCH3 of the column address comparing circuits RCYC0 to RCYC3 are selectively outputted to the repair-decision results RDY0 to RDY3. Two or more current paths are not formed from the four outputs.

Figure 35:
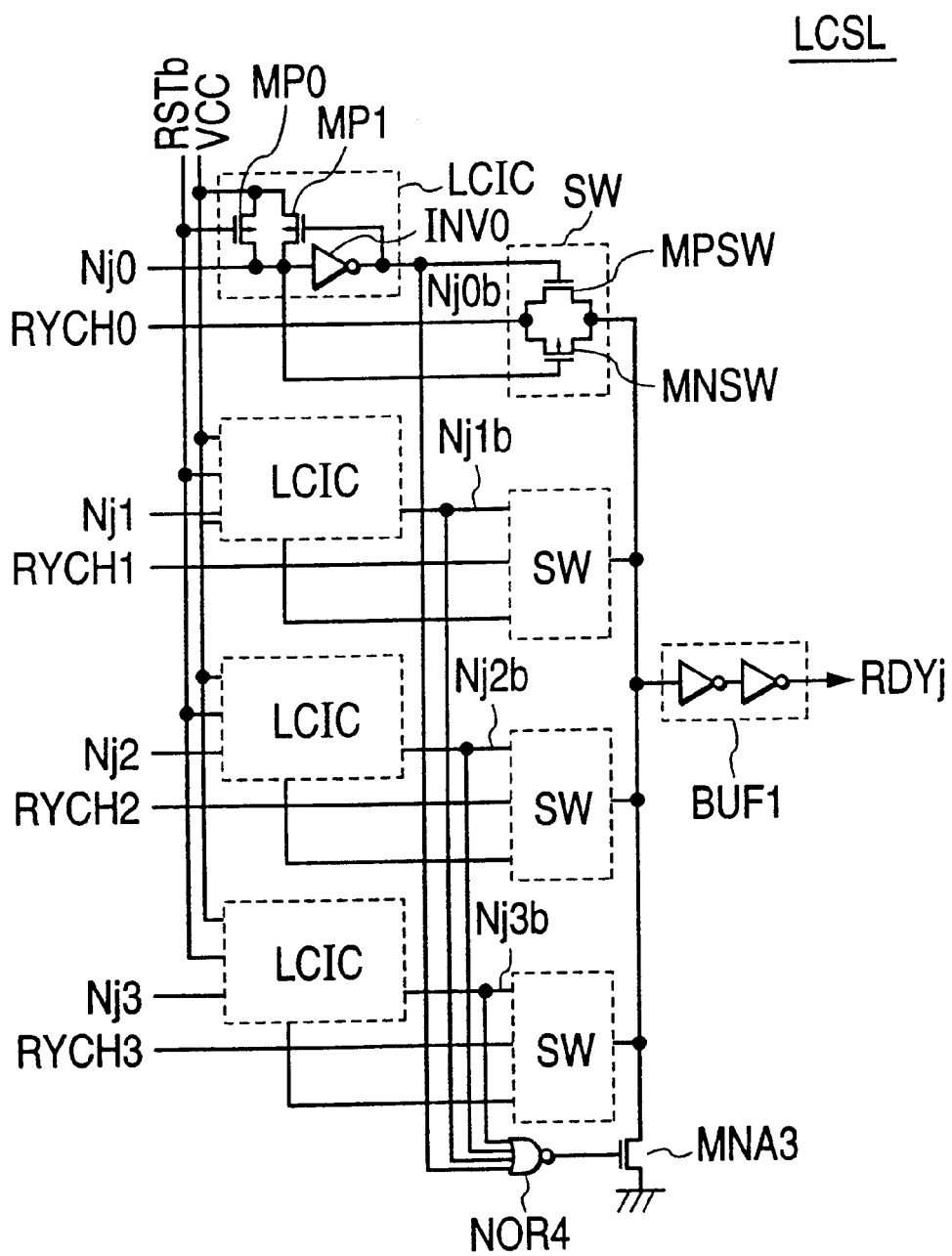
FIG. 35 is a diagram showing an example of a selector of the redundancy address selecting circuit.

FIG. 35 shows an example of the selector LCSL in FIG. 34. The selector LCSL comprises four level-holding inverters LCIC, four switches SW, a 4-input NOR gate NOR4, an NMOS transistor MNA3, and a buffer circuit BUF1. The level-holding inverter LCIC has the same construction as that of the level holding inverter shown in FIG. 10. By setting the reset signal RSTb to the high level, the selector LCSL is made active. A current path is formed, for example, between an input Nj0 (j=0, 1, 2, 3) and the ground voltage VSS in the pass transistor part ASNO16 in FIG. 34, thereby making the input Nj0 low and an output Nj0b high. When no current path is formed, the input Nj0 is kept high by the feedback PMOS transistor MP1 and a low-level signal is continued to be supplied to the output Nj0b. By outputting the input Nj0 as it is, the complementary outputs Nj0 and Nj0b are obtained. By the outputs, the NMOS transistor MNSW and the PMOS transistor MPSW in the switch are controlled. When the input to the level-holding inverter LCIC is at the low level, the switch SW is turned on. When the input is at the high level, the switch SW is turned off. Consequently, the inputs RYCH0 to RYCH3 are selected and supplied to the buffer circuit BUF1 and outputted as the repair-decision result RDYj. When all of the inputs Nj0 to Nj3 from the pass transistor part ASNO16 are at the high level, the repair-decision result RDYj is set to the low level by the 4-input NOR gate NOR4 and the NMOS transistor MNA3.

As described above, the area of the redundant address selection circuit in FIG. 34 is reduced by using the NMOS pass transistors and the selectors of the CMOS circuits are used, thereby reducing a delay time from the start of the column related operation until the repair is determined.

Figure 36:
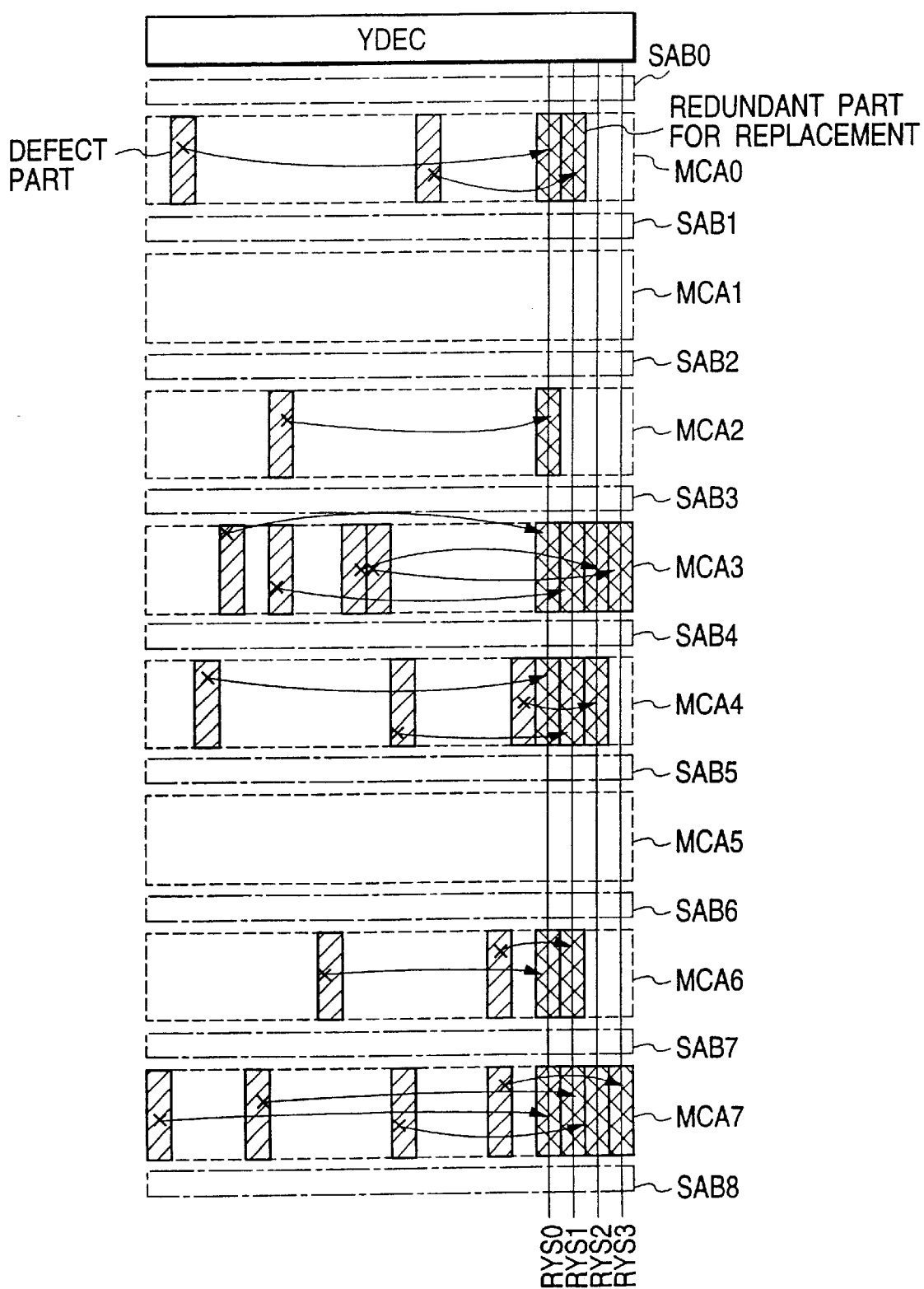
FIG. 36 is a diagram showing a replacement example of the column selection lines.

FIG. 36 shows a replacement example in the embodiment. The diagonally shaded areas are replaced with the grid-patterned areas. In this case, the fuse-decision results FMSP0 to FMSP7 of the first fuse circuit MSPF illustrated in FIG. 31 are as shown in FIG. 53A and the outputs PMS0 to PMS7 of the address shifter MSPSF are as shown in FIG. 53B.

The fuse-decision results FMSQ1 to FMSQf of the second fuse circuit MSQF are as shown in FIG. 53A and the outputs QMS0 to QMSf of the address shifter MSQSF are as shown in FIG. 53D.

Since the maximum number of column selection lines which can be replaced in each mat is four, the number of "1" which is continuous in FIG. 53C is three or less. In this case, the repair-decision results RDY0 to RDY3 of the redundant column address selection circuit RYSL are values which are presented by the logical expressions in FIG. 53E. In FIG. 53E, the sign "+" shows the OR and the sign "X" indicates the AND.

That is, the repairing addresses are allocated in accordance with the order of RDY0, RDY1, RDY2, and RDY3 in each mat.

As in the replacement example, maximum four defect parts in each mat, or 16 defect parts in total can be replaced. By applying the sort system shown in FIG. 30 to the programming of the repairing mat selection signals, the replacement is realized with a small number of fuses and a small number of fuses to be blown.

Eleventh Embodiment

Figure 37:
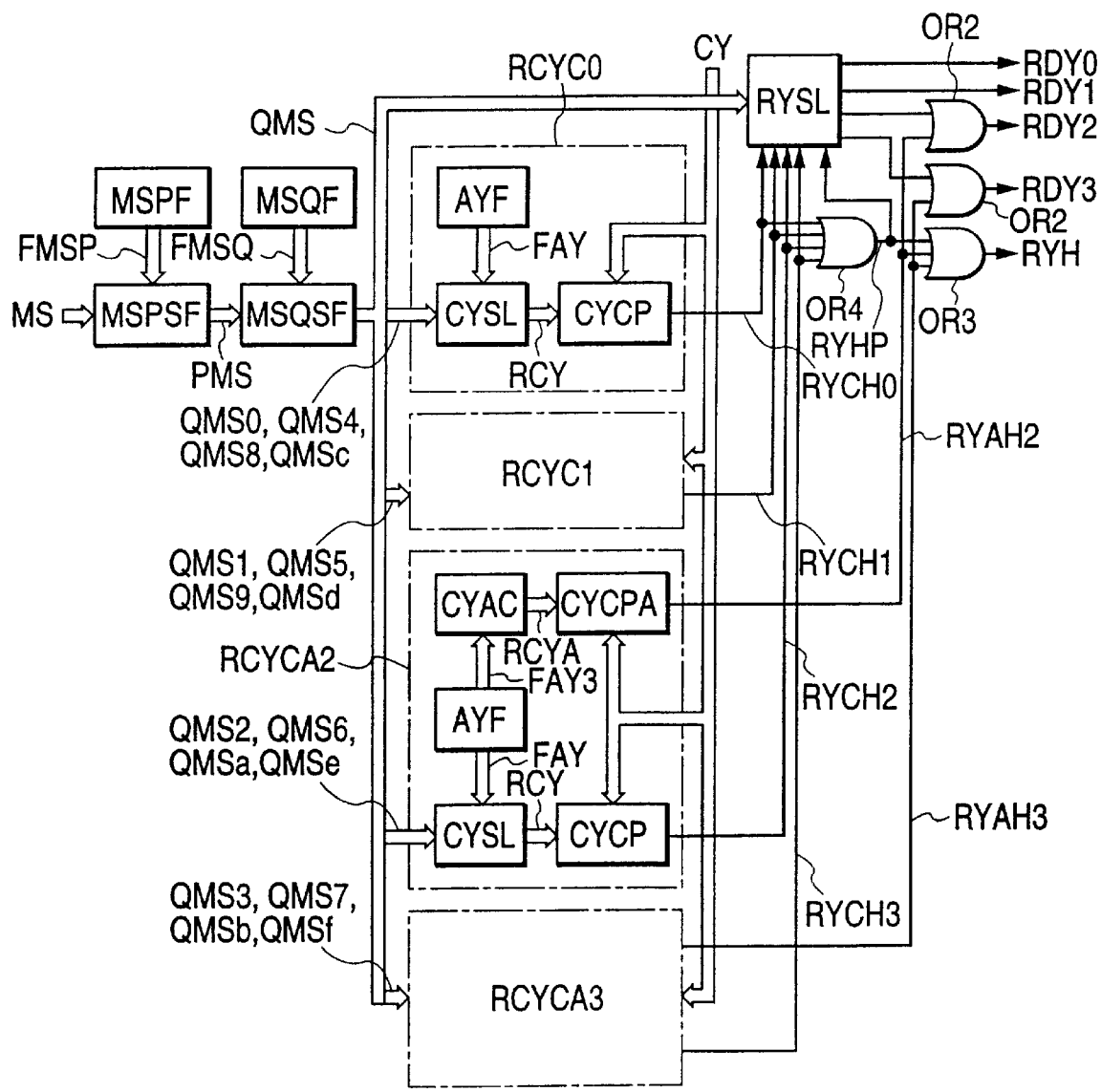
FIG. 37 is a diagram showing another example of the column related redundancy circuit.

FIG. 37 shows another example of the column related repair decision circuit. In a manner similar to the repair decision circuit of FIG. 31, the sort system shown in FIG. 30 is used to store the repairing mat selection signal, thereby realizing the function of replacing the column selection line irrespective of the mat selection signal. Specifically, the system of introducing an FMSA option for replacing the whole column selection line in FIG. 10 into the system of FIG. 30 is shown.

The different point of FIG. 37 from FIG. 31 is that means for comparing the column addresses provided for each of two column address comparing circuits RCYCA2 and RCYCA3 in four column address comparing circuits. A repairing column address activating circuit CYAC for making the repairing column address active irrespective of the output QMS of the second address shifter MSQSF and an address comparing circuit CYCPA for comparing the output RCYA with the predecoded column address are added to each of the column address comparing circuits RCYCA2 and RCYCA3. More specifically, the column address comparing circuits RCYCA2 and RCYCA3 each having two address comparing circuits CYCP and CYCPA output comparison results RYCH2 and RYAH2, and RYCH3 and RYAH3, respectively. The ORs of the comparison results RYCH0 to RYCH3 are obtained by the 4-input OR circuit OR4. The output RYHP of the circuit OR4 and the comparison results RYCH0 to RYCH3 are supplied to the redundant column address selection circuit RYSL. The redundant column address selection circuit RYSL is constructed as shown in FIG. 34 and outputs repair-decision results RDY0 and RDY1. The ORs of the outputs of the redundant column address selection circuit RYSL and the comparison results RYAH2 and RYAH3 are obtained and outputted by 2-input OR circuits OR2, respectively. The OR of the outputs RYHP of the 4-input OR circuit OR4 and the comparison results RYAH2 and RYAH3 is obtained by a 3-input OR circuit OR3 and the column related repair-decision,result RYH is outputted.

Figure 38:
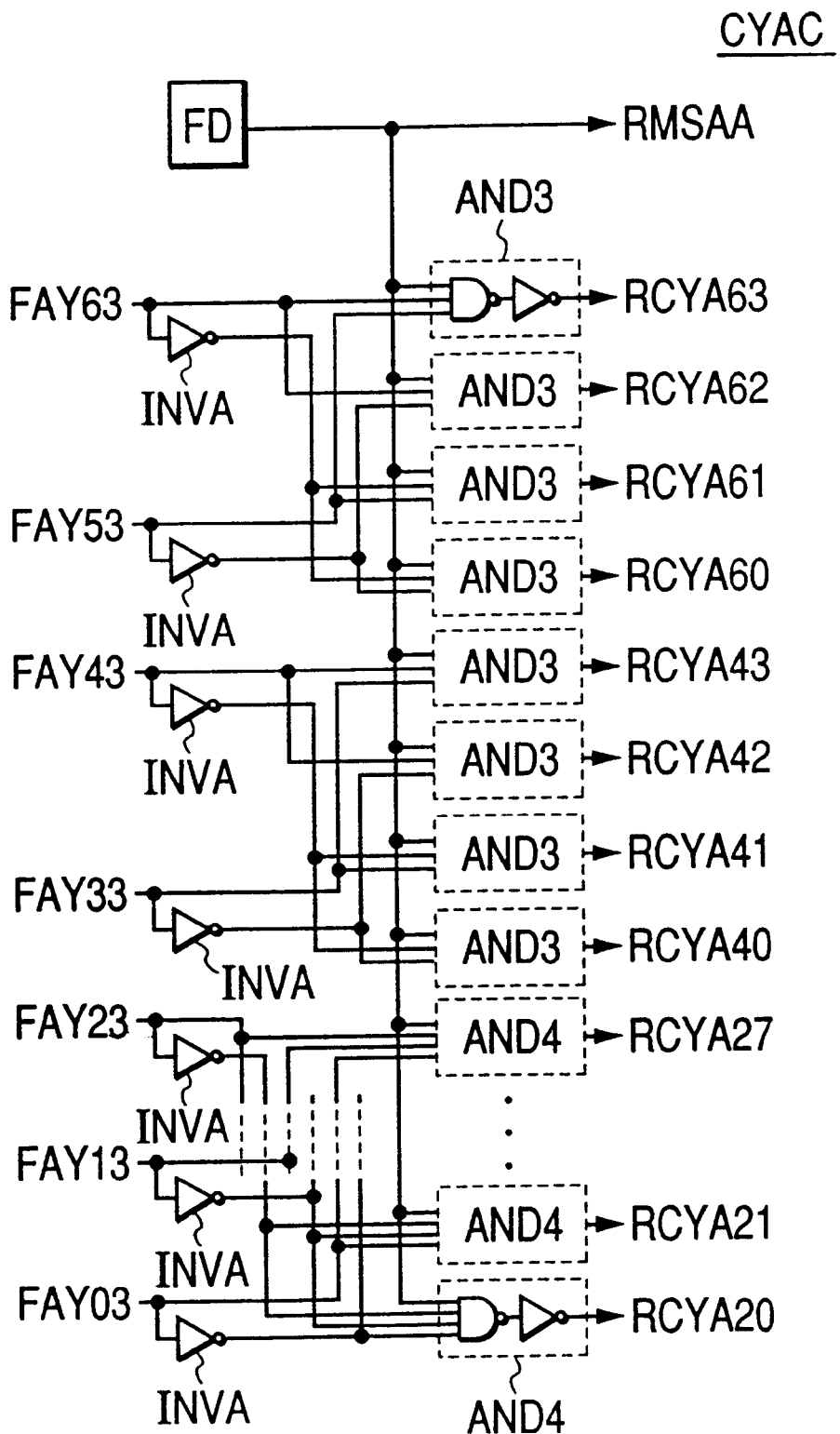
FIG. 38 is a diagram showing an example of a repairing column address activating circuit.

FIG. 38 shows an example of the address activating circuit CYAC which comprises seven CMOS inverters INVA, a fuse decision circuit FD, eight 4-input AND circuit AND4, and eight 3-input AND circuits AND3. Specifically, in place of the seven logic circuits AOR4 and the 4-input OR circuit ORMS in the address selection circuit CYSL shown in FIG. 13, the CMOS inverters INVA and the fuse decision circuit FD are provided, respectively. The fuse decision circuit FD is constructed, for example, as shown in FIG. 11. When an output RMSAA of the fuse decision circuit FD goes high, the repairing column address corresponding to the predecoded column address CY is outputted. FAY03 to FAY63 as a part of the decision result of the fuse circuit AYF in FIG. 37 are received by the CMOS inverters INVA. The ANDs of the repairing column address and FAY03 to FAY63 as the complementary binary repairing column addresses are obtained by the AND circuits AND4 and AND3, thereby deriving repairing column addresses RCYA20 to RCYA27, RCYA40 to RCYA43, and RCYA60 to RCYA63 corresponding to the predecoded column address CY in FIG. 37. The repairing column addresses are compared with the predecoded column address CY by the address comparing circuit CYCPA in FIG. 37.

Figure 39:
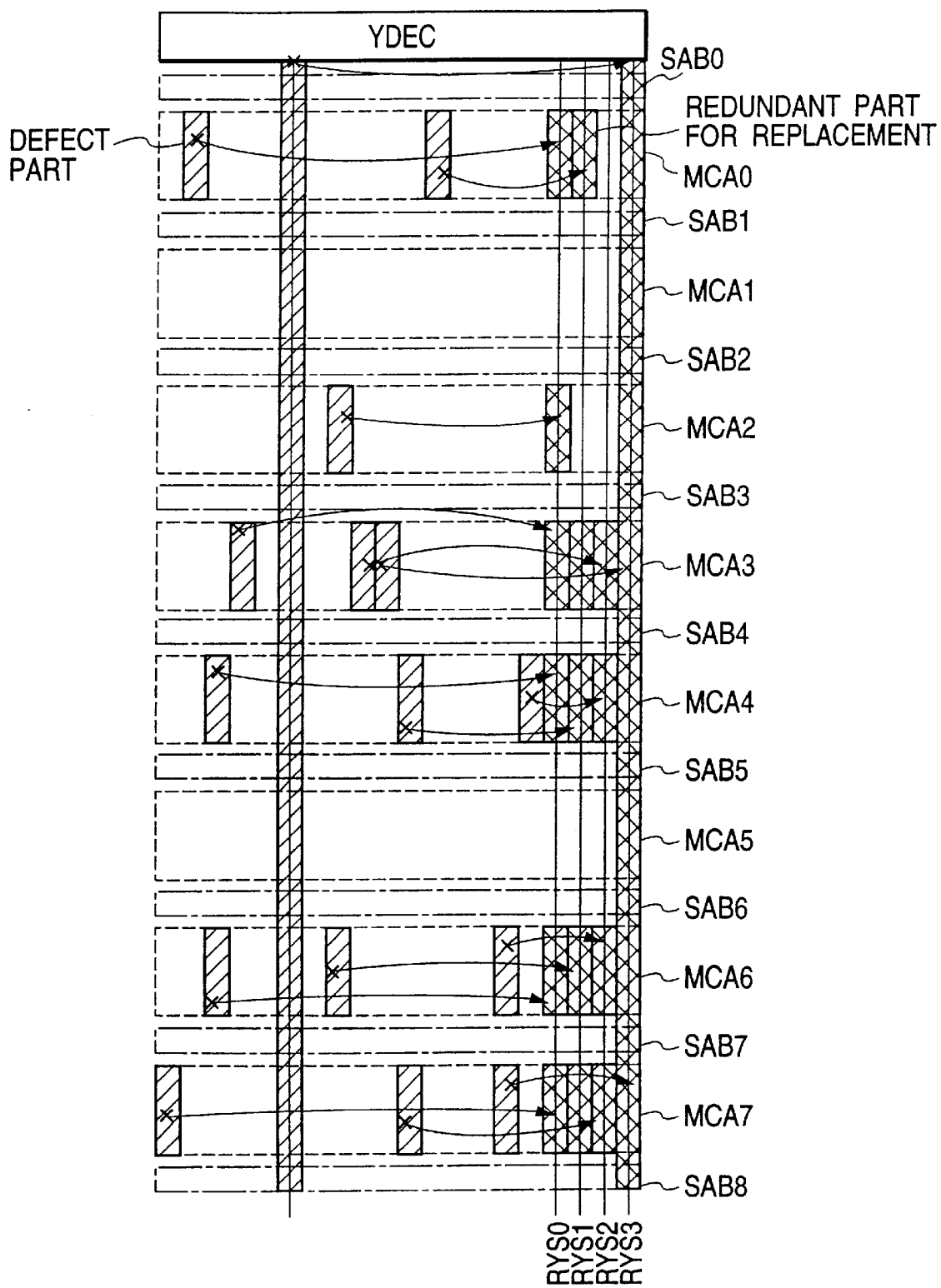
FIG. 39 is a diagram showing a substitution example of column selection lines.

FIG. 39 shows a replacement example in the embodiment in which the diagonally shaded areas are replaced by the grid-patterned areas. In the example, the column selection line is replaced by the redundant column selection line RYS3 irrespective of the mat selection signal. The mats in each of which the column selection line replacement is performed are six mats MCA0, MCA2, MCA3, MCA4, MCA6, and MCA7 in a manner similar to FIG. 36. Fuse-decision results FMSP0 to FMSP7 of the fuse circuit MSPF shown in FIG. 37 are as shown in FIG. 53A, and outputs PMS0 to PMS7 of the address shifter MSPSF are as shown in FIG. 53B. Fuse-decision results FMSQ1 to FMSQf of the fuse circuit MSQF are as shown in FIG. 54A, and outputs QMS0 to QMSf of the address shifter MSQSF are as shown in FIG. 54B. Since the number of defects replaced in the respective mats is 15, the decision result QMSf of the repairing mat selection signal is always 0. The fuse set of the repairing column addresses selected by QMSf is sent to the address comparing circuit CYCPA in the column address comparing circuit RCYCA3 and used to compare the column address to be replaced irrespective of the mat selection signal.

In this case, the repair-decision results RDY0 to RDY3 of the redundant column address selection circuit RYSL become values shown by the logical expressions of FIG. 54C. In FIG. 54C, the sign "+" denotes the OR and the sign "X" indicates the AND.

Since the repair-decision result RDY3 corresponds to the redundant column selection line RYS3 to be substituted for the column selection line irrespective of the mat selection signal, the result RDY3 becomes an output RYAH3 of the address comparing circuit CYCPA in the column address comparing circuit RCYCA3.

Like the replacement example, this embodiment can replace maximum four lines in each mat and total 16 defects including up to two replacements irrespective of the mat selection signal. That is, even when the replacement irrespective of the mat selection signal is performed, the number of defects which can be replaced in total does not decrease since the correspondence between the fuse set of the repairing column addresses and the redundant column selection line is determined by using the redundant column address selection circuit RYSL. The system has a high degree of freedom and enables efficient repair to be performed. By applying the sort system to the programming of the repairing mat selection signal, such high-efficiency defect repair is realized with a small number of fuses and a small number of fuses to be blown.

Twelfth Embodiment

An embodiment in which the sort system of the invention is applied to row-related any-to-any repair of the SDRAM will now be described. The any-to-any repair relates to a system of replacing word lines in different mats like a replacement example which will be described hereinlater. The whole SDRAM is constructed as shown in FIG. 7 and operates as shown in FIG. 8.

Figure 40:
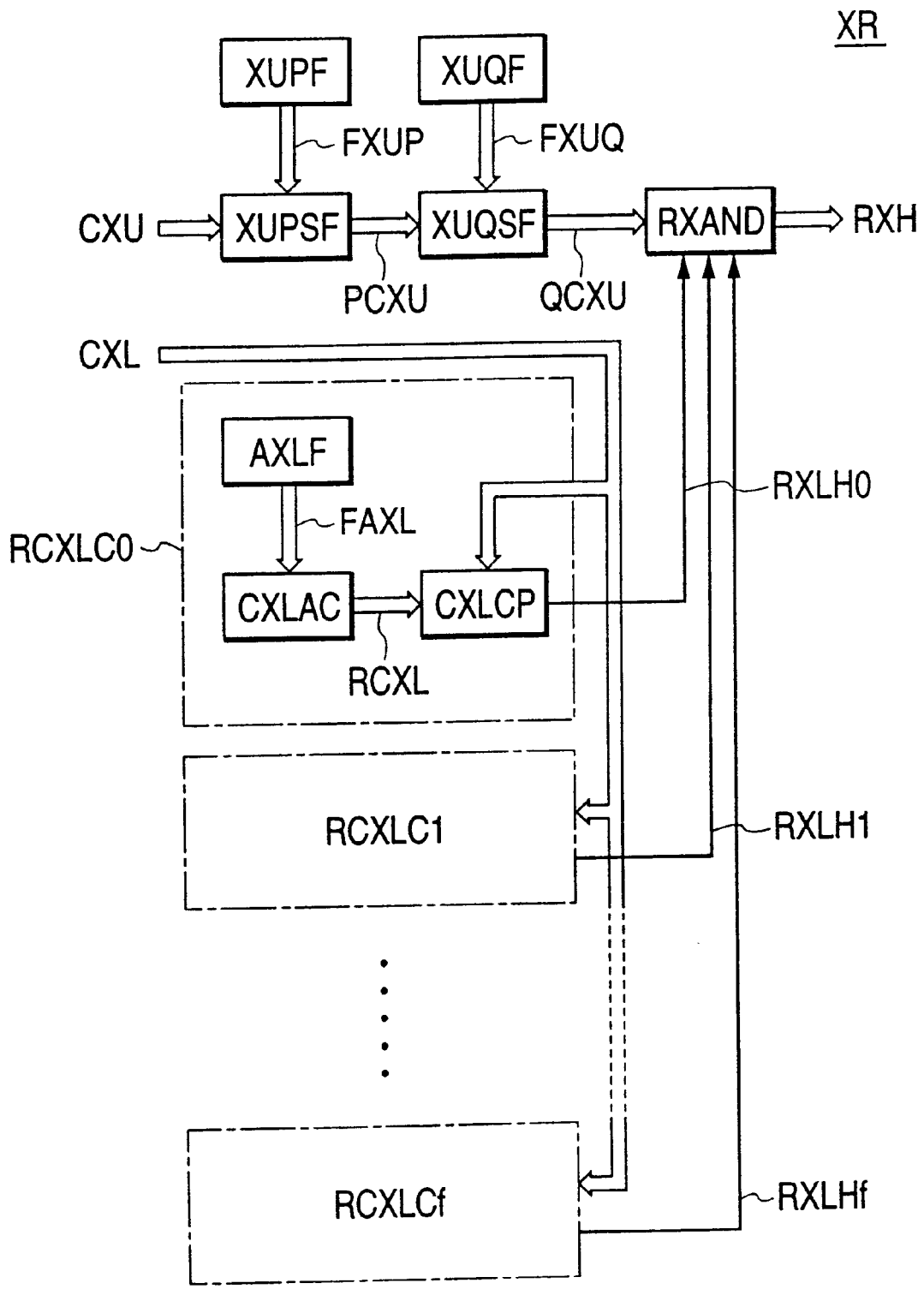
FIG. 40 is a diagram showing an example of a row related redundancy circuit.

FIG. 40 shows an example of the row-related redundancy circuit XR, characterized in that repair decision of a row address of higher bits is performed by using the sort system described with reference to FIG. 30. The circuit XR comprises: a first fuse circuit XUPF for programming the presence or absence of a repair of each higher-bit row address; a first address shifter XUPSF controlled by a decision result FXUP of the first fuse circuit XUPF; a second fuse circuit XUQF for storing the correspondence between the repairing row address PCXU of higher bits and the repairing row address of lower bits; and a second address shifter XUQSF controlled by a decision result FXUQ of the second fuse circuit XUQF. The elements are constructed in a manner similar to MSPF, MSPSF, MSQF, and MSQSF in FIG. 37, respectively, and perform similar operations. That is, the row address of higher bits is the same as the address for selecting the memory mat, which has been described in relation to the column related repair decision circuit.

On the other hand, the binary system is employed for the row address of lower bits. Lower-bit row address comparing circuits RCXLC0 to RCXLCf are provided in correspondence with the redundant word lines. Each of the circuits comprises a fuse circuit AXLF for storing the repairing row address of lower bits in an encoded binary state, a lower-bit repairing row address activating circuit CXLAC for associating the decision result FAXL of the fuse circuit AXLF with a predecoded lower-bit row address CXL, and an address comparing circuit CXLCP for comparing the repairing row address RCXL of lower bits with the predecoded row address CXL of lower bits. The lower-bit row address comparing circuits RCXLC0 to RCXLCf output the comparison results RXLH0 to RXLHf, respectively. Further, a row-related repair decision settling circuit RXAND is provided.

Figure 41:
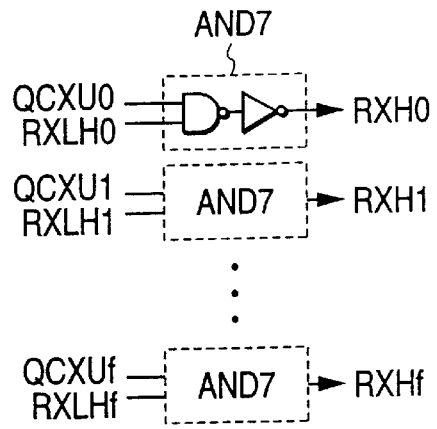
FIG. 41 is a diagram showing an example of a repair decision settling circuit.

FIG. 41 shows an example of the row-related repair decision settling circuit RXAND which is made up of sixteen 2-input AND circuits AND7, for obtaining the ANDs of the decision results QCXU0 to QCXUf of the repairing row addresses of higher bits and decision results RXLH0 to RXLHf of the repairing row addresses of lower bits and outputting the row-related repair-decision results RXH0 to RXHf.

In order to explain the role of the row-related redundancy circuit XR shown in FIG. 40, the circuit blocks in FIG. 7 related to the row-related operation will be described specifically hereinbelow. A case where each of the eight mats has 256 word lines and two redundant word lines is shown here. It will be obviously understood that the invention is effective also in the case where the other number of word lines is employed.

Figure 42:
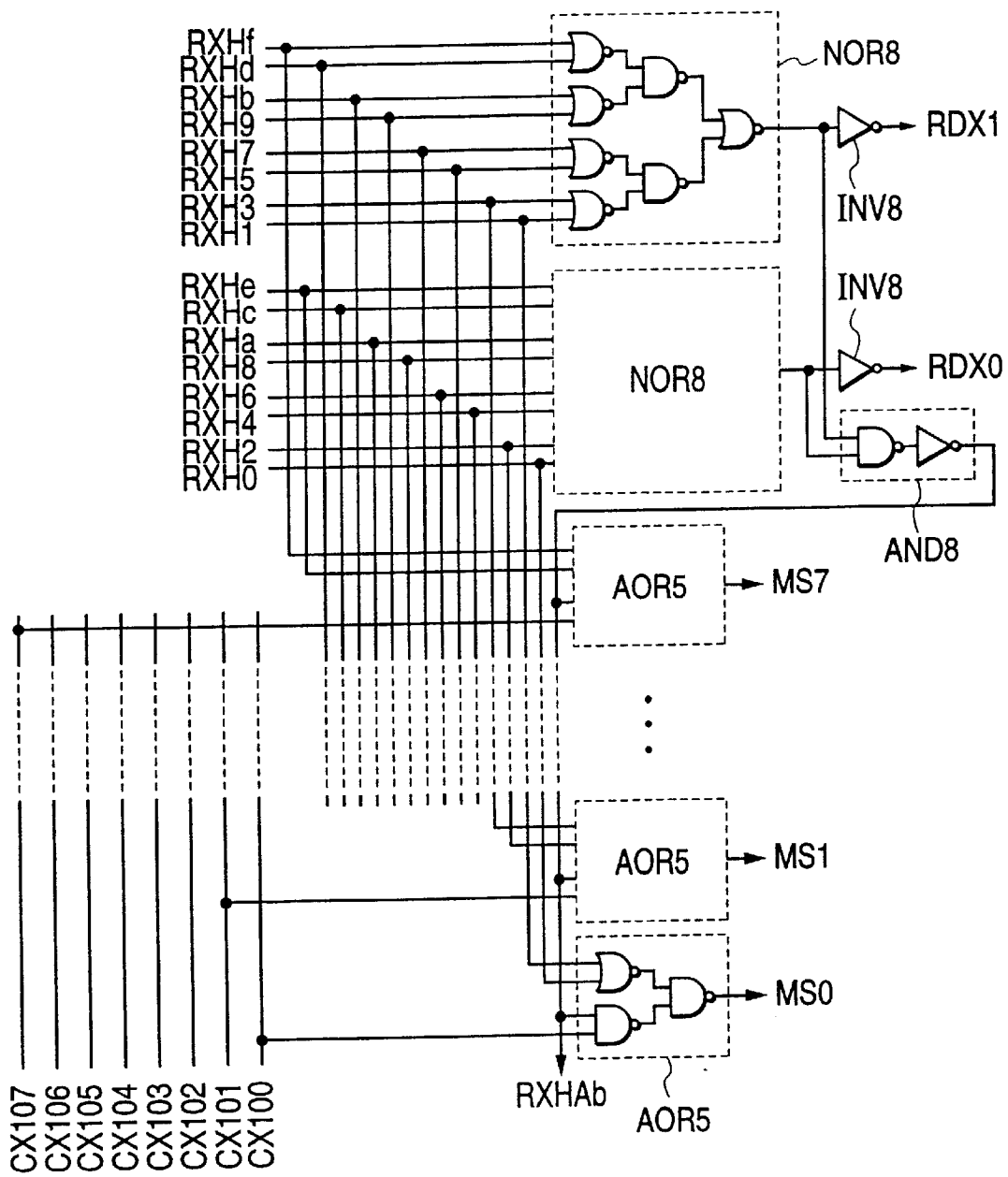
FIG. 42 is a diagram showing an example of a row address driver.
Figure 43:
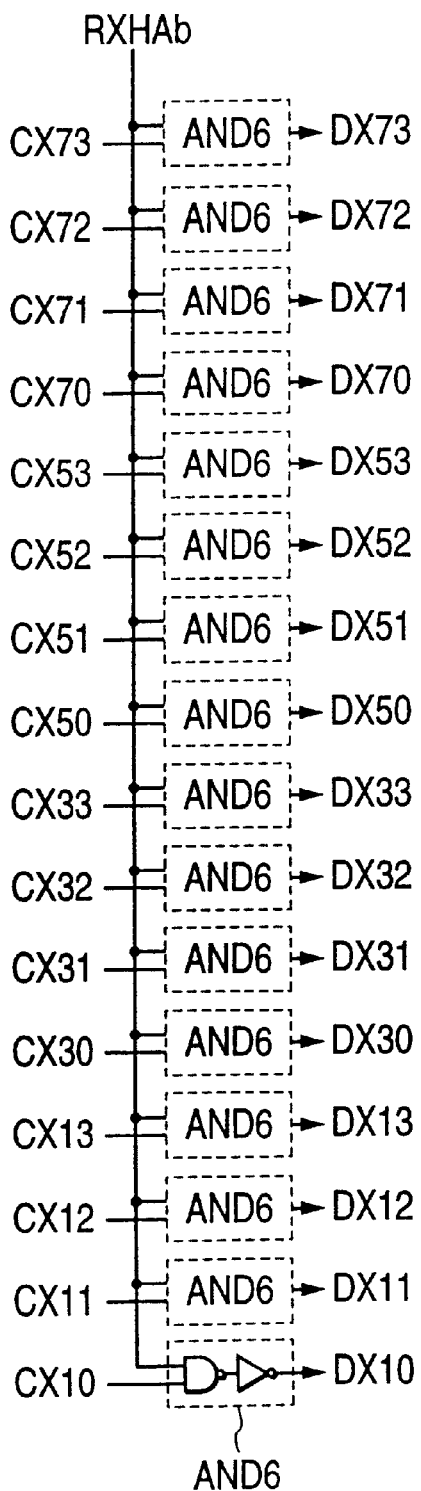
FIG. 43 is a diagram continued from FIG. 42.

FIGS. 42 and 43 illustrate an example of the row address driver XD in FIG. 7. The row address driver of the embodiment comprises two 8-input NOR circuits NOR8, two CMOS inverters INV8, a 2-input AND circuit AND8, eight logic circuits AOR5, and sixteen 2-input AND circuit AND6. The mat selection signals MS0 to MS7 are supplied to the column related redundancy circuit YR and the row decoder XDEC in the memory array MAR, and row address signals DX10 to DX13, DX30 to DX33, DX50 to DX53, and DX70 to DX73 and redundant row address signals RDX0 and RDX1 are supplied to the row decoder XDEC.

In FIG. 42, the 8-input NOR circuit NOR8 comprises five 2-input NOR gates and two 2-input NAND gates. Eight even-numbered or odd-numbered results of the 16 row-related repair-decision results RXH0 to RXHf of the row related redundancy circuit XR are supplied to the 8-input NOR circuit NOR8. Outputs of the 8-input NOR circuits NOR8 are transmitted to the inverters INV8 and the redundant row address signals RDX0 and RDX1 each of which is the OR of the eight repair-decision results are obtained. The AND of outputs of the two 8-input NOR circuits NOR8 is obtained by the 2-input AND circuit AND8 having a 2-input NAND gate and an inverter, thereby obtaining RXHAb which goes low when the row-related repair is performed. The logic circuit AOR5 is comprised of an NOR gate and two 2-input NAND gates, generates the mat selection signals MS0 to MS7 for CX100 to CX107 obtained by predecoding three bits of the row address when RXHAb is at the high level and from the OR of two of the repair-decision results RXH0 to RXHf when RXHAb is at the low level.

In FIG. 43, the AND circuits AND6 each comprising a 2-input NAND gate and an inverter calculate the ANDs of RXHAb with the predecoded row addresses CX10 to CX13, CX30 to CX33, CX50 to CX53, and CX70 to CX73 each obtained by predecoding two bits of the 8-bit binary row address and output the ANDs as row address signals DX10 to DX13, DX30 to DX33, DX50 to DX53, and DX70 to DX73. By using the circuit, the replacement to a word line in a different mat and a control for stopping the operation of a normal word line in the event of replacement are carried out.

Figure 44:
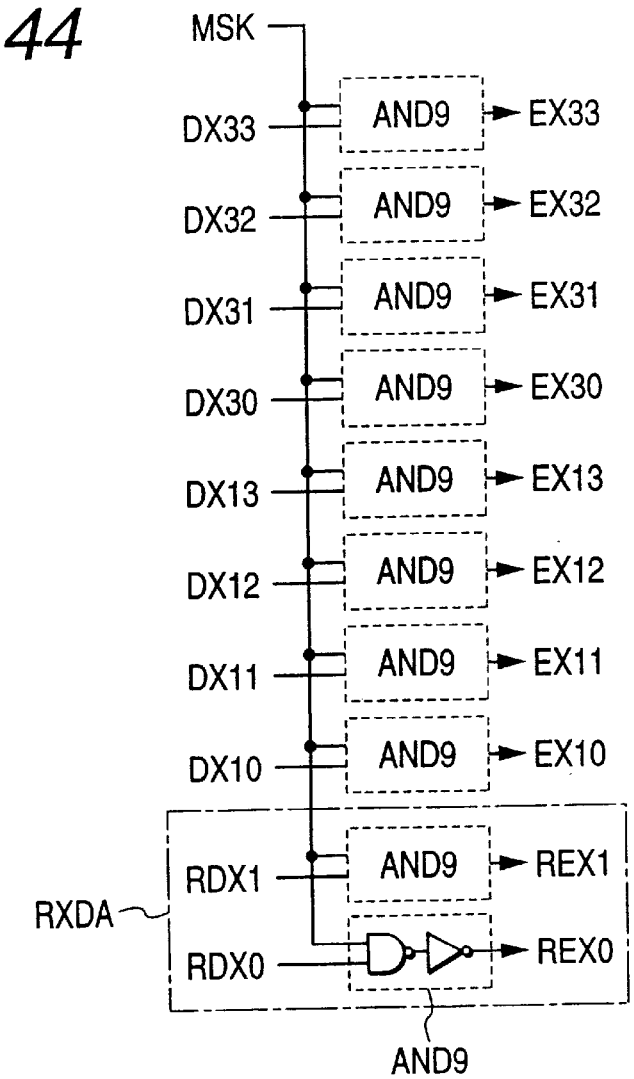
FIG. 44 is a diagram showing an example of a row decoder.
Figure 45:
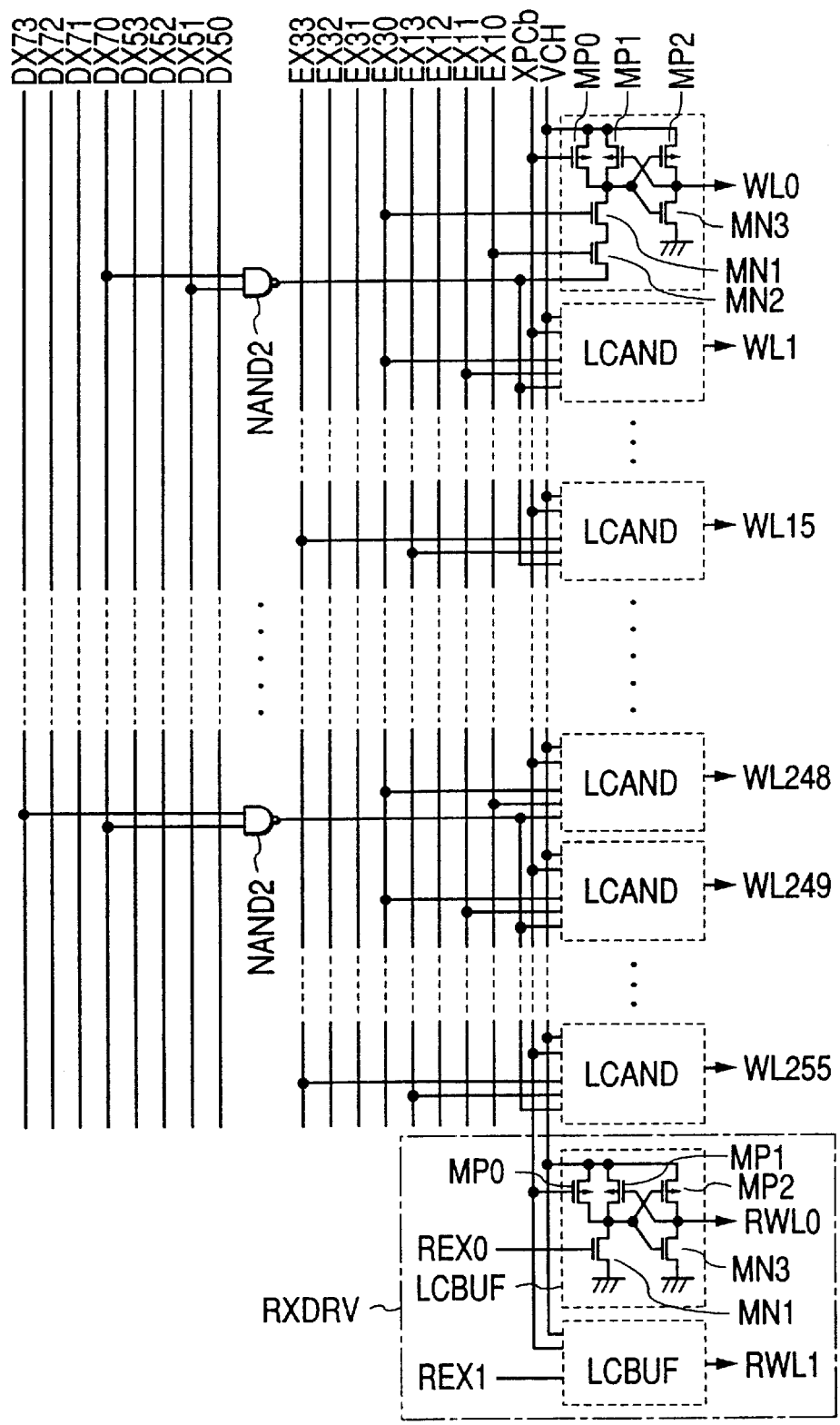
FIG. 45 is a diagram continued from FIG. 44.

FIGS. 44 and 45 show an example of the row decoder XDEC in FIG. 16. The row decoder comprises ten 2-input AND circuits AND9, sixteen 2-input NAND gates NAND2, 256 level conversion AND circuits LCAND, and two level conversion buffer circuits LCBUF. A redundant row decoder is formed by a redundant row AND circuit RXDA having the two 2-input AND circuits AND9 and a redundant row driver RXDRV having the two level conversion buffer circuits LCBUF.

In FIG. 44, the AND circuits AND9 each comprising a 2-input NAND gate and an inverter calculate the ANDs of the mat selection signal MSk with the row address signals DX10 to DX13 and DX30 to DX33 and the redundant row address signals RDX0 and RDX1 and output row decoder address signals EX10 to EX13 and EX30 to EX33 and redundant address signals REX0 and REX1, respectively. Since the address signals are supplied to many circuits, by generating the signals of addresses only in the row decoder, a useless charging/discharging current is reduced.

In FIG. 45, any of the row address signals DX50 to DX53 and any of the row address signals DX70 to DX73 are supplied to the NAND gate NAND2, and an output of the NAND gate NAND2 is supplied to the sixteen level-conversion AND circuits LCAND. Any of the signals EX10 to EX13 and any of the signals EX30 to EX33 are supplied to the level conversion AND circuit LCAND. The level conversion AND circuit LCAND comprises NMOS transistors MN1, MN2, and MN3 and PMOS transistors MP0, MP1, and MP2. At the time of standby, a control signal XPCb is set to the low level, a word line voltage VCH is applied to the gates of the transistors MP2 and MP3 by the PMOS transistor MP0 and the ground voltage VSS is applied to all of word lines WL0 to WL255 in each level conversion AND circuit LCAND. For example, in case of selecting the word line WL0, the address signals EX10, EX30, EX50, and EX70 go high, thereby forming a current path with the transistors MN1 and MN2 and the NAND gate NAND2 in the relevant circuit LCAND. The gates of MP2 and MN3 go low, and the word line WL0 is driven at the word line voltage VCH. Since the address signal has the amplitude of a voltage up to the power voltage VCC, level conversion is performed. In this case, in the other level conversion AND circuits LCAND, the gates of MP2 and MN3 are kept at the word line voltage VCH by the transistor MP1 and the word lines WL1 to WL255 remain at the power voltage VSS. In such a manner, the level conversion AND circuit LCAND decodes eight bits of a signal and operates as a word driver of each of the word lines WL0 to WL255. When the redundant address signal REX0 or REX1 is set to the high level by an operation similar to that of the level conversion AND circuit LCAND, the level conversion buffer circuit LCBUF drives the redundant word line RWL0 or RWL1 at the word line voltage VCH and operates as a redundant word driver.

Figure 46:
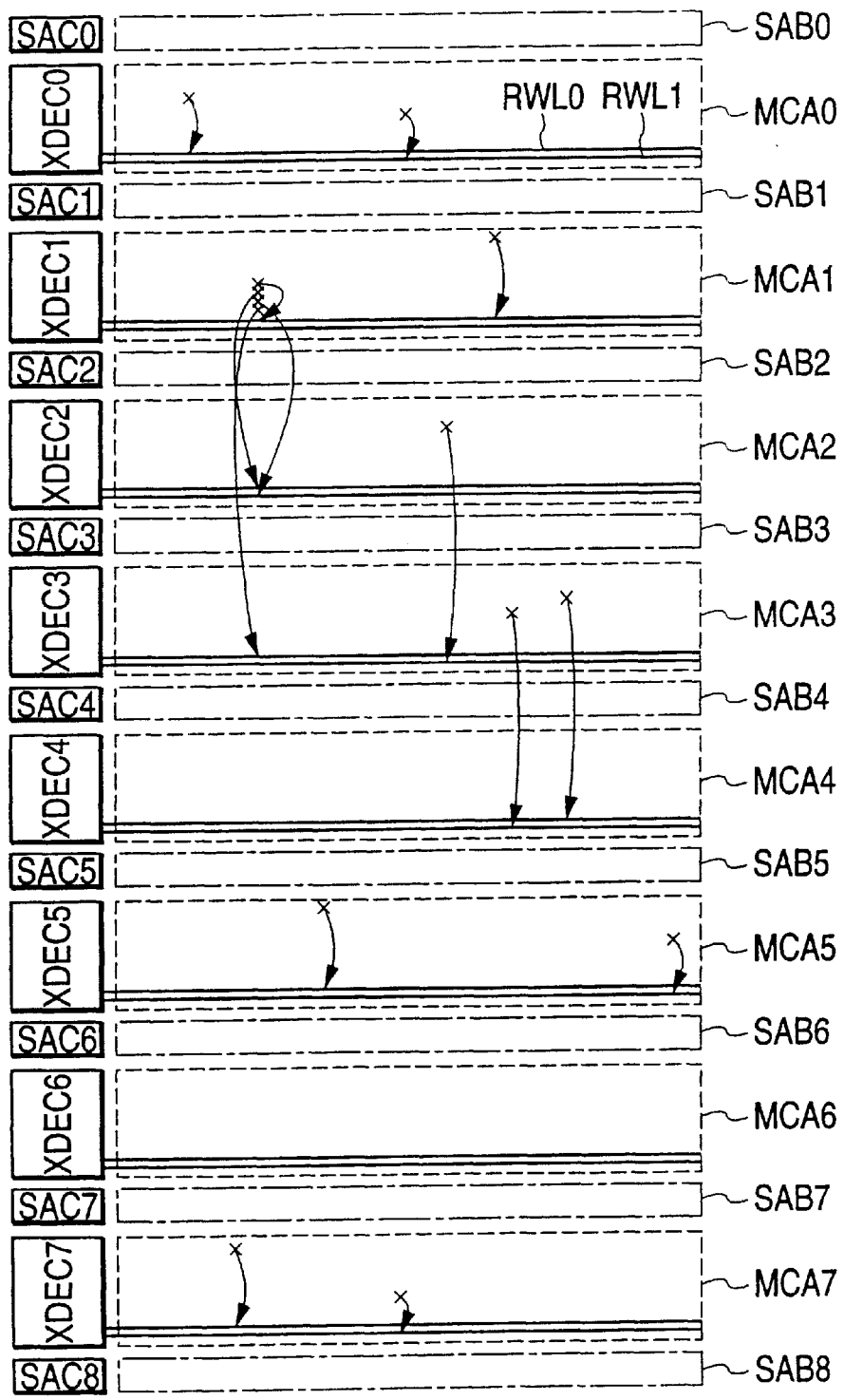
FIG. 46 is a diagram showing a replacement example of word lines.

FIG. 46 shows an example of replacing the word line in the construction as described above. Two redundant word lines RWL0 and RWL1 in each mat are also substituted for a defective part in another mat. Since the replaceable range of the any-to-any repair is large, the repairing system is efficient. However, the number of bits of the repairing address is large so that, hitherto, there is a drawback that the number of necessary fuses and the number of fuses to be blown is large. By using the sort system, the problem is suppressed in the embodiment. Moreover, any redundant word line can be allocated to a defect part, so that the sort system for storing the repairing addresses as combinations is suitable.

Thirteenth Embodiment

In the sort system shown in FIG. 30, the correspondence between the presence or absence of replacement and the repair-decision result is stored in each of the two fuse sets. An example of storing the correspondence in a single fuse set will now be described.

Figure 47:
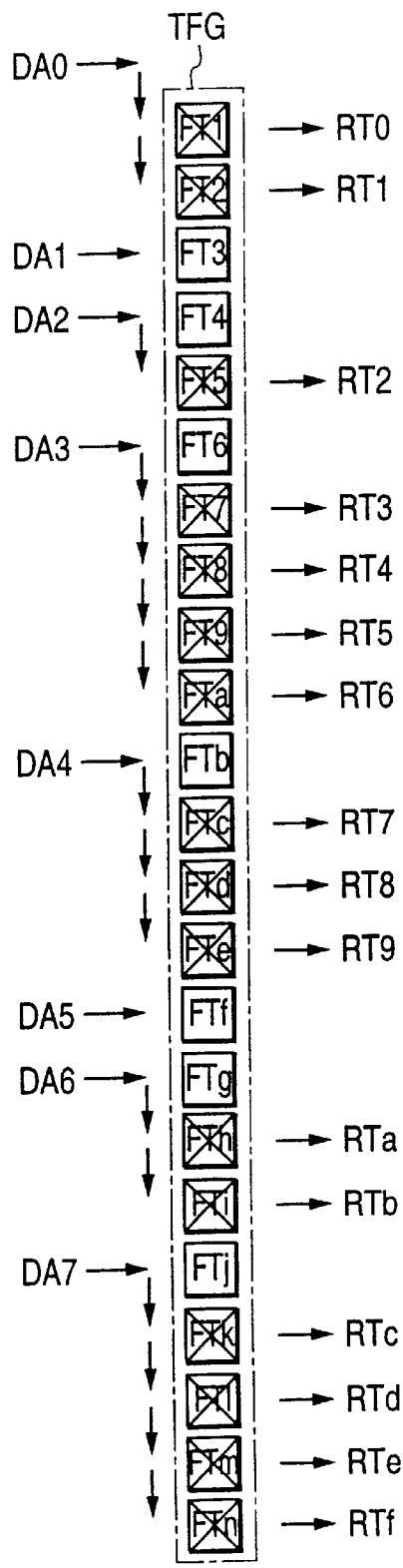
FIG. 47 is a diagram showing another example of the sorted address programming system.

In a manner similar to FIG. 30, FIG. 47 shows a sort system of obtaining 16 repair-decision results RT0 to RTf from eight decoded addresses DA0 to DA7. This case corresponds to a case where 16 fuse sets are obtained for eight addresses and maximum four fuse sets may be repeated. A fuse set TFG is made up of 23 fuses and shows a combination of 16 fuses from eight addresses while allowing the addresses to be repeated. In FIG. 47, fuses marked with X FT1, FT2, FT5, FT6, FT7 to FTa, FTc to FTh, FTi, and FTk to FTn are blown and logic 1. The fuse-decision result of the fuse which is logic 1 denotes an output as the repair-decision result. The fuse-decision result of the fuse which is logic 0 shows that the next address is used.

The repair decision is performed as follows. One of the addresses DA0 to DA7 selectively becomes logic 1. When the first address DA0 becomes logic 1, since the first fuse FT1 is logic 1, the result RT0 is 1. Since the next fuse FT2 is also logic 1, the result RT1 becomes also logic 1. Since the fuse FT3 is logic 0, results RT2 to RTf become logic 0. When the second address DA1 is logic 1, since the fuse FT4 subsequent to the fuse FT3 as the first one of fuses which are logic 0 in the fuse set TFG is 0, the results RT0 to RTf remain logic 0. When the third address DA2 becomes logic 1, since the fuse FT5 subsequent to the fuse FT4 which is the second one of the fuses which are logic 0 is the third one of the fuses which are logic 1, the first and second results RT0 and RT1 become logic 0 and the third repair-decision result RT2 becomes logic 1. Since the next fuse FT6 is 0, the fourth and subsequent results RT3 to RTf remain 0. When the fourth address DA3 becomes logic 1, since the fuse FT7 subsequent to the fuse FT6 which is the third one of fuses that are logic 0 is the fourth one of fuses that are logic 1, and 1 continues until the fuse FTa which is the seventh fuse that is logic 1, the first to third results RT0 to RT2 become logic 0 and the fourth to seventh results RT3 to RT6 become logic 1. Since the fuse FTb is logic 0, the eighth and subsequent results RT7 to RTf become logic 0. The decision is similarly made also in a case where the addresses DA4 to DA7 are logic 1, so that the repair-decision results from desired addresses can be obtained. Although the repair-decision results are allocated to all of the sixteenth repair-decision results in the example, in case of using only the addresses of 15 or less, it is sufficient to set the fuses of the number which is equal to the number of addresses used to logic 1.

As described above, in the sort system, in a manner similar to the system shown in FIG. 30, a combination of 16 repairing addresses which may be the same number can be stored from the eight addresses by using the 23 fuses. The generalized number of fuses necessary to store NS addresses which may be repeated from the decoded ND addresses and to perform the repair determination is obtained in a manner similar to the system shown in FIG. 30. When the condition of (EQ. 10) is satisfied, the number of fuses of the sort system is smaller than that of the binary system. The number of fuses to be blown is the same as that in the system shown in FIG. 30.

Figure 48:
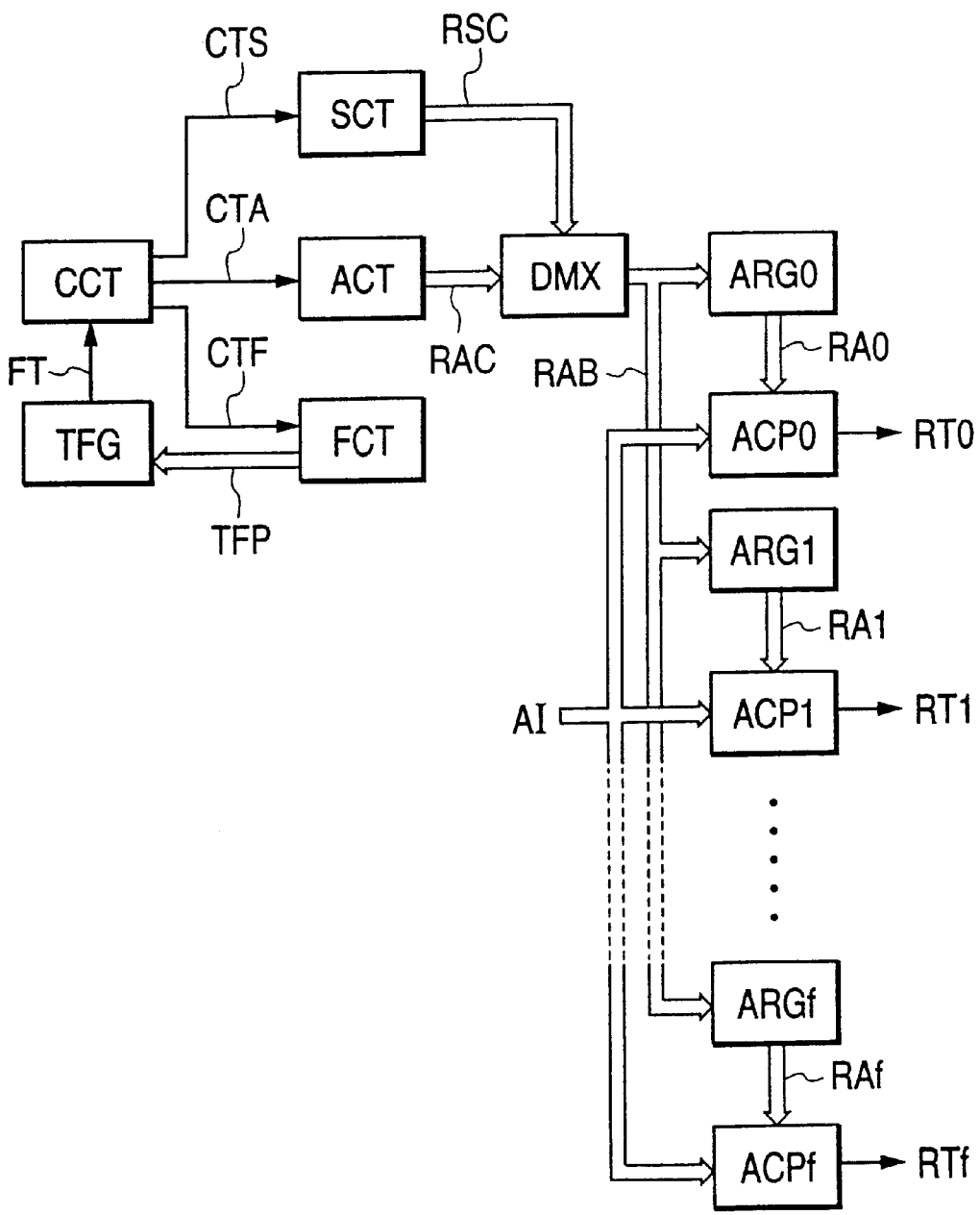
FIG. 48 is a diagram showing an example of a redundancy circuit using registers.
Figure 49:
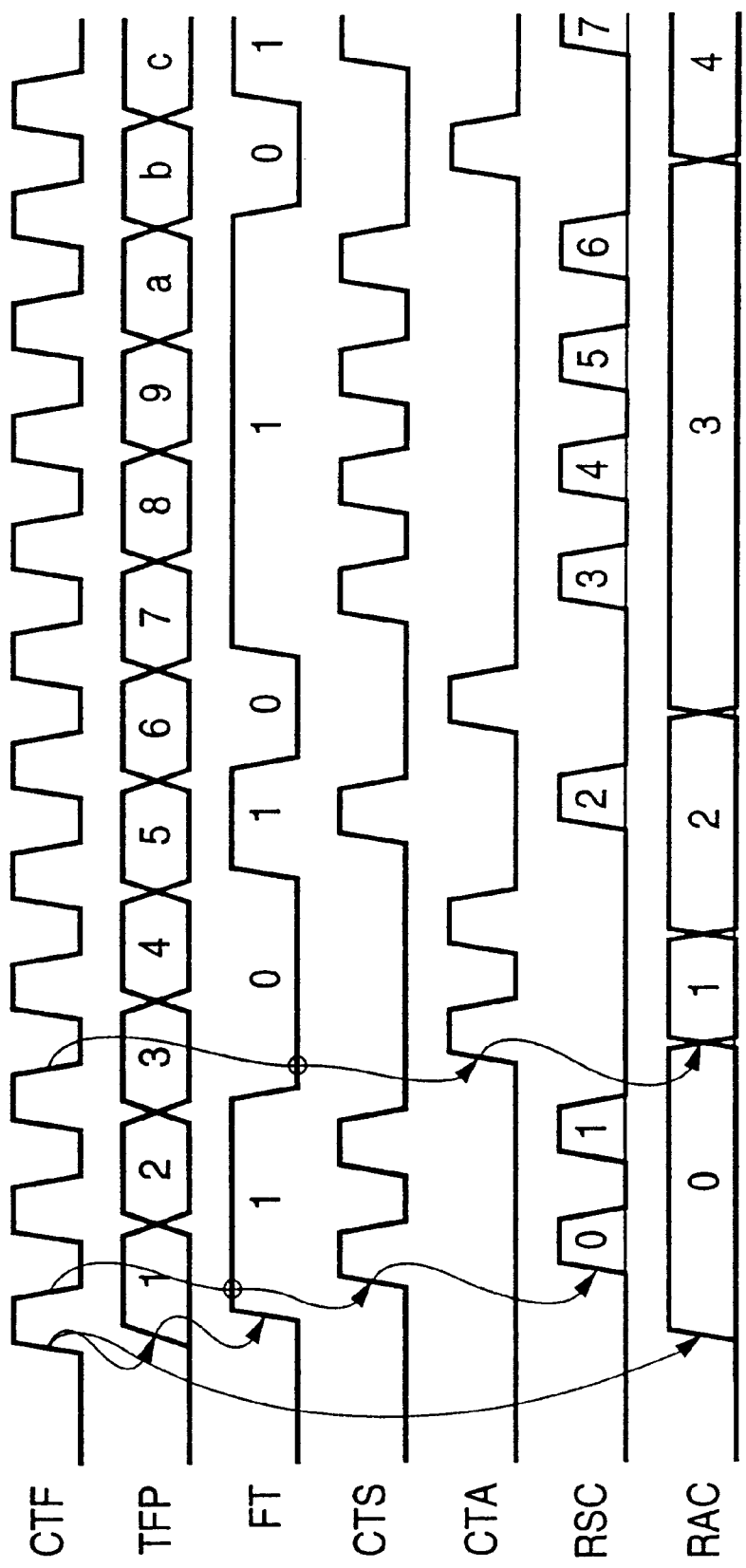
FIG. 49 is a diagram showing an example of operational timing of the redundancy circuit using registers.

FIG. 48 shows an example of the repair decision circuit employing the sort system. FIG. 49 shows the operation timing of the circuit. The repair decision circuit is characterized in that the repair decision is made after sending replacement addresses stored in the sort system to registers. The circuit of FIG. 48 comprises a control circuit CCT, a fuse number counter FCT, a fuse set TFG, a set number counter SCT, an address number counter ACT, a demultiplexer DMX, repairing address registers ARG0 to ARGf, and address comparing circuits ACP0 to ACPf.

According to the timing chart of FIG. 49, the operation of sending the repairing address to the registers ARG0 to ARGf will be described. The fuse number counter FCT generates a control signal TFP in accordance with a control signal CTF supplied from the control circuit CCT. Fuse-decision results FT selected by the control signals TFP are sequentially sent from the fuse group TFG to the control circuit CCT. The control circuit CCT generates pulses to the control signal CTS when the fuse-decision result FT is logic 1 and to a control signal CTA when the fuse-decision result FT is logic 0. The set number counter SCT counts up the repairing set number RSC in accordance with the control signal CTS. Meanwhile, the address number counter ACT counts up an address number RAC in accordance with the control signal CTA. The demultiplexer DMX is controlled by the repairing set number RSC, demultiplexes the address number RAC, and sends a repairing address set RAB to the registers ARG0 to ARGf. In such a manner, the address comparing circuits ACP0 to ACPf compare the address AI with each of the repairing addresses RA0 to RAf received by the registers ARG0 to ARGf and output the repair-decision results RT0 to RTf.

Since the correspondence between the presence or absence of replacement and the repair-decision results is stored by using the single fuse set in the sort system shown in FIG. 47, the sort system is therefore suitable to the construction of sequentially generating the repairing addresses in accordance with the fuse decision results. By registering the repairing addresses into the registers and performing the repair decision, the repairing address of the format which can be relatively easily compared with the other address can be generated and the shifter shown in FIGS. 32 and 33 can be omitted. {REF 4} discloses a redundant system for transferring fuse information to latches (registers) in a redundant decoder by a fuse down loader and can be a reference when the embodiment is applied to a system. {REF 3} does not describe the sort system of the present invention and is distinguished from the present invention in this respect. The circuit of FIG. 48 for decoding the information stored in the sort system and transferring the decoded information and the operational timing of FIG. 49 are peculiar to the present invention. That is, by using the sort system, the embodiment obtains an effect that a number of necessary fuses is small and a number of fuses to be blown is small.

Fourteenth Embodiment

Figure 50:
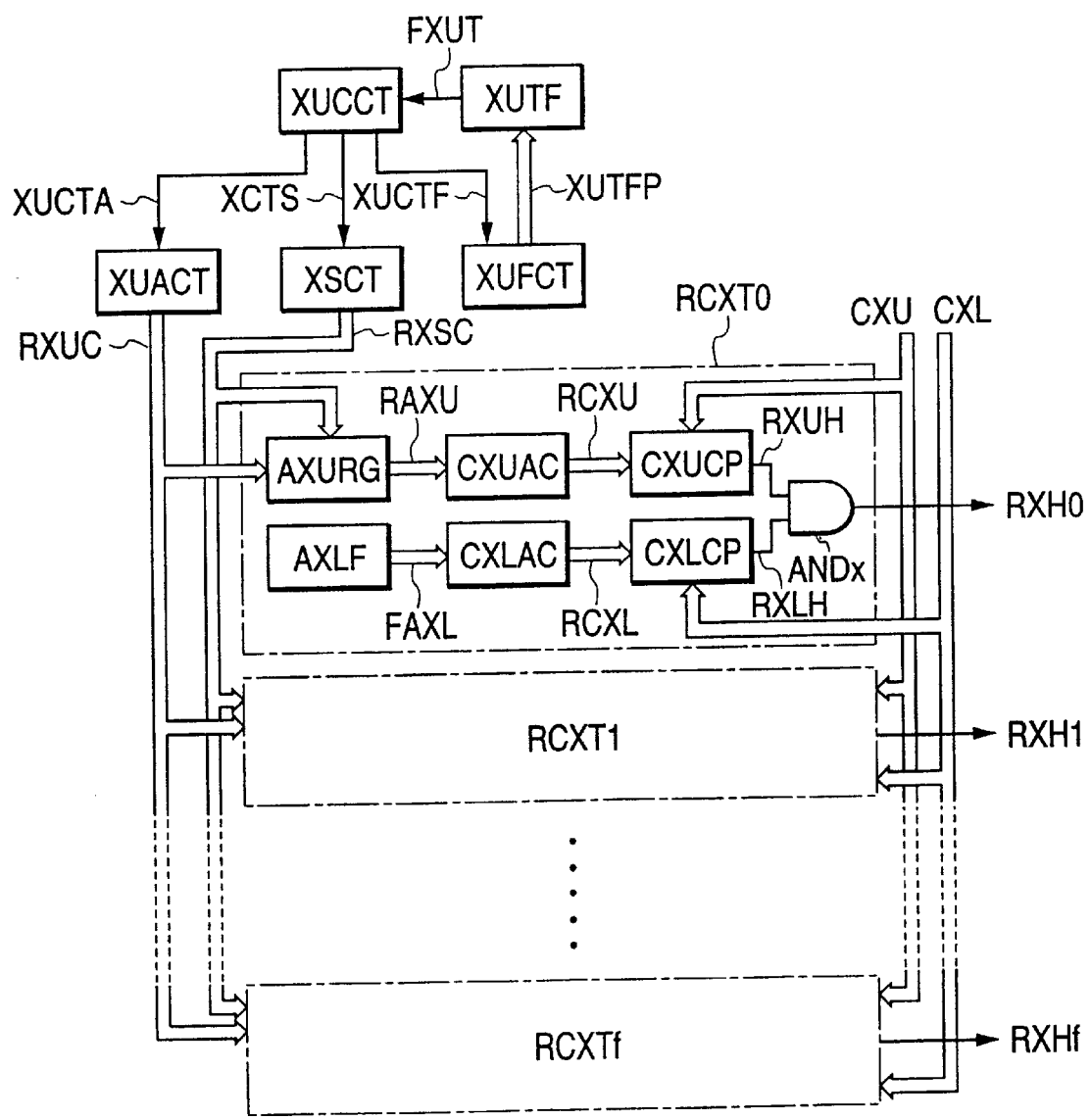
FIG. 50 is a diagram showing another example of the row related redundancy circuit.

FIG. 50 shows an example in which the embodiment shown in FIGS. 47 to 49 is applied to the row-related redundancy circuit. The circuit operates as the circuit XR in FIG. 7. The repair-decision circuit stores the row address of higher bits by using the sort system shown in FIG. 47 and stores the address of lower bits in the binary system. In FIG. 50, circuits for storing and transferring the row address of higher bits comprise a control circuit XUCCT, a fuse number counter XUFCT, a fuse set XUTF, a set number counter XSCT, and a higher-bit repairing row address counter XUACT. Circuits for comparing the row address with the access address from the outside are 16 row address comparing circuits RCXT0 to RCXTf provided in correspondence with 16 redundant word lines (refer to FIG. 46), which output repair-decision results RXH0 to RXHf, respectively.

An example of the internal construction of the row address comparing circuit is shown in RCXT0. Circuits for comparing the row address of higher bits are a register AXURG of the higher-bit repairing row address, a higher-bit repairing row address activating circuit CXUAC for making the higher-bit repairing row address RAXU of the register AXURG correspond to a predecoded row address CXU of higher bits, and an address comparing circuit CXUCP for comparing the higher-bit repairing row address RCXU with the predecoded row address CXU of higher bits. The address comparing circuit CXUCP outputs a decision result RXUH. Circuits for comparing the row address of lower bits are a fuse circuit AXLF for storing a repairing row address of lower bits in an encoded binary state, a lower-bit repairing row address activating circuit CXLAC for making a decision result FAXL of the fuse circuit AXLF correspond with the lower-bit predecoded row address CXL, and an address comparing circuit CXLCP for comparing the repairing row address RXCL of lower bits with the predecoded row address CXL of lower bits. A decision result RXLH is outputted from the address comparing circuit CXLCP. The AND of the decision results RXUH and RXLH of the row addresses of higher and lower bits is obtained by a 2-input AND circuit ANDX and outputted as a final decision result RXH0.

The operation regarding the row address of higher bits in the sort system is performed as described with reference to FIG. 49. To be specific, the fuse number counter XUFCT generates the control signal XUTFP in accordance with the control signal XUCTF supplied from the control circuit XUCCT. By the operation, fuse-decision results FXUT are sequentially sent from the fuse set XUTF to the control circuit XUCCT. The control circuit XUCCT generates pulses to either the control signal XCTS or XUCTA in accordance with the fuse-decision result FXUT. The counters XSCT and XUACT count up the repairing set number RXSC and the higher-bit repairing row address RXUC, respectively. When the register AXURG is selected by the repairing set number RXSC in each of the row address comparing circuits RCXC0 to RCXCf, the higher-bit repairing row address RXUC is registered. That is, by sequentially switching the registers and receiving the addresses, demultiplexing operation is performed.

By executing the operation of registering the repairing addresses into the registers in advance, an influence exerted on the access time can be reduced. It is sufficient to perform the operation as one of sequences of turn-on of power. When a clock sync circuit such as a delay locked loop (DLL) is used in the SDRAM, the operation can be performed in parallel with the setting. When the operation is performed by detecting the turn-on of the power, it is unnecessary to control the operation from the outside. On the contrary, by performing the operation by a command from the outside, reliable operation can be carried out irrespective of the power waveform. It is sufficient to use an oscillator or the like to generate the control signal XUTFP and the like. The control signal XUTFP and the like can be also generated from the internal clock CLKI in FIG. 7 by frequency division or the like.

The number of necessary fuses is generalized here. It is now assumed that the repair decision is performed by storing NS addresses from ND addresses obtained by decoding a binary address of NA bits and that the NA bits is divided into higher NBU bits and lower NBL bits. Since the NS addresses which may be repeated are stored, the number NUF of fuses necessary to store the higher NBU bits in the sort system is obtained by the following equation as described with reference to FIG. 47.

$$NUF=(2^{\char`\^}NBU)+NS-1 \quad (\text{EQ. 11})$$

The number NLF of fuses necessary to store the lower NBL bits in the binary system is as follows.

$$NLF=NSNBL=NS(NB-NBU) \quad (\text{EQ. 12})$$

It is considered that since whether it is used or not is shown in the higher bits, there is no need to provide a fuse (master fuse) for this purpose. The total number NF of fuses is obtained from (EQ. 11) and (EQ. 12) as follows.

$$NF=NUF+NLF=(2^{\char`\^}NBU)+NS(NB-NBU+1)-1 \quad (\text{EQ. 13})$$

(d(NF)/d(NBU)) in which NF in (EQ. 13) is differentiated with respect to NBU becomes the minimum value when $$d(NF)/d(NBU)=(2^{\char`\^}NBU)\ln[2]-NS=0 \quad (\text{EQ. 14})$$

The function ln[ ] is a logarithm in which e (e=2.718 . . . ) is the base. When (EQ. 14) is solved with respect to NBU, since $$(2^{\char`\^}NBU)=NS/\ln[2] \quad (\text{EQ. 15})$$

the following is obtained.

$$NBU=\log2[NS/\ln[2]] \quad (\text{EQ. 16})$$

The function log2[ ] shows the logarithm in which 2 is the base. As described above, the optimum number of bits exists in the sort system. The minimum value NFmin of NF obtained by the optimum value is derived by the following equation.

$$NFmin=NS(NB+(1/\ln[2])-\log2[(NS/\ln[2])+1])-1 \quad (\text{EQ. 17})$$

Since NBU is an integer, (EQ. 15) is satisfied only approximately and the number of fuses is larger than that obtained by (EQ. 17). For example, in the case of the construction shown in FIGS. 42 to 46, since the number of mats is eight, the mat selection signal is three bits (higher bits). The number of word lines per row decoder is 256 and the address is eight bits (lower bits). The total number of row addresses is 11 bits. Since the number of redundant word lines is two per mat and the total number is 16, the number of repairing addresses is 16. When it is assumed that NS=16, NBU=4.53 is obtained by (EQ. 16). It is preferable to apply the sort system to four or five bits which is close to 4.53. In any case, the total number of fuses is 143. When all of the repairing addresses are stored in the binary system, 16 sets each consisting of 12 fuses are provided and the total number of fuses becomes 192. By employing to the sort system, the number of fuses can be reduced to about ¾. According to the invention, therefore, the semiconductor memory device comprising a defect repairing circuit having a small area and high repairing efficiency, in which time required to store the address of a defect is short is realized and the manufacturing cost of the semiconductor memory device can be reduced.

What is claimed is:

1. A semiconductor device comprising:
    a plurality of memory blocks, each having a plurality of memory cells provided at intersecting points of a plurality of bit lines, a first spare bit line, and a second spare bit line which cross a plurality of word lines;
    a plurality of column selection lines, each provided for one of the plurality of bit lines of the plurality of memory blocks;
    a first spare column selection line provided for the first spare bit line of the plurality of memory blocks;
    a second spare column selection line provided for the second spare bit line of the plurality of memory blocks; and
    a redundancy circuit having a first input node to which an access address including a first access information for designating one of the plurality of memory blocks and a second access information for designating one of the plurality of column selection lines is supplied, a defect address storing circuit for storing a plurality of defect addresses, a first output node which is coupled to the first spare column selection line to make the first spare column selection line active when the access address coincides with one of the plurality of defect addresses, and a second output node connected to the second spare column selection line to make the second spare selection line active when the access address coincides with another one of the plurality of defect addresses, wherein the defect address storing circuit further includes: a first storage set which is provided to determine selection of the first spare column selection line, for storing a first information to designate one of the plurality of column selection lines related to a first defect; a second storage set which is provided to determine selection of the second spare column selection line, for storing a second information to designate one of the plurality of column selection lines related to a second defect; a third storage set for storing a third information for designating a first memory block as one of the plurality of memory blocks related to the first defect and a fourth information for designating a second memory block as one of the plurality of memory blocks related to the second defect, wherein the third storage set has: a plurality of first storage elements for storing addresses of independent memory blocks which are different from each other in the first and second memory blocks; and a plurality of second storage elements for storing the number of duplex selection of addresses which are repeated in the independent memory blocks.

2. A semiconductor device according to claim 1, wherein the redundancy circuit further comprises: a first shifter including a plurality of first input nodes to which the first access information is inputted in a decoded address format, a plurality of first output nodes of the same number as the number of the plurality of first input nodes, and a first switch circuit for setting a plurality of first logical connecting paths between the plurality of first input nodes and the plurality of first output nodes; and a second shifter including a plurality of second input nodes connected to the plurality of first output nodes, a plurality of second output nodes of the number larger than the number of the plurality of second input nodes, and a second switch circuit for setting a plurality of second logical connecting paths between the plurality of second input nodes and the plurality of second output nodes, wherein the plurality of first logical connecting paths are determined by information stored in the plurality of first storage elements in the third storage set, and wherein the plurality of second logical connecting paths are determined by information stored in the plurality of second storage elements in the third storage set.

3. A semiconductor device according to claim 2, wherein an output of one of the plurality of second output nodes determines whether the result of the comparison between the first information stored in the first storage set and the second access information is made valid or not, and wherein an output of another one of the plurality of second output nodes determines whether the result of comparison between the second information stored in the second storage set and the second access information is made valid or not.

4. A semiconductor device according to claim 1, wherein the first storage set includes a plurality of third storage elements and stores the first information in a binary address format, wherein the second storage set includes a plurality of fourth storage elements and stores the second information in a binary address format, and wherein the plurality of first storage elements in the third storage set store the third and fourth information in a decoded address format obtained by decoding the information in the binary address format.

5. A semiconductor device according to claim 1, further comprising a plurality of address input terminals to which a row address and a column address are supplied in an address multiplexing method, wherein the first access information is obtained from the row address and the second access information is obtained from the column address, and wherein the semiconductor device is a dynamic random access memory.

6. A semiconductor device according to claim 1, wherein each of the plurality of first and second storage elements is a fuse circuit which stores a first logical state as an initial value and stores a second logical state when being programmed.

7. A semiconductor device comprising:

a first memory block having a plurality of first memory cells provided at intersecting points of a plurality of first bit lines which cross a plurality of first word lines and a first spare word line;

a second memory block having a plurality of second memory cells provided at intersecting points of a plurality of second bit lines which cross a plurality of second word lines and a second spare word line; and a redundancy circuit having a first input node to which an access address including a first access information for designating one of the first and second memory blocks and a second access information for designating either one of the plurality of first word lines or one of the plurality of second word lines is supplied, a defect address storing circuit for storing a plurality of defect addresses, a first output node connected to the first spare word line in order to make the first spare word line active when the access address coincides with one of the plurality of defect addresses, and a second output node connected to the second spare word line to make the second spare word active when the access address coincides with another one of the plurality of defect addresses, wherein the defect address storing circuit includes:

a first storage set provided to determine selection of the first spare word line, for storing a first information indicative of either one of the plurality of first word lines or one of the plurality of second word lines related to a first defect; a second storage set provided to determine selection of the second spare word line, for storing a second information indicative of either one of the plurality of first word lines or one of the plurality of second word lines related to a second defect; and a third storage set for storing a third information indicative one of the first and second memory blocks related to the first defect and fourth information indicative of the first or second memory block related to the second defect, and wherein the third storage set has a plurality of first storage elements for storing addresses of independent memory blocks which are different from each other in the first and second memory blocks and a plurality of second storage elements for storing the number of duplex selection of addresses which are repeated in the addresses of the independent memory blocks.

8. A semiconductor device according to claim 7, wherein the redundancy circuit further comprises:

a first shifter including a plurality of first input nodes to which the first access information is inputted in a decoded address format, a plurality of first output nodes of the same number as the number of the plurality of first input nodes, and a first switch circuit for setting a plurality of first logical connecting paths between the plurality of first input nodes and the plurality of first output nodes; and a second shifter including a plurality of second input nodes connected to the plurality of first output nodes, a plurality of second output nodes of the number larger than the number of the plurality of second input nodes, and a second switch circuit for setting a plurality of second logical connecting paths between the plurality of second input nodes and the plurality of second output nodes, wherein the plurality of first logical connecting paths are determined by information stored in the plurality of first storage elements in the third storage set, and wherein the plurality of second logical connecting paths are determined by information stored in the plurality of second storage elements in the third storage set.

9. A semiconductor device according to claim 8, wherein an output of one of the plurality of second output nodes determines whether the result of comparison between the first information stored in the first storage set and the second access information is made valid or not, and wherein an output of another one of the plurality of second output nodes determines whether the result of comparison between the second information stored in the second storage set and the second access information is made valid or not.

10. A semiconductor device according to claim 7, wherein the first storage set includes a plurality of third storage elements and stores the first information in a binary address format, wherein the second storage set includes a plurality of fourth storage elements and stores the second information in the binary address format, and wherein the plurality of first storage elements in the third storage set store the third and fourth information in a decoded address format obtained by decoding the information in the binary address format.

11. A semiconductor device according to claim 7, wherein the first access information is obtained from higher bits of a row address and the second access information is obtained from lower bits of the row address, and wherein the semiconductor device is a dynamic random access memory.

12. A semiconductor device according to claim 7, wherein each of the plurality of first and second storage elements is a fuse circuit which stores a first logical state as an initial value and stores a second logical state when being programmed.

* * * * *